(12) United States Patent
Seo et al.

(10) Patent No.: US 10,231,347 B2
(45) Date of Patent: Mar. 12, 2019

(54) ELECTRONIC DEVICE INCLUDING FLEXIBLE DISPLAY

(71) Applicant: Samsung Electronics Co., Ltd., Suwon-si, Gyeonggi-do (KR)

(72) Inventors: Ho-Seong Seo, Suwon-si (KR); Wataru Kaihotsu, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/674,443

(22) Filed: Aug. 10, 2017

(65) Prior Publication Data

US 2018/0049329 A1 Feb. 15, 2018

(30) Foreign Application Priority Data

Aug. 12, 2016 (KR) .................. 10-2016-0102841

(51) Int. Cl.
*G06F 1/16* (2006.01)
*H05K 5/00* (2006.01)
*E05D 3/06* (2006.01)
*E05D 7/00* (2006.01)
*E05D 11/08* (2006.01)
(Continued)

(52) U.S. Cl.
CPC ............. *H05K 5/0017* (2013.01); *E05D 3/06* (2013.01); *E05D 3/18* (2013.01); *E05D 7/00* (2013.01);
(Continued)

(58) Field of Classification Search
CPC .................................................... G06F 1/1681
See application file for complete search history.

(56) References Cited

U.S. PATENT DOCUMENTS 6,223,393 B1 * 5/2001 Knopf .................. G06F 1/1618
16/366
6,377,324 B1 * 4/2002 Katsura ............. G02F 1/133305
349/58
(Continued)

FOREIGN PATENT DOCUMENTS

KR  10-2014-0101274 A  8/2014
KR  10-2015-0037383 A  4/2015
(Continued)

OTHER PUBLICATIONS

International Search Report dated Aug. 23, 2017 in connection with International Patent Application No. PCT/KR2017/005583.
(Continued)

*Primary Examiner* — Adrian S Wilson

(57) ABSTRACT

An electronic device includes a flexible display, a foldable housing, and a flexible display disposed on one surface of the housing. The housing includes a first part, a second part, and a connection unit for connecting the second part to the first part to be relatively movable. The connection unit has hinge members extended substantially in parallel to an edge of the first or second part, arranged between the first part and the second part, and forming part of the one surface of the housing. As the hinge members move relative to each other, the hinge members connect the second part to the first part to enable relative movement of the second part with respect to the first part between a position in which the second part faces the first part and a position in which the second part is leveled next to the first part.

18 Claims, 57 Drawing Sheets

(51) Int. Cl.
  *H05K 5/02* (2006.01)
  *H05K 5/03* (2006.01)
  *E05D 3/18* (2006.01)
  *E05D 11/10* (2006.01)
  *H04M 1/02* (2006.01)

(52) U.S. Cl.
  CPC ........ *E05D 11/082* (2013.01); *E05D 11/1078* (2013.01); *G06F 1/1641* (2013.01); *G06F 1/1652* (2013.01); *G06F 1/1681* (2013.01); *H04M 1/022* (2013.01); *H04M 1/0216* (2013.01); *H04M 1/0268* (2013.01); *H05K 5/0013* (2013.01); *H05K 5/0086* (2013.01); *H05K 5/0221* (2013.01); *H05K 5/0226* (2013.01); *H05K 5/03* (2013.01); *E05Y 2900/606* (2013.01)

(56) References Cited

U.S. PATENT DOCUMENTS

| | | | |
|---|---|---|---|
| 9,870,031 B2* | 1/2018 | Hsu | G06F 1/1681 |
| 2010/0232100 A1* | 9/2010 | Fukuma | F16G 13/18 361/679.01 |
| 2013/0219663 A1* | 8/2013 | Cai | G06F 1/1681 16/371 |
| 2014/0126133 A1 | 5/2014 | Griffin et al. | |
| 2014/0226275 A1* | 8/2014 | Ko | G06F 1/1626 361/679.27 |
| 2015/0176317 A1 | 6/2015 | Lee | |
| 2016/0132076 A1 | 5/2016 | Bitz et al. | |
| 2017/0235343 A1 | 8/2017 | Cho et al. | |

FOREIGN PATENT DOCUMENTS

| | | |
|---|---|---|
| KR | 10-2015-0073410 A | 7/2015 |
| KR | 10-2016-0046079 A | 4/2016 |

OTHER PUBLICATIONS

Written Opinion of the International Searching Authority dated Aug. 23, 2017 in connection with International Patent Application No. PCT/KR2017/005583.

* cited by examiner

ELECTRONIC DEVICE INCLUDING FLEXIBLE DISPLAY

CROSS-REFERENCE TO RELATED APPLICATION(S) AND CLAIM OF PRIORITY

The present application is related to and claims the priority under 35 U.S.C. § 119(a) to Korean Application Serial No. 10-2016-0102841, which was filed in the Korean Intellectual Property Office on Aug. 12, 2016, the entire content of which is hereby incorporated by reference.

TECHNICAL FIELD

The present disclosure relates to an electronic device, and more particularly, to an electronic device including a flexible display that is bendable.

BACKGROUND

An electronic device is a device that executes a specific function according to a loaded program, such as a home appliance, an electronic note, a portable multimedia player (PMP), a mobile communication terminal, a tablet personal computer (PC), a video/audio device, a desktop/laptop computer, and an in-vehicle navigator. For example, these electronic devices may output stored information in text, visually, or audibly. Along with an increase in the integration level of electronic devices and the increasing popularity of ultra-high-speed, large-capacity wireless communication, various functions have recently been loaded in a single electronic device. For example, an entertainment function such as gaming, a multimedia function such as music/video play, a communication and security function for mobile banking, a scheduling function, and an electronic wallet function as well as a communication function have been integrated in a single electronic device.

A display mounted to an electronic device may provide various types of visual information to a user by outputting content such as text or images. As the entertainment function or multimedia function of electronic devices has developed remarkably, users may prefer high-quality, large-screen displays. In this context, a flexible display has a screen display area which is extendable on an electronic device when needed, while occupying a small space for carrying or keeping. For example, since the flexible display can be carried or kept in a folded state, it may offer convenience to a user. In an unfolded state, the flexible display provides an extended screen, thus making it convenient to use a multimedia function.

Although the flexible display may be folded or rolled at a certain curvature, when the curvature radius of the flexible display in the folded or rolled state is too small, its display structure (for example, an organic light emitting layer or a substrate or film surrounding the organic light emitting layer) may be damaged. For example, excessive deformation of the flexible display may cause damage to the display structure.

An electronic device configured to be foldable or unfoldable may need a structure for supporting a flexible display in an unfolded state of the electronic device (for example, a state in which a screen display area is extended on the electronic device). For example, the flexible display may be incorporated with a touch panel. In this case, the flexible display may be deformed by a user's touch (for example, a touch input). The deformation may cause distortion of the screen, and repeated deformations may become chronicle, thus damaging the display. Therefore, a structure for supporting the display may be needed.

Even though the electronic device is sufficiently flexible, tensile force or compressive force may be applied to the inner surface and outer surface of the electronic device (for example, a housing) according to folding or unfolding of the electronic device. For example, when the inner surface of the electronic device is kept unchanged in length before and after the electronic device is folded, tensile force may be applied to the outer surface in the folded state. When the outer surface of the electronic device is kept unchanged in length before and after the electronic device is folded, compressive force may be applied to the inner surface in the folded state. When tensile force or compressive force is applied to the inner or outer surface of the electronic device, the flexible display may be damaged. As the electronic is thicker, the tensile force or compressive force caused by the relative deformation may get larger.

The above information is presented as background information only to assist with an understanding of the present disclosure. No determination has been made, and no assertion is made, as to whether any of the above might be applicable as prior art with regard to the present disclosure.

SUMMARY

To address the above-discussed deficiencies, it is an object to provide at least the advantages described below. Accordingly, an aspect of the present disclosure is to provide an electronic device which is folded or unfolded smoothly, while preventing excessive deformation of the electronic device from damaging a flexible display.

Another aspect of the present disclosure is to provide an electronic device which mitigates or prevents deformation, damage, or the like caused by a user touch or the like.

Another aspect of the present disclosure is to provide an electronic device which suppresses generation of tensile force or compressive force in a flexible display and/or an area adjacent to the flexible display during folding or unfolding of the electronic device.

In accordance with an aspect of the present disclosure, there is provided an electronic device. The electronic device includes a foldable housing, and a flexible display disposed on the housing. The housing includes a first part including a first surface facing in a first direction, and a second surface facing in a second direction opposite to the first direction, a second part including a third surface facing in a third direction, and a fourth surface facing in a fourth direction opposite to the third direction, and a connection unit for connecting an edge of the first part to an edge of the second part. The connection unit includes a bendable fifth surface for connecting the first surface to the third surface, and bendable sixth surface for connecting the second surface to the fourth surface. When the housing is in a folded state, the third surface faces the first surface, and when the housing is in an unfolded state, the third surface is positioned leveled with the first surface, with the fifth surface in between. The display is extended from the first surface to the third surface through the fifth surface, and bendable in correspondence with bending of the fifth surface. The connection unit comprises a plurality of cover members extended along a fifth direction substantially parallel to the edge of the first or second part and structured to form the sixth surface. Each of the cover members comprises a first extension portion and a second extension portion protruding from the first extension portion. When the housing is in the unfolded state, the first extension portion of one of the cover members is hidden by the second extension portion of another cover member adjacent to the one cover member, among the cover members. When the housing is folded, the first extension portion of the one of the cover members is exposed at least partially next to the second extension portion of the other cover member.

In accordance with another aspect of the present disclosure, there is provided an electronic device. The electronic device includes a foldable housing, and a flexible display disposed on one surface of the housing. The housing includes a first part, a second part, and a connection unit for connecting the second part to the first part to be relatively movable. The connection unit includes a plurality of hinge members extended substantially in parallel to an edge of the first or second part, arranged between the first part and the second part, and forming part of the one surface of the housing. As the hinge members move relative to each other, the hinge members connect the second part to the first part to enable relative movement of the second part with respect to the first part between a position in which the second part faces the first part and a position in which the second part is leveled next to the first part. A partial area of the display corresponding to an arrangement area of the hinge members is transformed according to relative movements of the hinge members.

Other aspects, advantages, and salient features of the disclosure will become apparent to those skilled in the art from the following detailed description, which, taken in conjunction with the annexed drawings, discloses exemplary embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, like reference numerals will be understood to refer to like parts, components, and structures.

DETAILED DESCRIPTION

Figure 1:
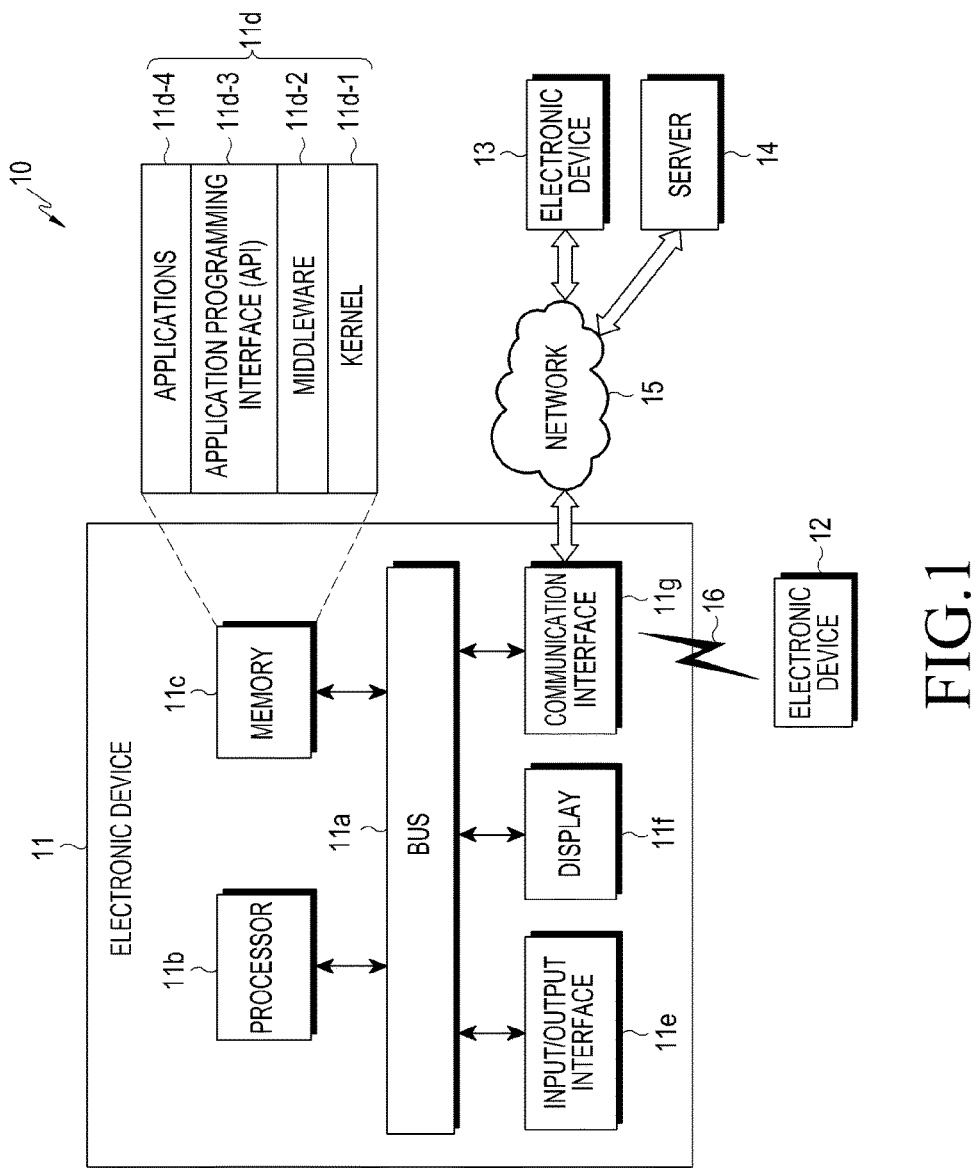
FIG. 1 is a block diagram illustrating a network environment including an electronic device according to various embodiments of the present disclosure.
Figure 77:
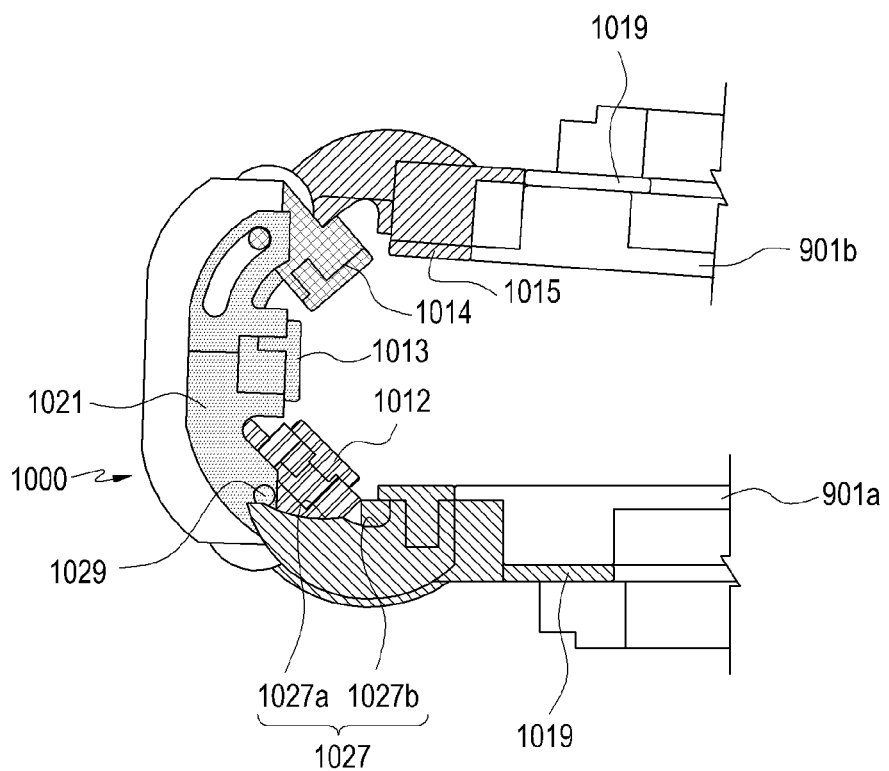

FIGS. 1 through 77, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device.

Various embodiments of the present disclosure are described with reference to the accompanying drawings. However, the scope of the present disclosure is not intended to be limited to the particular embodiments and it is to be understood that the present disclosure covers various modifications, equivalents, and/or alternatives falling within the scope and spirit of the present disclosure.

Ordinal terms as used in the present disclosure, such as first and second may be used to describe various components, not limiting the components. These expressions are used to distinguish one component from another component. For example, a first component may be referred to as a second component and vice versa without departing from the scope of the present disclosure. The term 'and/or' includes a combination or any of a plurality of related items.

The relative terms such as 'front surface', 'rear surface', 'top surface', and 'bottom surface' described as they are shown in the drawings may be replaced with ordinal terms such as 'first', 'second', and the like. The sequence of the ordinal numbers such as 'first', 'second', and the like is determined as mentioned or arbitrarily, and thus may be changed freely when needed.

The terms as used in the present disclosure are provided to describe merely specific embodiments, not intended to limit the scope of the present disclosure. It is to be understood that singular forms include plural referents unless the context clearly dictates otherwise. In the present disclosure, the term 'have', 'may have', 'include', or 'may include' signifies the presence of a specific feature, number, step, operation, component, part, or combination thereof, not excluding the presence of one or more other features, numbers, steps, operations, components, parts, or combinations thereof.

Unless otherwise defined, the terms and words including technical or scientific terms used in the following description and claims may have the same meanings as generally understood by those skilled in the art. The terms as generally defined in dictionaries may be interpreted as having the same or similar meanings as or to contextual meanings of related technology. Unless otherwise defined, the terms should not be interpreted as ideally or excessively formal meanings.

According to the present disclosure, an electronic device may be any device equipped with a touch panel, and an electronic device may also be called a terminal, a portable terminal, a mobile terminal, a communication terminal, a portable communication terminal, a portable mobile terminal, a display device, or the like.

For example, an electronic device may be a smart phone, a portable phone, a navigation device, a game console, a television (TV), an in-vehicle head unit, a laptop computer, a tablet computer, a portable multimedia player (PMP), a personal digital assistant (PDA), or the like. An electronic device may be configured as a pocket-size portable communication terminal equipped with a wireless communication function. Further, an electronic device may be a flexible device or a flexible display device.

The electronic device may communicate with an external electronic device such as a server or perform a task through interaction with an external electronic device. For example, the electronic device may transmit an image captured by a camera and/or location information detected by a sensor unit to a server through a network. The network may be, but not limited to, a mobile or cellular communication network, a local area network (LAN), a wireless local area network (WLAN), a wide area network (WAN), the Internet, a small area network (SAN), or the like.

FIG. 1 is a block diagram of a network environment 10 including an electronic device 11 according to various embodiments of the present disclosure.

Referring to FIG. 1, the electronic device 11 in the network environment 10 according to various embodiments is described. The electronic device 11 may include a bus 11*a*, a processor 11*b*, a memory 11*c*, an input/output (I/O) interface 11*e*, a display 11*f*, and a communication interface 11*g*. In some embodiments, at least one of the components may be omitted in the electronic device 11 or a component may be added to the electronic device 11. The bus 11*a* may include a circuit that interconnects, for example, the foregoing components 11*a* to 11*g* and allows communication (for example, control messages and/or data) between the foregoing components 11*a* to 11*g*. The processor 11*b* may include one or more of a CPU, an AP, and a communication processor (CP). The processor 11*b* may, for example, execute computation or data processing related to control and/or communication of at least one other component of the electronic device 11.

The memory 11*c* may include a volatile memory and/or a non-volatile memory. The memory 11*c* may, for example, store instructions or data related to at least one other component. According to an embodiment, the memory 11*c* may store software and/or programs 11*d*. The programs 11*d* may include, for example, a kernel 11*d*-1, middleware 11*d*-2, an application programming interface (API) 11*d*-3, and/or application programs (or applications) 11*d*-4. At least a part of the kernel 11*d*-1, the middleware 11*d*-2, or the API 11*d*-3 may be called an operating system (OS). The kernel 11*d*-1 may control or manage system resources (for example, the bus 11*a*, the processor 11*b*, or the memory 11*c*) that are used in executing operations or functions implemented in other programs (for example, the middleware 11*d*-2, the API 11*d*-3, or the application programs 11*d*-4). Also, the kernel 11*d*-1 may provide an interface for allowing the middleware 11*d*-2, the API 11*d*-3, or the application programs 11*d*-4 to access and control or manage individual components of the electronic device 11.

The middleware 11*d*-2 may serve as a medium through which the kernel 11*d*-1 may communicate with the API 11*d*-3 or the application programs 11*d*-4 to transmit and receive data. Also, the middleware 11d-2 may process one or more task requests received from the application programs 11d-4. For example, the middleware 11d-2 may assign priorities for using system resources (the bus 11a, the processor 11b, or the memory 11c) of the electronic device 11 to at least one of the application programs 11d-4, and process the one or more task requests according to the priorities assigned to the at least one application program 11d-4. The API 11d-3 is an interface that may control functions that the application programs 11d-4 provide at the kernel 11d-1 or the middleware 11d-2. For example, the API 11d-3 may include at least one interface or function (for example, a command) for file control, window control, video processing, or text control. The I/O interface 11e may, for example, act as an interface that provides a command or data received from a user or an external device to the other component(s) of the electronic device 11. Further, the I/O interface 11e may output a command or data received from the other component(s) to the user or the external device.

The display 11f may include, for example, a liquid crystal display (LCD), a light emitting diode (LED) display, an organic LED (OLED) display, a microelectromechanical system (MEMS) display, or an electronic paper display. The display 11f may display, for example, various types of content (for example, text, an image, a video, an icon, and/or a symbol) to the user. The display 11f may include a touch screen and receive, for example, a touch input, a gesture input, a proximity input, or a hovering input through an electronic pen or a user's body part. The communication interface 11g may establish communication between the electronic device 11 and an external device (for example, a first electronic device 12, a second electronic device 13, or a server 14). For example, the communication interface 11g may be connected to a network 15 by wireless or wired communication and communicate with the external device (for example, the second electronic device 13 or the server 14) over the network 15.

The wireless communication may be conducted by cellular communication conforming to, for example, at least one of long term evolution (LTE), LTE-advanced (LTE-A), code division multiple access (CDMA), wideband CDMA (WCDMA), universal mobile telecommunication system (UMTS), wireless broadband (WiBro), or global system for mobile communications (GSM)). According to an embodiment, the wireless communication may include, for example, at least one of wireless fidelity (WiFi), Bluetooth, Bluetooth low energy (BLE), Zigbee, near field communication (NFC), magnetic secure transmission (MST), radio frequency (RF), or body area network (BAN). According to an embodiment, the wireless communication may include GNSS. GNSS may be, for example, global positioning system (GPS), global navigation satellite system (Glonass), Beidou navigation satellite system (hereinafter, referred to as 'Beidou'), or Galileo, the European global satellite-based navigation system. In the present disclosure, the terms 'GPS' and 'GNSS' are interchangeably used with each other. The wired communication may be conducted in conformance to, for example, at least one of universal serial bus (USB), high definition multimedia interface (HDMI), recommended standard 232 (RS-232), power line communication, or plain old telephone service (POTS). The network 15 may be a telecommunication network, for example, at least one of a computer network (for example, LAN or WAN), the Internet, or a telephone network.

Each of the first and second external electronic devices 12 and 13 may be of the same type as or a different type than the electronic device 11. According to various embodiments, all or a part of operations performed in the electronic device 11 may be performed in one or more other electronic devices (for example, the electronic devices 12 and 13 or the server 14). According to an embodiment, if the electronic device 11 is to perform a function or a service automatically or upon request, the electronic device 11 may request at least a part of functions related to the function or the service to another device (for example, the electronic device 12 or 13 or the server 14), instead of performing the function or the service autonomously, or additionally. The other device (for example, the electronic device 12 or 13 or the server 14) may execute the requested function or an additional function and provide a result of the function execution to the electronic device 11. The electronic device 11 may provide the requested function or service based on the received result or by additionally processing the received result. For this purpose, for example, cloud computing, distributed computing, or client-server computing may be used.

Figure 2:
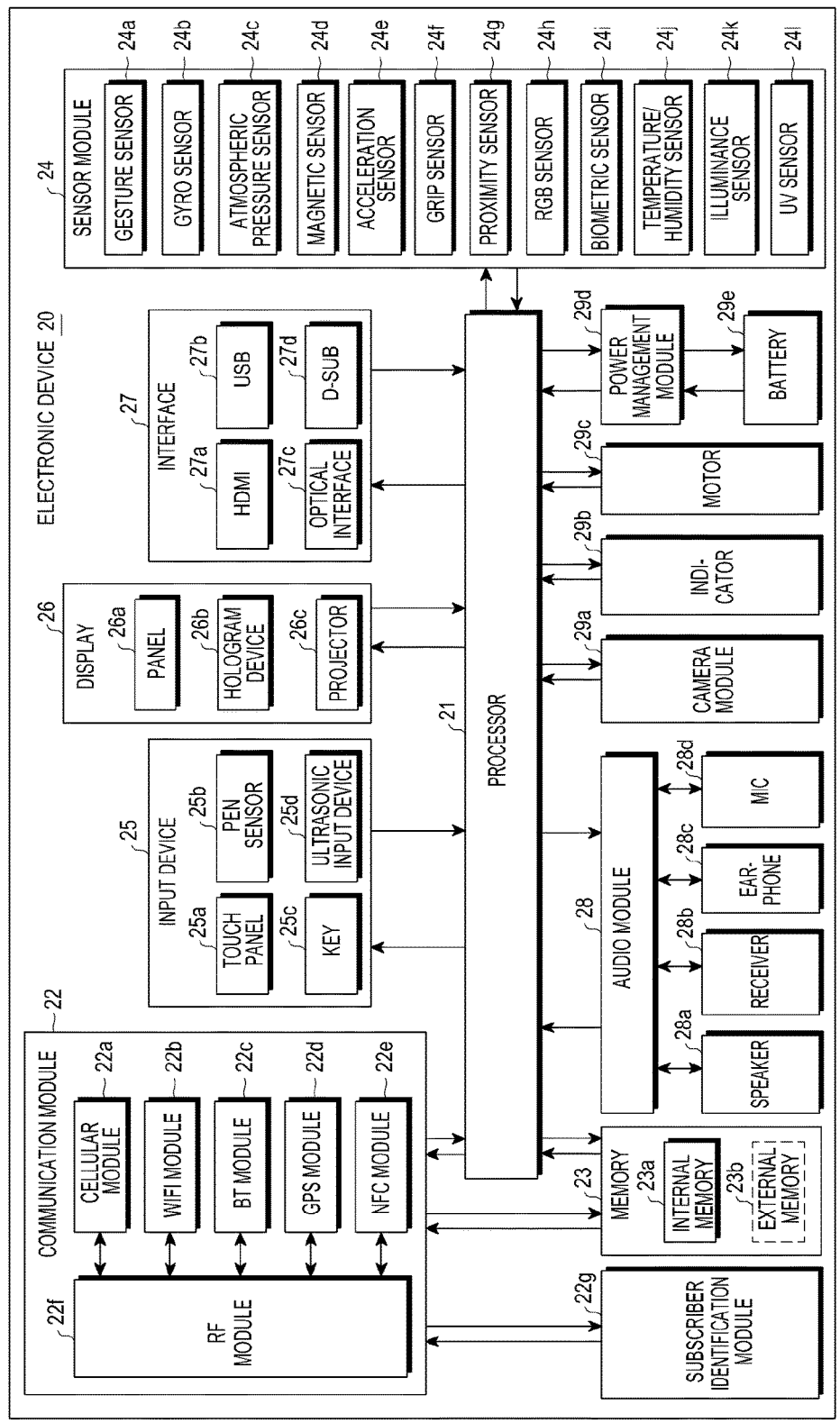
FIG. 2 is a block diagram illustrating an electronic device according to various embodiments of the present disclosure.

FIG. 2 is a block diagram of an electronic device 20 according to various embodiments of the present disclosure.

Referring to FIG. 2, the electronic device 20 may include, for example, the whole or part of the electronic device 11 illustrated in FIG. 1. The electronic device 20 may include at least one processor (for example, AP) 21, a communication module 22, a subscriber identification module (SIM) 22g, a memory 23, a sensor module 24, an input device 25, a display 26, an interface 27, an audio module 28, a camera module 29a, a power management module 29d, a battery 29e, an indicator 29b, and a motor 29c. The processor 21 may, for example, control a plurality of hardware or software components that are connected to the processor 21 by executing an OS or an application program and may perform processing or computation of various types of data. The processor 21 may be implemented, for example, as a system on chip (SoC). According to an embodiment, the processor 21 may further include a graphics processing unit (GPU) and/or an image signal processor. The processor 21 may include at least a part (for example, a cellular module 22a) of the components illustrated in FIG. 2. The processor 21 may load a command or data received from at least one of other components (for example, a non-volatile memory), process the loaded command or data, and store result data in the non-volatile memory.

The communication module 22 may include, for example, the cellular module 22a, a WiFi module 22b, a Bluetooth (BT) module 22c, a GNSS module 22d, an NFC module 22e, and an RF module 22f. The cellular module 22a may provide services such as voice call, video call, text service, or the Internet through a communication network. According to an embodiment, the cellular module 22a may identify and authenticate the electronic device 20 within a communication network, using the SIM (for example, a SIM card) 22g. According to an embodiment, the cellular module 22a may perform at least a part of the functionalities of the processor 21. According to an embodiment, the cellular module 22a may include a CP. According to an embodiment, at least a part (for example, two or more) of the cellular module 22a, the WiFi module 22b, the BT module 22c, the GNSS module 22d, or the NFC module 22e may be included in a single integrated chip (IC) or IC package. The RF module 22f may transmit and receive communication signals (for example, RF signals). The RF module 22f may include, for example, a transceiver, a power amplifier module (PAM), a frequency filter, a low noise amplifier (LNA), an antenna, or the like. According to another embodiment, at least one of the cellular module 22a, the WiFi module 22b, the BT module 22c, the GNSS module 22d, and the NFC module 22e may transmit and receive RF signals via a separate RF module. The SIM 22g may include, for example, a card including the SIM and/or an embedded SIM. The SIM 22g may include a unique identifier (for example, integrated circuit card identifier (ICCID)) or subscriber information (for example, international mobile subscriber identity (IMSI)).

The memory 23 (for example, the memory 11c) may include, for example, an internal memory 23a or an external memory 23b. The internal memory 23a may be at least one of, for example, a volatile memory (for example, dynamic RAM (DRAM), static RAM (SRAM), or synchronous dynamic RAM (SDRAM)), and a non-volatile memory (for example, one time programmable ROM (OTPROM), programmable ROM (PROM), erasable and programmable ROM (EPROM), electrically erasable and programmable ROM (EEPROM), mask ROM, flash ROM, flash memory, a hard drive, and a solid state driver (SSD)). The external memory 23b may include a flash drive such as a compact flash (CF) drive, a secure digital (SD), a micro secure digital (micro-SD), a mini secure digital (mini-SD), an extreme digital (xD), a multi-media card (MMC), or a memory stick. The external memory 23b may be operatively or physically coupled to the electronic device 20 via various interfaces.

The sensor module 24 may, for example, measure physical quantities or detect operational states associated with the electronic device 20, and convert the measured or detected information into electric signals. The sensor module 24 may include at least one of, for example, a gesture sensor 24a, a gyro sensor 24b, an atmospheric pressure sensor 24c, a magnetic sensor 24d, an accelerometer 24e, a grip sensor 24f, a proximity sensor 24g, a color sensor (for example, a red, green, blue (RGB) sensor) 24h, a biometric sensor 24i, a temperature/humidity sensor 24j, an illumination sensor 24k, or an ultra violet (UV) sensor 24l. Additionally or alternatively, the sensor module 24 may include, for example, an electrical-nose (E-nose) sensor, an electromyography (EMG) sensor, an electroencephalogram (EEG) sensor, an electrocardiogram (ECG) sensor, an infrared (IR) sensor, an iris sensor, and/or a finger print sensor. The sensor module 24 may further include a control circuit for controlling one or more sensors included therein. According to some embodiments, the electronic device 20 may further include a processor configured to control the sensor module 24, as a part of or separately from the processor 21. Thus, while the processor 21 is in a sleep state, the control circuit may control the sensor module 24.

The input device 25 may include, for example, a touch panel 25a, a (digital) pen sensor 25b, a key 25c, or an ultrasonic input device 25d. The touch panel 25a may operate in at least one of, for example, capacitive, resistive, infrared, and ultrasonic schemes. The touch panel 25a may further include a control circuit. The touch panel 25a may further include a tactile layer to thereby provide haptic feedback to the user. The (digital) pen sensor 25b may include, for example, a detection sheet which is a part of the touch panel or separately configured from the touch panel. The key 25c may include, for example, a physical button, an optical key, or a keypad. The ultrasonic input device 25d may be a device configured to identify data by detecting, using a microphone (for example, a microphone 28d), ultrasonic signals generated by an input tool capable of generating the ultrasonic signals.

The display 26 (for example, the display 11f) may include a panel 26a, a hologram device 26b, a projector 26c, and/or a control circuit for controlling these components. The panel 26a may be configured to be, for example, flexible, transparent, or wearable. The panel 26a and the touch panel 25a may be implemented as one or more modules. According to an embodiment, the panel 26a may include a pressure sensor (or a force sensor) for measuring the strength of the pressure of a user touch. The pressure sensor may be integrated with the touch panel 25a, or configured as one or more sensors separately from the touch panel 25a. The hologram device 26b may utilize the interference of light waves to provide a three-dimensional image in empty space. The projector 26c may provide an image by projecting light on a screen. The screen may be positioned, for example, inside or outside the electronic device 20. The interface 27 may include, for example, an HDMI 27a, a USB 27b, an optical interface 26c, or a D-subminiature (D-sub) 27d. The interface 27 may be included, for example, in the communication interface 11g illustrated in FIG. 1. Additionally or alternatively, the interface 27 may include, for example, a mobile high-definition link (MHL) interface, an SD/multimedia card (MMC) interface, or an infrared data association (IrDA) interface.

The audio module 28 may convert a sound to an electrical signal, and vice versa. At least a part of the components of the audio module 28 may be included, for example, in the I/O interface 11d-3 illustrated in FIG. 1. The audio module 28 may process sound information input into, or output from, for example, a speaker 28a, a receiver 28b, an earphone 28c, or the microphone 28d. The camera module 29a is, for example, a device capable of capturing still images and a video. According to an embodiment, the camera module 29a may include one or more image sensors (for example, a front sensor or a rear sensor), a lens, an image signal processor (ISP), or a flash (for example, an LED or a xenon lamp). The power management module 29d may manage power of the electronic device 20. According to an embodiment, the power management module 29d may include a power management integrated circuit (PMIC), a charger IC, or a battery fuel gauge. The PMIC may adopt wired and/or wireless charging. The wireless charging may be performed, for example, in a magnetic resonance scheme, a magnetic induction scheme, or an electromagnetic wave scheme, and may use additional circuits for wireless charging, such as a coil loop, a resonance circuit, or a rectifier. The battery fuel gauge may measure, for example, a charge level, a voltage while charging, current, or temperature of the battery 29e. The battery 29e may include, for example, a rechargeable battery and/or a solar battery.

The indicator 29b may indicate specific states of the electronic device 20 or a part of the electronic device 20 (for example, the processor 21), for example, boot status, message status, or charge status. The motor 29c may convert an electrical signal into a mechanical vibration and generate vibrations or a haptic effect. The electronic device 20 may include a processing device for supporting mobile TV (for example, a GPU). The processing device for supporting mobile TV may process media data compliant with, for example, digital multimedia broadcasting (DMB), digital video broadcasting (DVB), or MediaFLO. Each of the above-described components of the electronic device may include one or more parts and the name of the component may vary with the type of the electronic device. According to various embodiments, some component may be omitted from or added to the electronic device (for example, the electronic device 20). Or one entity may be configured by combining a part of the components of the electronic device, to thereby perform the same functions of the components prior to the combining.

Figure 3:
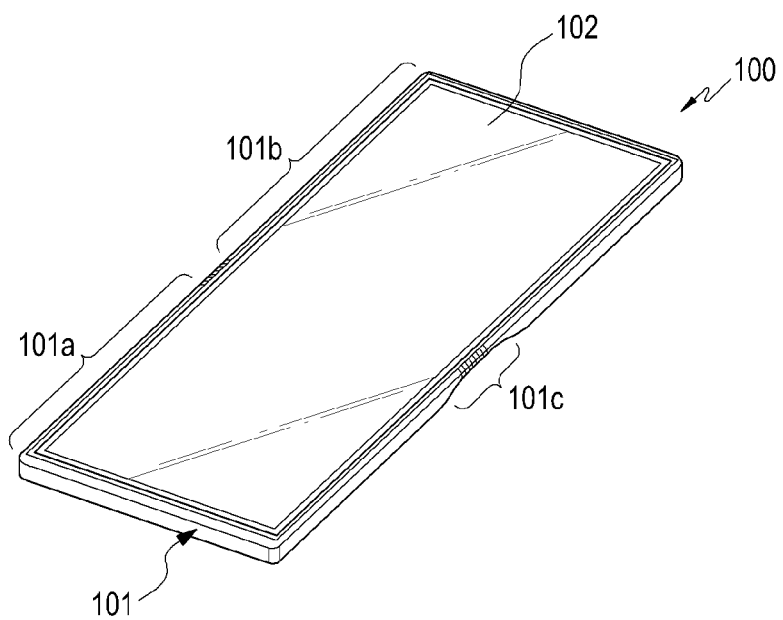
FIG. 3 is a perspective view illustrating an electronic device according to various embodiments of the present disclosure.
Figure 4:
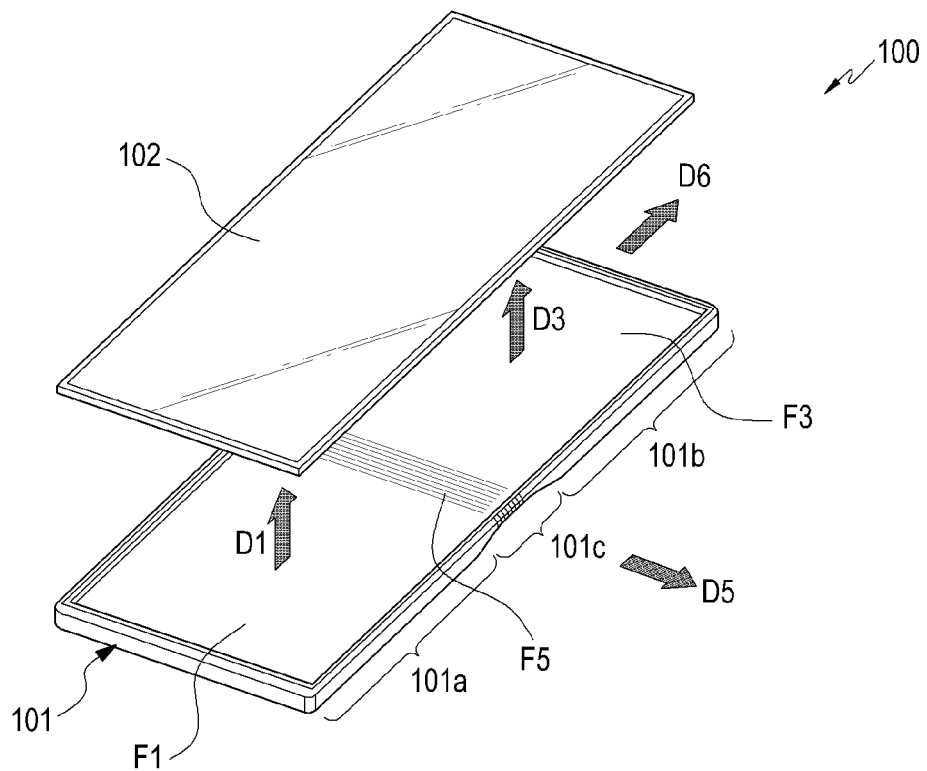
FIG. 4 is an exploded perspective view illustrating the electronic device according to various embodiments of the present disclosure.
Figure 5:
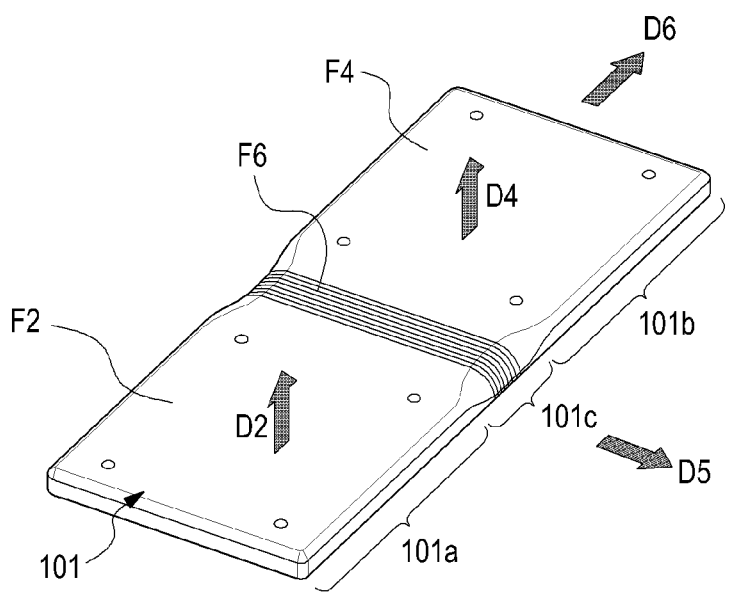
FIG. 5 is a perspective view illustrating the electronic device according to various embodiments of the present disclosure, seen from a different direction.
Figure 6:
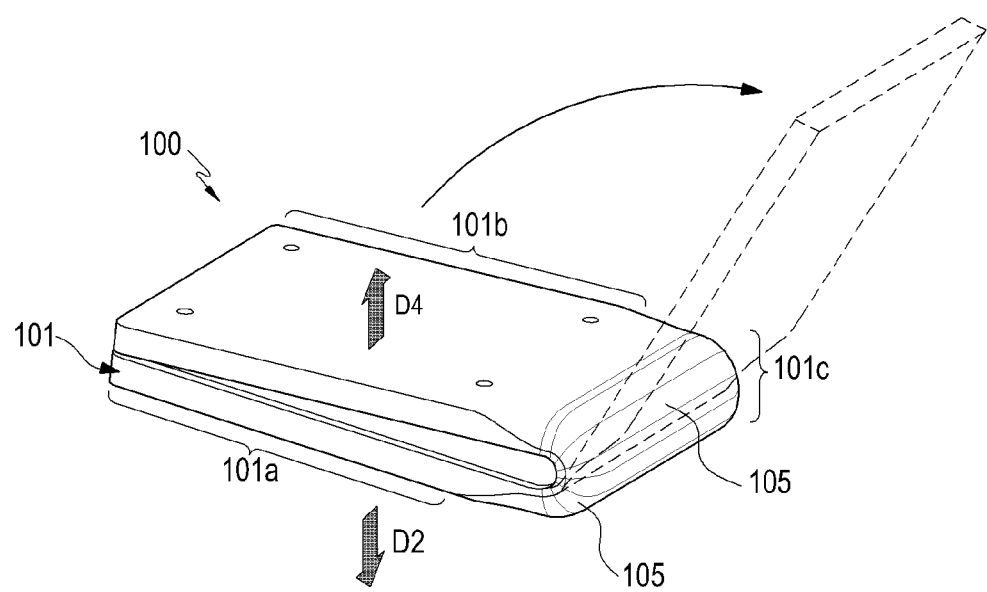
FIG. 6 is a perspective view illustrating the electronic device in a folded state according to various embodiments of the present disclosure.
Figure 7:
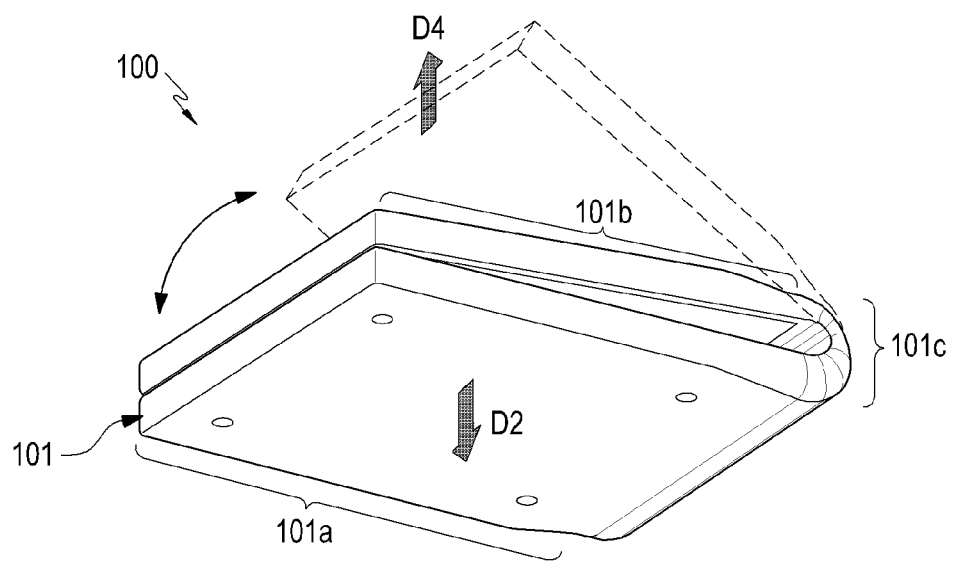
FIG. 7 is a perspective view illustrating the electronic device in the folded state according to various embodiments of the present disclosure, seen from a different direction.

FIG. 3 is a perspective view illustrating an electronic device 100 according to various embodiments of the present disclosure, FIG. 4 is an exploded perspective view illustrating the electronic device 100 according to various embodiments of the present disclosure, FIG. 5 is a perspective view illustrating the electronic device 100 according to various embodiments of the present disclosure, seen from a different direction, FIG. 6 is a perspective view illustrating the electronic device 100 in a folded state according to various embodiments of the present disclosure, and FIG. 7 is a perspective view illustrating the electronic device 100 in the folded state according to various embodiments of the present disclosure, seen from a different direction.

Referring to FIGS. 3 to 7, the electronic device 100 (for example, the electronic device 20 in FIG. 2) may include a housing 101, and a flexible display 102 (for example, the display 26 in FIG. 2) mounted on one surface of the housing 101. The flexible display 102 may be incorporated with a touch panel (for example, the touch panel 25a in FIG. 2), and thus may be used as an input device. Although the term 'display' may simply be mentioned in the following detailed description, the 'display' may cover a flexible or bendable display in meaning.

The housing 101 may include a first part 101a, a second part 102a, and a connection unit 101c for connecting the first part 101a to the second part 101b in such a manner that the first part 101a and the second part 101b may move (for example, pivot) relative to each other. For example, the second part 101b is engaged with the first part 101a through the connection unit 101c, and may make a relative movement between a position in which the second part 101b faces the first part 101a (for example, a folded state) and a position in which the second part 101b is leveled with the first part 101a, next to the first part 101a, with the connection unit 101c in between (for example, an unfolded state), according to operations of the connection unit 101c.

According to an embodiment, the first part 101a may include a first surface F1 facing in a first direction D1, and a second surface F2 facing in a second direction D2 opposite to the first direction D1. The second part 101b may include a third surface F3 facing in a third direction D3, and a fourth surface F4 facing in a fourth direction D4 opposite to the third direction D3. In the folded state of the housing 101, the third surface F3 may face the first surface F1. In the unfolded state of the housing 101 (for example, in the state where the second part 101b is leveled with the first part 101a), the first direction D1, the second direction D2, the third direction D2, and/or the fourth direction D4 may be parallel to each other on the whole. In an embodiment, the first surface F1 and the third surface F3 may provide part of one surface of the housing 101, for example, part of an area in which the display 102 is mounted.

According to an embodiment, the connection unit 101c may connect an edge of the first part 101a to an edge of the second part 101b, and may be bendable. The connection unit 101c may include, for example, a bendable fifth surface F5 for connecting the first surface F1 to the third surface F3, and a bendable sixth surface F6 for connecting the second surface F2 to the fourth surface F4. For example, in the folded state of the housing 101, the third surface F3 may face the first surface F1. When the housing 101 is unfolded, the third surface F3 may be leveled with the first surface F1 with the fifth surface F5 in between. In an embodiment, the sixth surface F6 may include an array of a plurality of cover members 105. As the housing 101 is folded or unfolded, the cover members 105 may be partially overlapped with each other, thereby extending or contracting the sixth surface F6. For example, the sixth surface F6 may have a larger surface area in the folded state of the housing 101 than in the unfolded state of the housing 101.

According to various embodiments, as the housing 101 is folded or unfolded, the sixth surface F6 may be extended or contracted, thereby preventing application of an external force (for example, tensile force or compressive force) to the display 102. For example, as the housing 101 is folded, the other surface of the housing 101 (for example, the surface including the second, fourth, and sixth surfaces F2, F4, and F6) may experience a relative length change with respect to one surface of the housing 101 (for example, the surface on which the display 102 is mounted). According to various embodiments of the present disclosure, the electronic device 100 may suppress a length change of the surface on which the display 102 is mounted and prevent application of an external force to the display 102, which is caused by extension or contraction of the surface (for example, the sixth surface F6) on which the display 102 is not mounted, during folding of the housing 101.

According to various embodiments, as the second part 101b makes a relative movement with respect to the first part 101a, the array of the cover members 105 may render the outer surface (for example, the sixth surface F6) of the connection unit 101c to be a continuous flat surface or a continuous curved surface. Herein, 'continuing, continuous, or continual' may mean that 'the outer space of the housing 101 is isolated from the inner space of the housing 101 or the cover members 105 by means of the array of the cover members 105'. In other words, 'continuing, continuous, or continual' may mean that 'the inner space of the cover members 105 is hidden by the array of the cover members 105, when seen from the outer space'.

The display 102 may span from the first surface F1 to the third surface F3 through the fifth surface F5, and may be bendable in correspondence with bending of the fifth surface F5. According to various embodiments, the fifth surface F5 may be formed by an array of a plurality of hinge members, and may be bendable along with mutual relative movements of the hinge members. Each of the cover members 105 may be connected to one of the hinge members. Engagement and arrangement of the hinge members and the cover members 105 will be described later in greater detail in an embodiment illustrated in FIG. 42.

According to various embodiments, as the plurality of hinge members of the connection unit 101c move relative to each other within a limited angle range, the curvature radius of the fifth surface F5 may be kept to be a predetermined value in the folded state of the housing 101, which will be described later in an embodiment illustrated in FIG. 8. For example, excessive deformation of a partial area of the display 102 corresponding to the fifth surface F5 may be prevented even in the folded state of the housing 101. In an embodiment, in the state where the housing 101 is unfolded, the hinge members of the connection unit 101c may support the display 102, thereby reducing or preventing deformation of the display 102 against a user touch (for example, a touch input).

According to various embodiments, since the second part 101b is engaged with the first part 101a by the connection unit 101c, the second part 101b may make a relative movement from a position in which the second part 101b is folded over the first part 101a to a position in which the second part 101b is inclined to the first part 101a or a position in which the second part 101b is leveled with the first part 101a. As described before, while the second part 101b is moving relative to the first part 101a (or the first part 101a is moving relative to the second part 101b), no substantial length change may not occur to the display 102 and one surface of the housing 101, and the sixth surface F6 may be extended or contracted, along with a relative movement of the other surface of the housing 101, for example, the cover members 105. For example, application of tensile force or compressive force to the display 102 may be prevented during folding of the housing 101.

Now, a detailed description will be given of the structure of the connection unit.

Figure 8:
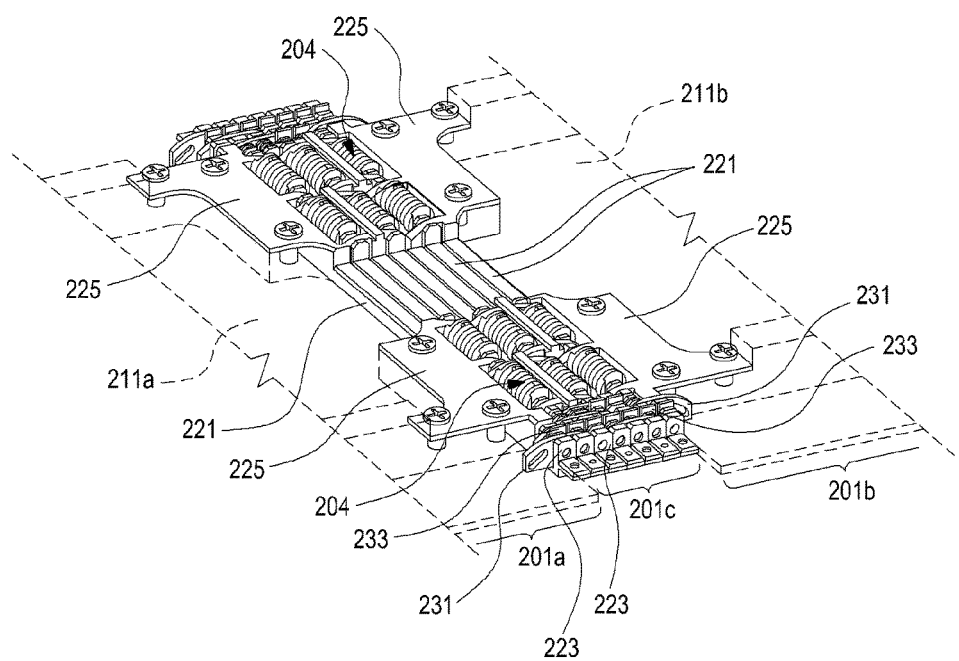
FIG. 8 is a perspective view illustrating a connection unit in the electronic device according to various embodiments of the present disclosure.
Figure 9:
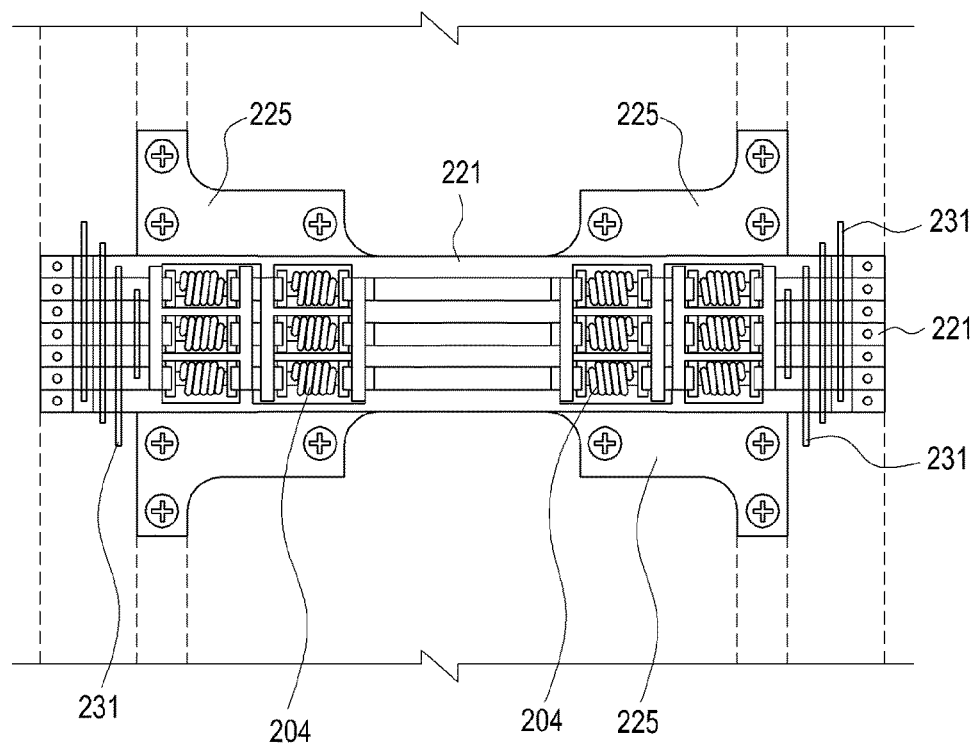
FIG. 9 is a plan view illustrating the connection unit in the electronic device according to various embodiments of the present disclosure.
Figure 10:
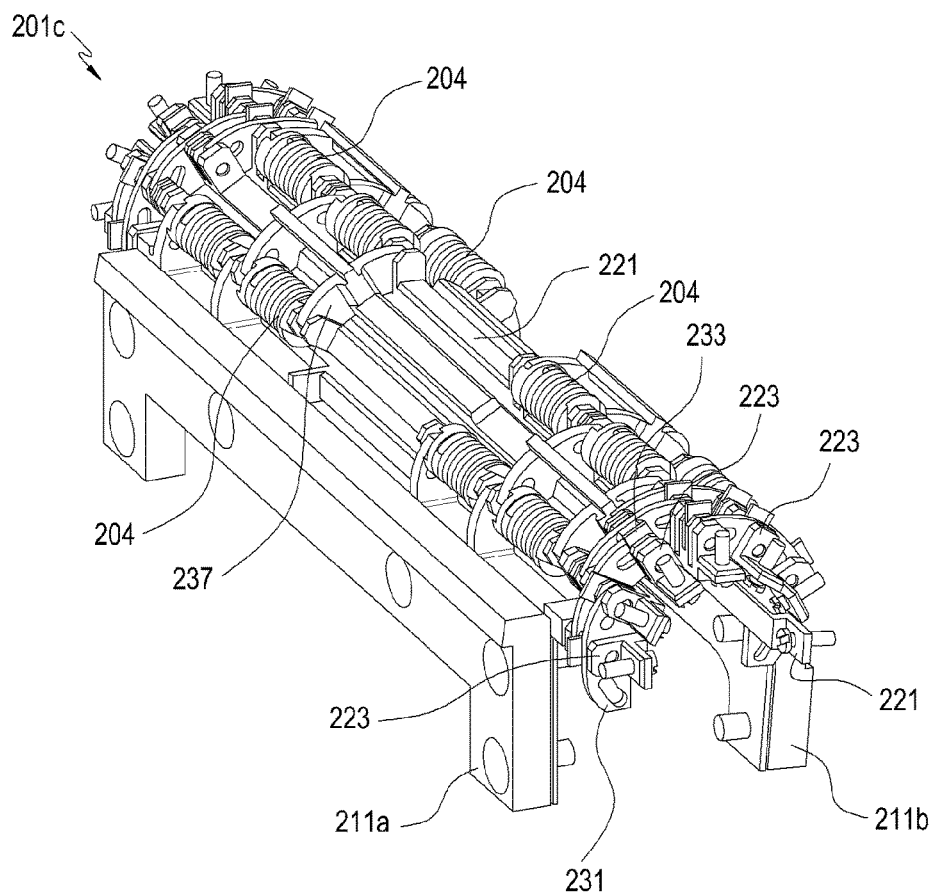
FIG. 10 is a perspective view illustrating a first part and a second part of a housing, which are folded by means of the connection unit in the electronic device according to various embodiments of the present disclosure.

FIG. 8 is a perspective view illustrating a connection unit 201c in the electronic device according to various embodiments of the present disclosure, FIG. 9 is a plan view illustrating the connection unit 201c in the electronic device according to various embodiments of the present disclosure, and FIG. 10 is a perspective view illustrating the first part and the second part of the housing which are folded by the connection unit 201c in the electronic device according to various embodiments of the present disclosure.

Referring to FIGS. 8, 9, and 10, the connection unit 201c may include a plurality of hinge members 221. Each of the hinge members 221 may be extended in one direction, for example, in a direction (for example, the fifth direction D5 in FIG. 4) substantially parallel to an edge of a first part 201a (for example, the first part 101a in FIG. 4) and/or an edge of a second part 201b (for example, the second part 101b in FIG. 4), and may be arranged along a sixth direction perpendicular to the fifth direction D5 (for example, along the sixth direction D6 in FIG. 4), substantially in parallel to one surface of a housing (for example, the housing 101 in FIG. 4). Each of the hinge members 221 may include support ribs 223 formed on one surface of the hinge member 221, and each of peripheral hinge members 221 may include an engagement member(s) 225. Each of the engagement members 225 may be extended in the sixth direction D6 or the opposite direction and engaged with a case 211a or 211b forming the first part 201a or the second part 201b of the housing.

According to various embodiments, the connection unit 201c may include first link members 231, each connecting at least two adjacent hinge members 221 to each other so that the hinge members 221 may make a relative movement with respect to each other. Each of the first link members 231 may be arranged between a pair of support ribs 223, and guide pins 235 (shown in FIG. 12) may be inserted into the first link member 231 and the support ribs 223 so that at least two adjacent hinge members 221 may make a relative movement with respect to each other, which will be described later in an embodiment illustrated in FIG. 12. In an embodiment, a fixing clip(s) 233 may be inserted between the support ribs 223. The fixing clips 233 may prevent the guide pin 235 from slipping off from the support ribs 223 and/or the first link member 231. Owing to the above-described engagement and arrangement, the hinge members 221 may form the fifth surface F5 of the housing (for example, the housing 101 in FIG. 4), and as the hinge members 221 make a relative movement with respect to each other, the fifth surface F5 may be bended from a flat state to a curved state.

In an embodiment, the connection unit 201c may further include locking members 204. Each of the locking members 204 may fixedly keep adjacent hinge members 221 at a predetermined angle with respect to each other. When it is said that 'a locking member 204 fixedly keeps adjacent hinge members 221 at a predetermined angle with respect to each other' may mean that the hinge members 221 are kept at angle positions relative to each other before an external force of a predetermined strength is applied to the hinge members 221, and when an external force exceeding the predetermined strength is applied, the hinge members 221 move relative to each other. The structure of the locking members 204 will be described later in an embodiment illustrated in FIG. 15.

According to various embodiments, each of the hinge members 221 may make a relative movement with respect to an adjacent hinge member 221 within a predetermined angle range by means of a first link member 231 and a guide pin 235. For example, the connection unit 201c may include 7 hinge members 221, and each of the hinge members 221 may make a relative movement within an angle range of about 30.7 degrees with respect to an adjacent hinge member 221 from the flat state of the fifth surface F5. In an embodiment, when each of the 7 hinge members 221 makes a relative movement within an angle range of about 30.7 degrees with respect to an adjacent hinge member 221 from the flat state of the fifth surface F5, the first surface F1 and the third surface F3 may be positioned to face each other, and the fifth surface F5 may be transformed to a curved surface having a predetermined curvature. For example, part of the display (for example, the display 102 in FIG. 4) corresponding to the fifth surface F5 may also be transformed to a curved surface. According to an embodiment, since the angle range in which the hinge members 221 are allowed to make a relative movement with respect to each other is limited, the display 102 may maintain a predetermined curvature radius in spite of the folded state of the housing 101. For example, the arrangement and engagement mechanism of the hinge members 221 may suppress excessive deformation of the display 102, thereby preventing damage to the display 102.

In an embodiment, similarly to extension or contraction of the sixth surface F6 along with folding of the housing 101 (for example, mutual relative movements of the cover members 105 illustrated in FIG. 6), as the hinge members 221 move relative to each other, application of tensile force or compressive force to the display 102 may be prevented. The relative movements of the hinge members 221 may be hidden by the display 102. When seen from the exterior of the electronic device 100 and/or the housing 101, although the display 102 is smoothly bent to a curved surface in correspondence with folding of the housing 101, the display 102 is shown as fixed onto one surface of the housing 101.

The locking members 204 may be arranged at both sides of the center of the connection unit 201c along the fifth direction D5, and an empty space may be formed at the center of the connection unit 201c within a thickness range of the arranged locking members 204. According to an embodiment, the center of the connection unit 201c may be provided as a wiring area (or space). For example, circuit devices arranged in the first part 201a and the second part 201b may be interconnected through a flexible printed circuit board (FPCB) disposed in the wiring area.

Figure 11:
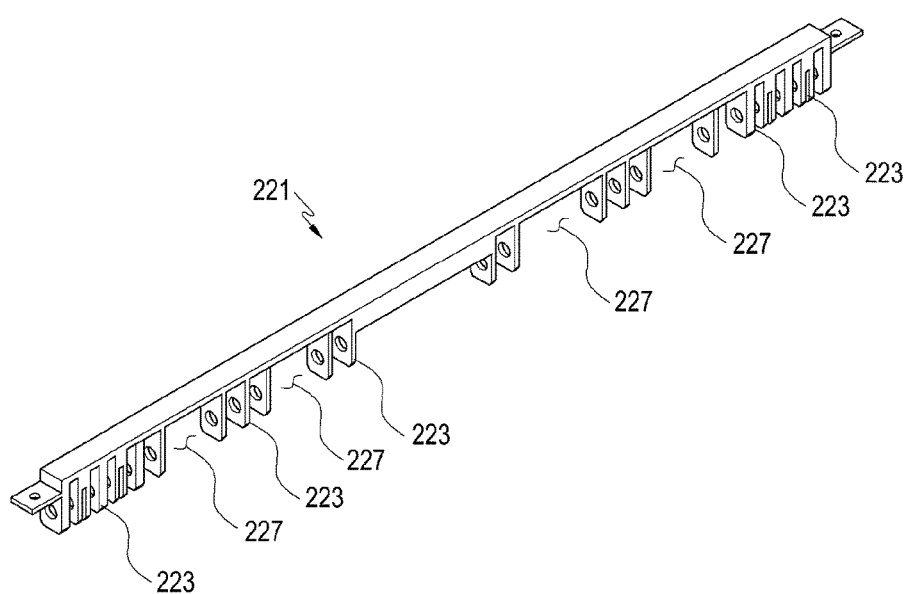
FIG. 11 is a perspective view illustrating a hinge member of the connection unit in the electronic device according to various embodiments of the present disclosure.

FIG. 11 is a perspective view illustrating a hinge member 221 of the connection unit in the electronic device according to various embodiments of the present disclosure.

Referring to FIG. 11, the hinge member 221 may be extended in one direction, for example, in the fifth direction D5 illustrated in FIG. 4, and may include a plurality of support ribs 223 protruding from one portion of the hinge member 221. As mentioned before, the support ribs 223 may be engaged with first link members 231, thereby engaging the hinge member 221 with an adjacent hinge member 221 in such a manner that the hinge member 221 may make a relative movement with respect to the adjacent hinge member 221. According to various embodiments, some of the support ribs 223 may be arranged at a larger interval than the other support ribs 223. Spaces 227 formed by arranging the support ribs 223 at the larger interval may be provided as spaces in which locking members (for example, locking members 204 in FIG. 8) are disposed.

Figure 12:
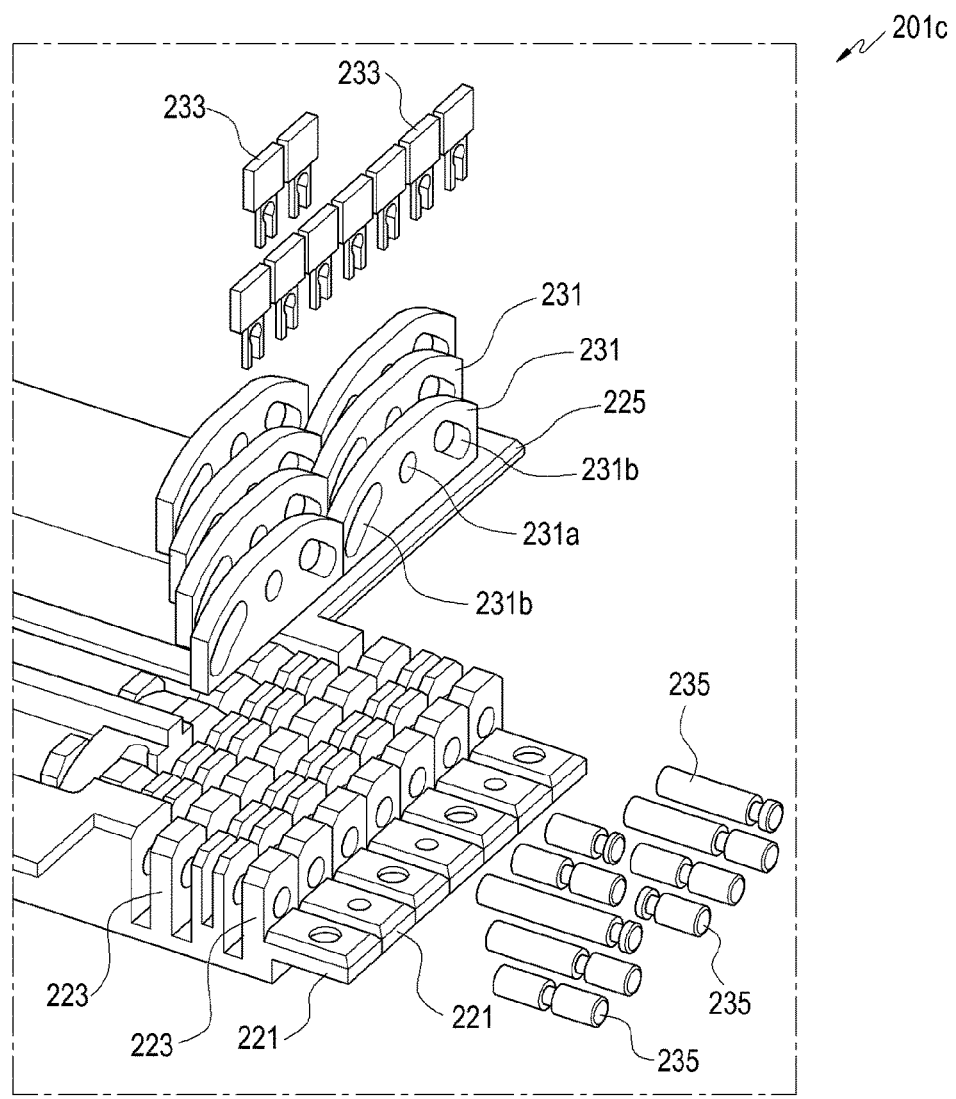
FIG. 12 is an exploded perspective view illustrating a connection mechanism of hinge members in the electronic device according to various embodiments of the present disclosure.
Figure 13:
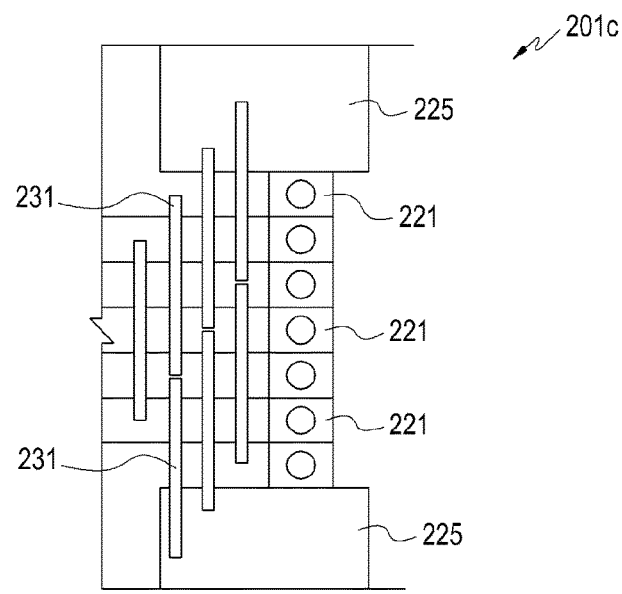
FIG. 13 is a plan view illustrating the connection mechanism of the hinge members in the electronic device according to various embodiments of the present disclosure.

FIG. 12 is an exploded perspective view illustrating a connection mechanism of the hinge members 221 in the electronic device according to various embodiments of the present disclosure, and FIG. 13 is a plan view illustrating the connection mechanism of the hinge members 221 in the electronic device according to various embodiments of the present disclosure.

Referring to FIGS. 12 and 13, a plurality of hinge members 221 may be engaged with each other by a plurality of first link members 231 so that the hinge members 221 may move relative to each other in the connection unit 201c. One first link member 231 may be engaged with, for example, three hinge members 221 in such a manner that the hinge members 221 may sequentially make relative movements. In an embodiment, the first link member 231 may include a fixing hole 231a formed at the center, and a guide hole(s) 231b extended along a predetermined trajectory at at least one side of the fixing hole 231a. According to various embodiments, the first link member 231 may include one fixing hole 231a, and guide holes 213b at both sides of the fixing hole 213a.

In an embodiment, a part of the first link members 231 may connect and engage a pair of hinge members 221 with each other. For example, a part of the first link members 231 may connect and engage a pair of hinge members 221 at one end of the array of the hinge members 221 with each other. When the first link member 231 connects and engages the two hinge members 221 with each other so that the hinge members 221 may make a relative movement with respect to each other, the first link member 231 may have a single guide hole 231b.

According to various embodiments, each of the hinge members 221 may be repeated in the same arrangement or configuration or in a similar structure. While the hinge members 221 may be described using the ordinal numbers such as 'first' or 'second' or using different reference numerals, when needed, a 'first hinge member' in one embodiment may be described as a 'second hinge member' in another embodiment. Further, even though a 'first hinge member' is mentioned in different embodiments, the first hinge member may be different in the embodiments. The following description will be given with the appreciation that each of the first link members 231 connects three sequential hinge members 221 to each other. The "three sequential hinge members' may be three hinge members selected at an arbitrary position from among the hinge members 221 arranged in the connection unit 201c. For example, the 'three hinge members selected at an arbitrary position' may be a central hinge member and hinge members at both sides of the central hinge member, among 7 hinge members 221. In another embodiment, the 'three hinge members selected at an arbitrary position' may be three sequential hinge members including a hinge member at one end of the 7 hinge members 221. In another embodiment, a part of three hinge members selected at a first position may be a part of hinge members selected at a second position. In another embodiment, a hinge member at one end of the three hinge members selected at the first position may be at once the central hinge member among the three hinge members selected at the second position, and a hinge member at one end (or the other end) of three hinge members selected at a third position.

Additionally, while 'hinge members' or their related components may be denoted by reference numerals in the form of 'XXX', reference numerals in the form of 'XXX-1', 'XXX-2', or the like may be used to further differentiate the components.

According to various embodiments, the connection unit 201c may further include a guide pin(s) 235, to thereby engage the first link member 231 with the hinge members 221. Each of the guide pins 235 may be installed and fixed to support ribs 223 through one of the fixing hole 231a and/or the guide holes 231b. For example, the fixing hole 231a and/or the guide holes 231b may be arranged, at least partially facing the support ribs 223.

According to an embodiment, a guide pin 235 penetrating through the fixing hole 231a may fix the first link member 231 to a hinge member 221 (for example, a first hinge member) corresponding to the first link member 231. In an embodiment, a guide pin 235 penetrating through one of the guide holes 231b may connect and engage a hinge member 221 (for example, a second hinge member arranged at one side of the first hinge member) with the first hinge member so that the hinge member 221 may make a movement relative to the first hinge member. For example, each of the hinge members 221 may make a movement relative to an adjacent hinge member 221 within a trajectory or angle range of a guide hole 231b. The trajectory of the guide hole 231b may limit the mutual relative movements of a pair of adjacent hinge members 221 within a range of about 30 degrees (for example, 30.7 degrees).

According to various embodiments, when a plurality of, for example, 7 hinge members 221 are arranged, each of a plurality of first link members 231 may be engaged with three selected hinge members 221 so that the hinge members 221 may make a relative movement with respect to each other. In an embodiment, one hinge member 221 may be engaged with on, two, or three first link members 231. The number or arrangement interval of the first link members 231, the trajectory of the guide holes 231b, and so on may vary according to the specification of an actual electronic device to be fabricated.

In an embodiment, the connection unit 201c may further include a plurality of fixing clips 233. Each of the fixing clips 233 may be inserted between support ribs 223 and/or between a support rib 223 and a first link member 231, thereby engaging with a guide pin 235. In another example, each guide pin 235 may have a fixing recess formed on its outer circumferential surface, and one of the fixing clips 233 may be engaged with the guide pin 235 by means of the fixing recess. For example, the guide pin 235 may be installed and fixed to the support ribs 223 by means of the fixing clip 233.

Figure 14:
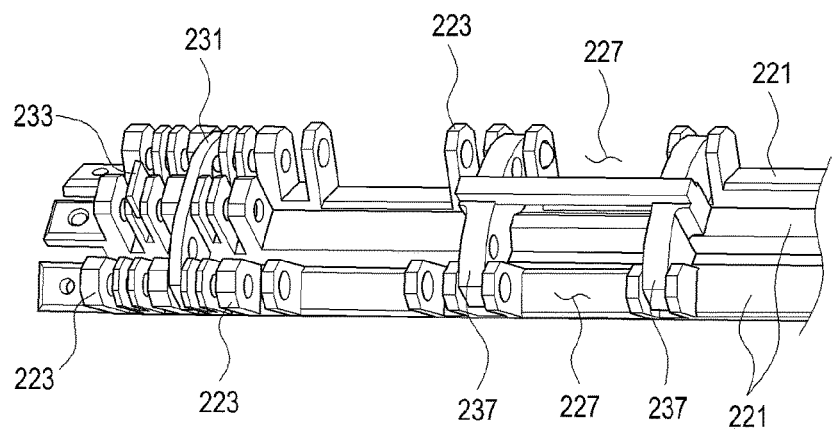
FIG. 14 is a perspective view illustrating an operation of the hinge members in the electronic device according to various embodiments of the present disclosure.

FIG. 14 is a perspective view illustrating an operation of the hinge members 221 in the electronic device according to various embodiments of the present disclosure.

Referring to FIG. 14, a part of the hinge members 221 in the electronic device (or the connection unit) according to various embodiments of the present disclosure may include a second link member(s) 237. In an embodiment, the second link member(s) 237 may be integrated with the part of the hinge members 221. In another embodiment, the second link member(s) 237 may be assembled with the part of the hinge members 221. A part of the second link member(s) 237 may be arranged in correspondence with a space 227 of an adjacent hinge member (for example, a space in which a locking member 204 is disposed). For example, the part of the second link member(s) 237 may be disposed in the vicinity of the space 227 with a support rib 223 next to the space 227 in between.

According to various embodiments, in the state where the connection unit 201c is bent, for example, the fifth surface F5 is a curved surface, the support ribs 223 formed on one surface of one hinge member 221 may be inclined to the support ribs 223 formed on another adjacent hinge member 221. For example, in the state where the fifth surface F5 is the curved surface, the other surfaces of the hinge members 221 may be inclined to each other, and from the perspective of the overall connection unit 201c, the fifth surface F5 may be a curved surface. In an embodiment, in the state where the afore-described housing (for example, the housing 101 in FIG. 4) is unfolded, the fifth surface F5, for example, the array of the hinge members 221 may form one flat surface.

Figure 15:
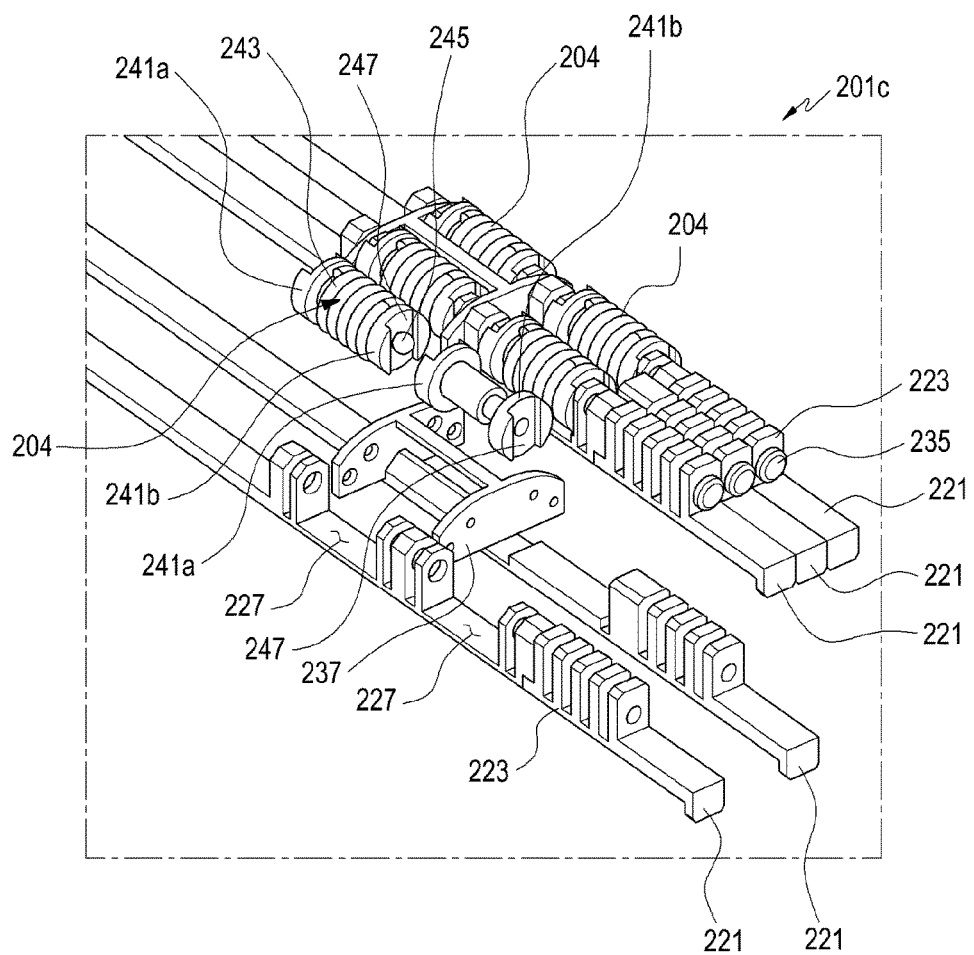
FIG. 15 is an exploded perspective view illustrating a locking device structure of the connection unit in the electronic device according to various embodiments of the present disclosure.
Figure 16:
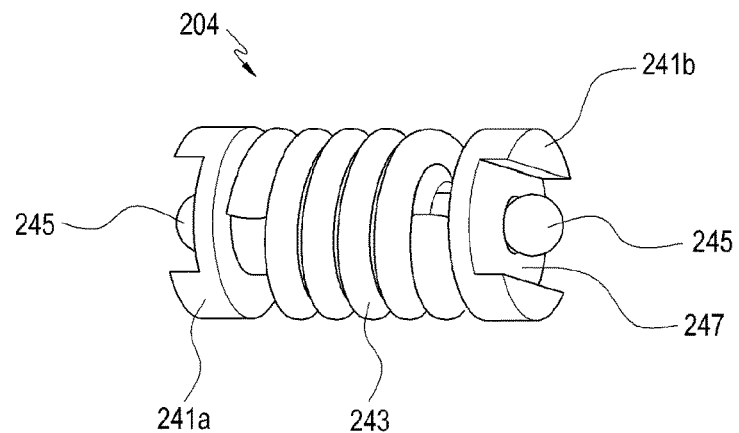
FIG. 16 is a perspective view illustrating a locking member in the electronic device according to various embodiments of the present disclosure.
Figure 17:
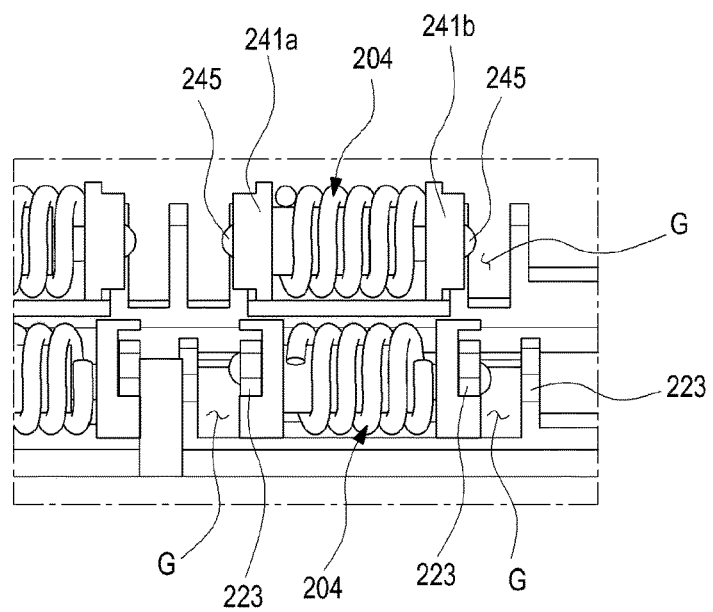
FIG. 17 is a perspective view illustrating an operation of locking members in the electronic device according to various embodiments of the present disclosure.

FIG. 15 is an exploded perspective view illustrating a locking device structure of the connection unit 201c in the electronic device according to various embodiments of the present disclosure, FIG. 16 is a perspective view illustrating a locking member 204 in the electronic device according to various embodiments of the present disclosure, and FIG. 17 is a perspective view illustrating an operation of the locking member 204 in the electronic device according to various embodiments of the present disclosure.

Referring to FIGS. 15, 16, and 17, the locking member 204 may include, for example, a pair of reciprocating members 241a and 241b engaged or arranged so that the reciprocating members 241a and 241b may advance to or recede from each other. The reciprocating members 241a and 241b may be arranged in a space 227 and advance to or recede from each other on a hinge member 221. The locking member 204 may further include an elastic member 243, and a ball 245 at an end of each of the reciprocating members 241a and 241b. The elastic member 243 may partially surround, for example, the reciprocating members 241a and 241b and provide an elastic force to the reciprocating members 241a and 241b so that end portions of the reciprocating members 241a and 241b may recede from each other. When the locking member 204 is disposed in the space 227, each of the balls 245 may be interposed between the end portion of the reciprocating member 241a or 241b and a support rib 223. In an embodiment, a part of the ball 245 may be accommodated in a hole formed in the support rib 223, and the other part of the ball 245 may be disposed in a second space G formed in the other portion of the support rib 223, for example, a space in which a part of the second link member 237 is accommodated.

In an embodiment, each of the reciprocating members 241a and 241b may further include an accommodation recess 247 formed on an end portion thereof. The accommodation recess 247 may be formed to accommodate, for example, a part of the support rib 223, thereby preventing the locking member 204 from slipping off from the space 227. In another example, an engagement recess may be formed in the accommodation recess 247, for engaging with the other part of the ball 245. For example, as a part of the ball 245 is engaged in the hole formed in the support rib 223 and the other part of the ball 245 is engaged with the engagement recess, slip-off of the locking member 204 from the space 227 may be prevented. Although the other part of the ball 245 protrudes into the space G, the hole formed in the support rib 223 may maintain the ball 245 to be supported by one end of the reciprocating member 241a or 241b.

According to various embodiments, the second link member 237 may move with respect to the hinge member in which the locking member 204 is disposed. For example, when the hinge member with the locking member 204 moves relative to the hinge member with the second link member 237, the second link member 237 may move with respect to the locking member 204. Along with the movement of the second link member 237, a part of the ball 245 (for example, the part of the ball 245 protruding into the second space G) may rub against one surface of the second link member 237. In an embodiment, a first locking recess(s) 237a and 237b may be formed and arranged on one surface of the second link member 237, along a rubbing trajectory of the part of the ball 245, as described later with reference to FIG. 20. When the ball 245 is engaged with one of the first locking recesses 237a and 237b during a relative movement between the hinge members 221, the hinge members 221 may discontinue the relative movements or may be kept stationary. In an embodiment, even though the first locking recesses 237a and 237b are not formed, static frictional force between the ball 245 and the second link member 237 may keep the hinge members 221 stationary.

Figure 18:
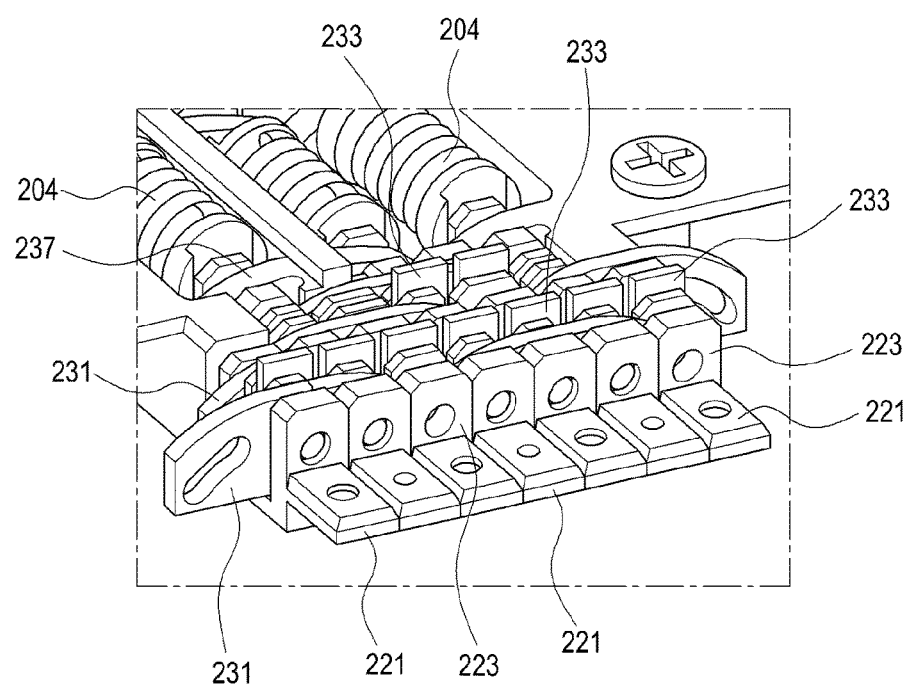
FIG. 18 is a perspective view illustrating an enlarged part of the connection unit in the electronic device according to various embodiments of the present disclosure.
Figure 19:
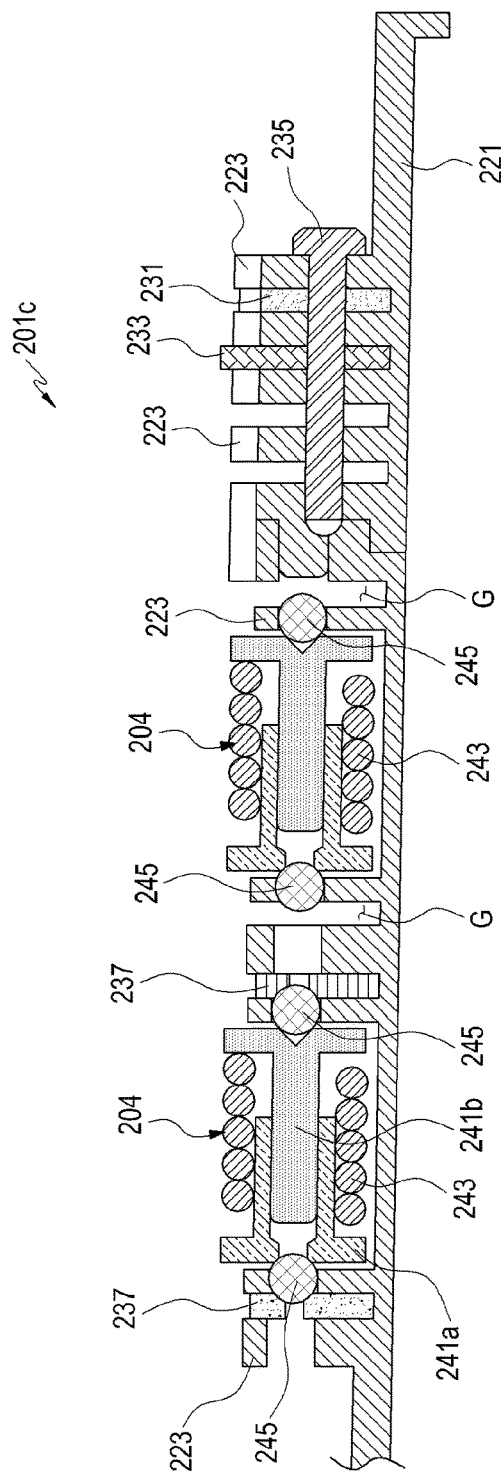
FIG. 19 is a sectional view illustrating a cut part of the connection unit in the electronic device according to various embodiments of the present disclosure.

FIG. 18 is a perspective view illustrating an enlarged part of the connection unit 201c in the electronic device according to various embodiments of the present disclosure, and FIG. 19 is a sectional view illustrating a cut part of the connection unit 201c in the electronic device according to various embodiments of the present disclosure.

Referring to FIGS. 18 and 19, a section in which the hinge members 221 are engaged with each other by means of the first link members 231 so that the hinge members 221 may make a relative movement with respect to each other may be adjacent to a section in which the locking members 204 are arranged, in the connection unit 201c. According to various embodiments, while the hinge members 221 are moving relative to each other, the locking device structure using the locking members 204 may hold the relative movements at a predetermined angle position. For example, the locking device structure using the locking members 204 may maintain the second part 101b inclined at a user-intended angle with respect to the first part 101a in the folding operation of the housing (for example, the housing 101 illustrated in FIG. 4). In an embodiment, the section in which the first link members 231 are arranged and the section in which the locking members 204 are arranged may be positioned at both ends of the connection unit 201c, for example, at both ends of the connection unit 201c along the fifth direction D5 illustrated in FIG. 4. According to an embodiment, a wiring area may be provided between the section in which the locking members 204 are arranged at one end (or one end portion) of the connection unit 201c and the section in which the locking members 204 are arranged. An FPCB and the like, for connecting circuit devices arranged in the first part 101a and the second part 101b with each other may be arranged in the wiring area.

Figure 20:
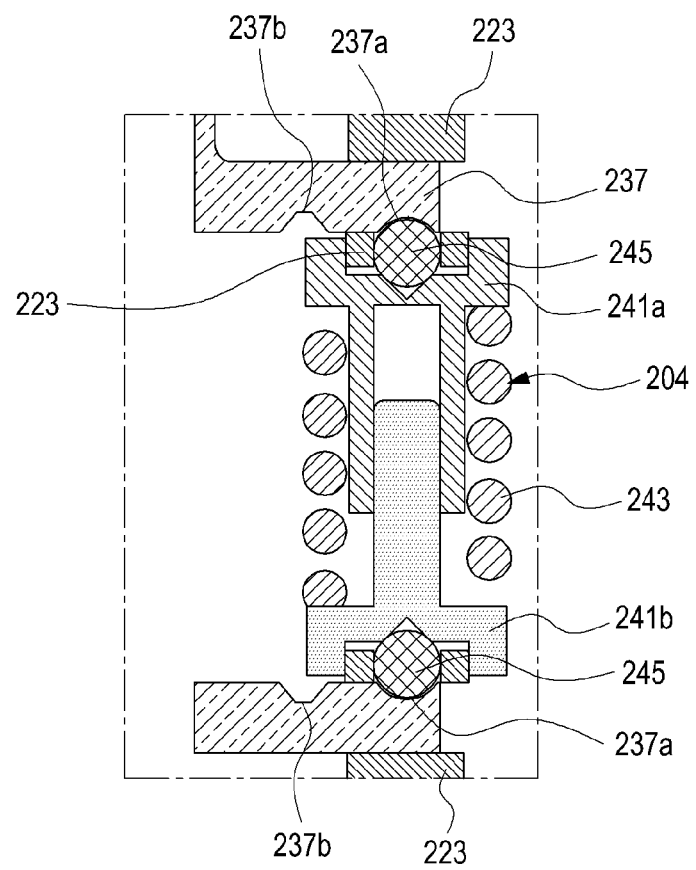
FIG. 20 is a sectional view illustrating the locking device structure of the connection unit in the electronic device according to various embodiments of the present disclosure.
Figure 21:
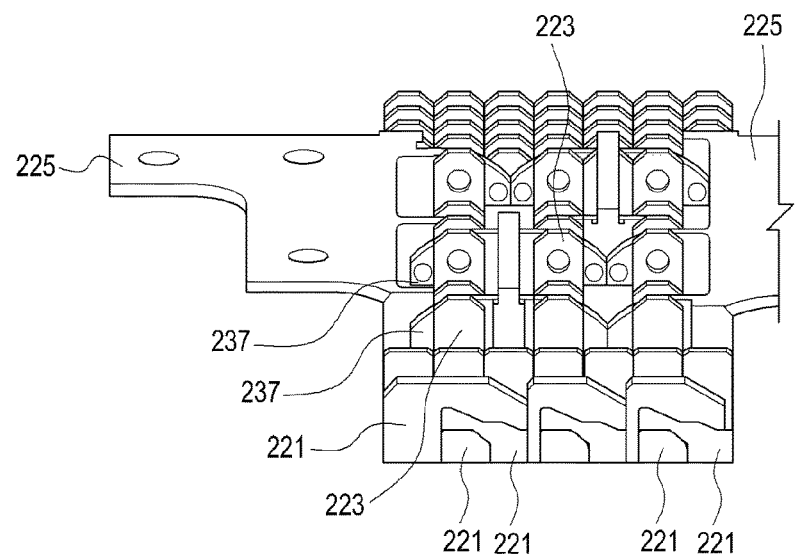
FIGS. 21 and 22 are views illustrating relative movements of hinge members in the electronic device according to various embodiments of the present disclosure.
Figure 22:
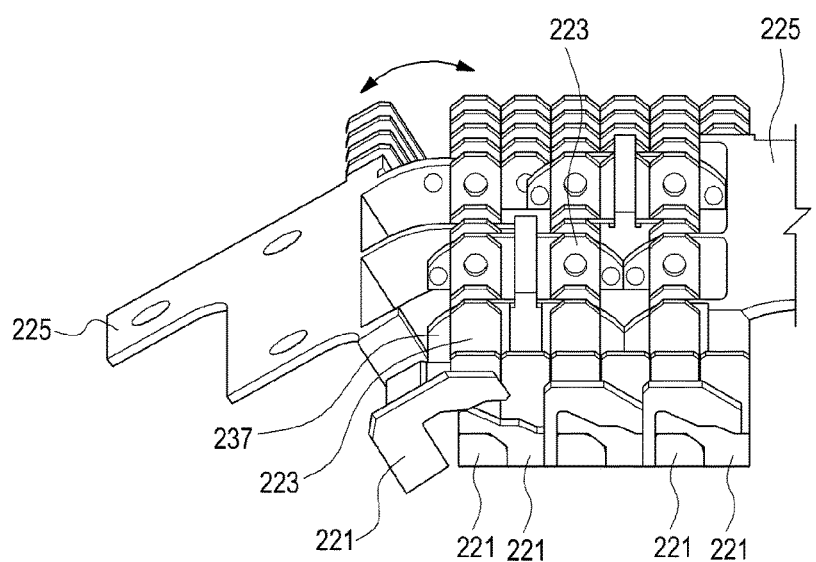

FIG. 20 is a sectional view illustrating the locking device structure of the connection unit in the electronic device according to various embodiments of the present disclosure. FIGS. 21 and 22 are views illustrating a relative movement between the hinge members 221 in the electronic device according to various embodiments of the present disclosure.

Referring to FIGS. 20, 21, and 22, a plurality of first locking recesses 237a and 237b may be formed in the second link member 237. For example, the first locking recesses 237a and 237b may be formed and arranged so that a ball 245 may be engaged with the first locking recesses 237a and 237b in a folded position of the housing 101 and in an unfolded position of the housing 101. In an embodiment, a part of the hinge members 221 may be positioned to form a flat surface with respect to each other, and the other part of the hinge members 221 may be positioned to be inclined to each other. For example, each ball 245 may be engaged with a first locking recess 237a or 237b corresponding to the ball 245 according to the relative position of each hinge member 221, thereby providing static force. In another embodiment, the balls 245 may closely contact one surface of the second link member 237 without engaging with the first locking recesses 237a and 237b according to the relative angle positions of the hinge members 221.

Figure 23:
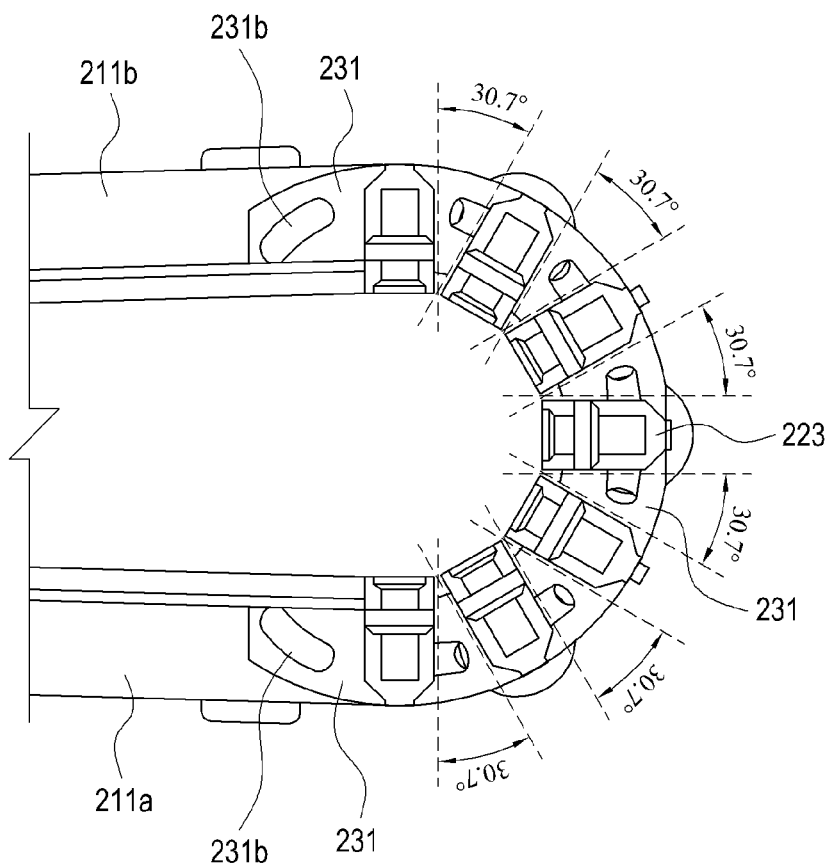
FIG. 23 is a sectional view illustrating the connection unit in the folded state in the electronic device according to various embodiments of the present disclosure.

FIG. 23 is a sectional view illustrating a folded state of the connection unit 201c in the electronic device according to various embodiments of the present disclosure.

Referring to FIG. 23, in the state where the electronic device (for example, the electronic device 100 illustrated in FIG. 3 or FIG. 6) is folded, the connection unit 201c may be bent to the shape of alphabet letter 'C' or 'U' In the bent state of the connection unit 201c, the support ribs 223 formed on each of hinge members (for example, the hinge members 221 illustrated in FIG. 8) may be inclined at about 30 degrees to the support ribs 223 formed on an adjacent hinge member 221. An angle range in which the hinge members 221 move relative to each other, for example, an angle range in which each support rib 223 is inclined to another adjacent support rib 223 may be restricted by engagement between guide holes 231b and guide pins (for example, the guide pins 235 in FIG. 12). The case members 211a and 211b engaged to be movable relative to each other by means of the connection unit 201c may form parts of first and second parts (the first part 101a and the second part 101b in FIG. 4) of the afore-described housing (for example, the housing 101 in FIG. 4). In the state where the connection unit 201c is folded or bent, end portions of the case members 211a and 211b (for example, end portions engaged with the connection unit 201c) may be apart from each other. In an embodiment, in the state where the connection unit 201c is folded or bent, the other end portions of the case members 211a and 211b may contact each other or may be closer to each other than the engaged end portions of the case members 211a and 211b. For example, each hinge member of the connection unit 201c (each hinge member 221 in FIG. 18) may move relative to an adjacent hinge member in a range of 30 or more degrees (for example, 30.7 degrees).

As described above, the connection unit of the electronic device according to various embodiments of the present disclosure may maintain its overall curvature (or curvature radius) at a predetermined value by limiting an angle range in which each hinge member makes a movement relative to its adjacent hinge member. For example, even when the electronic device is folded, excessive deformation of the flexible display may be prevented.

Figure 24:
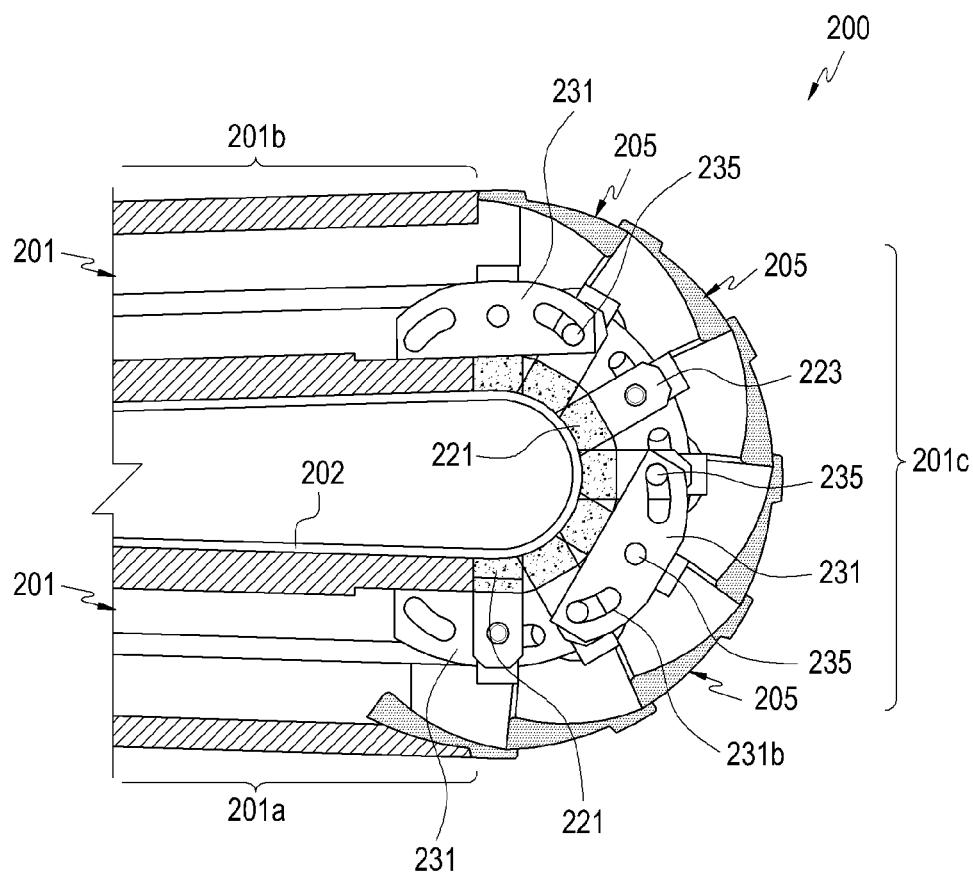
FIG. 24 is a sectional view illustrating an electronic device in a folded state according to various embodiments of the present disclosure.

FIG. 24 is a sectional view illustrating a folded state of an electronic device 200 according to various embodiments of the present disclosure.

Referring to FIG. 24, in the state where the electronic device 200 is folded, the outer surface of the connection unit 201c may be a continuing curved surface. For example, the connection unit 201c may include a plurality of cover members 205, and the cover members 205 may form the outer surface (for example, the sixth surface F6 in FIG. 5) of the connection unit 201c. According to an embodiment, in the state where the electronic device 200, for example, a housing 201 is unfolded, each cover member 205 may overlap partially with its adjacent cover member 205, and a part of the outer surfaces of the cover members 205 may form a flat surface as the outer surface of the connection unit 201c. In the state where the electronic device 200, for example, the housing 201 is folded, the cover members 205 may be arranged, forming a curved surface as the outer surface of the connection unit 201c. In the state where the housing 201 is unfolded or folded, the cover members 205 may form a continuing flat or curved surface, thereby isolating the inner space of the connection unit 201c from the outer space of the connection unit 201c. The structure of the cover members 205 will be described later in greater detail with reference to FIG. 42.

According to various embodiments, the connection unit 201c may provide a wiring area for electrically connecting circuit devices disposed in the first part 201a and the second part 201b of the housing 201. For example, a space of a certain area may be formed between the hinge members 221 and the cover members 205 in the connection unit 201c, and an FPCB or the like may be arranged in the space.

In an embodiment, the connection unit 201c may include a first link member(s) 231 for connecting three sequential hinge members 221. When three hinge members 221 are connected to each other, the first link member 231 may include two guide holes 231b. A guide pin 235 may penetrate through each of the guide holes 231b, and the guide holes 231b and the guide pins 235 may restrict an angle range in which two adjacent hinge members 221 make a relative movement with respect to each other. For example, as illustrated in FIG. 24, in the folded state of the electronic device 200, guide pins 235 engaged with one first link member 231 may be farthest from each other in guide holes 231b corresponding to the guide pins 235. In the unfolded state of the electronic device 200, the guide pins 235 engaged with the first link member 231 may be closest to each other in the guide holes 231b corresponding to the guide pins 235. For example, the guide pins 235 may move within the trajectories of the guide holes 231b, and this structure may restrict an angle range in which each of the hinge members 221 makes a movement relative to an adjacent hinge member.

As described above, in the electronic device according to various embodiments of the present disclosure, the connection unit may keep its curvature at a predetermined value in the folded state of the housing by engaging a plurality of hinge members in such a manner that the hinge members may make a relative movement with respect to each other within a predetermined angle range. For example, damage to the display may be prevented by preventing excessive deformation of the display. Further, the electronic device according to various embodiments may provide static frictional force or static force by means of the locking device structure including locking members in the state where the hinge members have made relative movements to be inclined with respect to each other. For example, the second part of the housing may be stably maintained inclined at a predetermined angle with respect to the first part of the housing. Accordingly, a user may use the electronic device, while bending the housing at an intended angle and/or a convenient-to-use angle. In another embodiment, the housing may be folded with the first surface facing the third surface in the electronic device according to various embodiments of the present disclosure, which makes it convenient to carry the electronic device.

Figure 25:
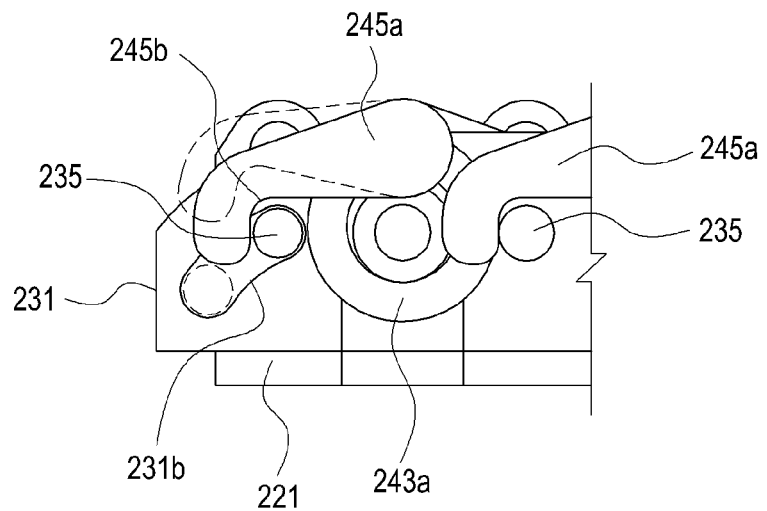
FIGS. 25, 26, and 27 are views illustrating modification examples of the locking device structure of the connection unit in the electronic device according to various embodiments of the present disclosure.
Figure 26:
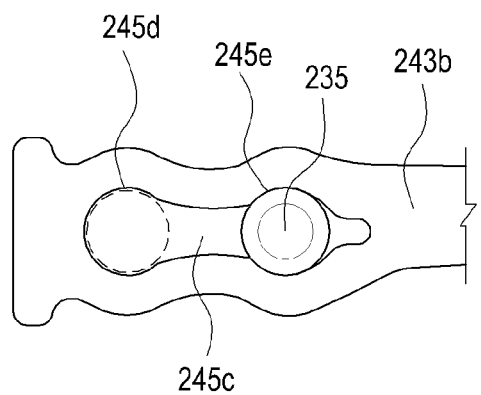
Figure 27:
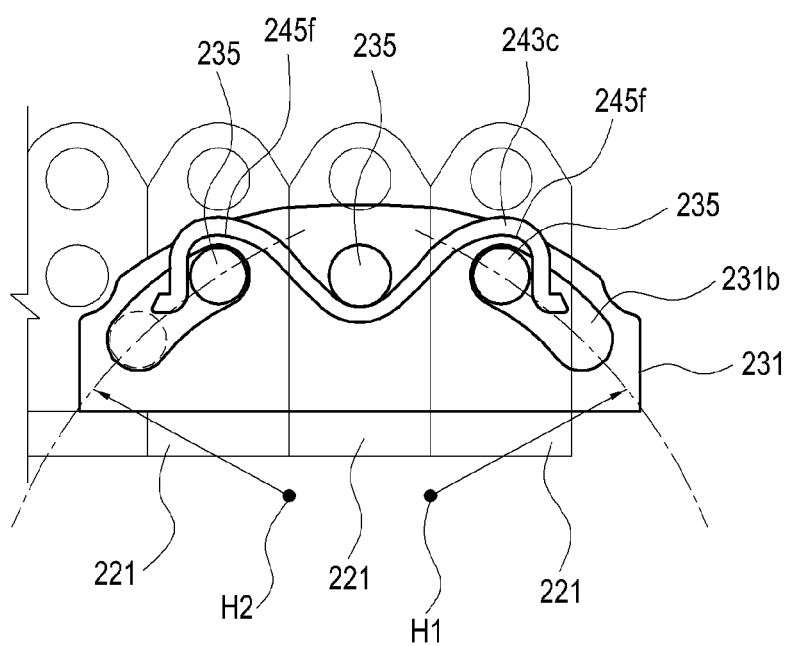

FIGS. 25, 26, and 27 are views illustrating modification examples of the locking device structure of the connection unit in the electronic device according to various embodiments of the present disclosure.

The locking device structure using locking members as described with reference to FIG. 15 and etc. may keep hinge members (for example, the hinge members 221 in FIG. 15) in a stable stationary state at a predetermined angle position. The structure of the locking device may be modified in various manners.

Referring to FIG. 25, the locking device structure may include a hook 245a including at least one locking recess 247 in which a guide pin 235 is mounted, and an elastic member 243a for pressing the hook 245a in a predetermined direction. The hook 245a may be installed to the connection unit, for example, a hinge member (for example, a hinge member 221 in FIG. 14) so that the hook 245a may make a relative movement on the hinge member, and may receive an elastic force applied in a direction so as to press the guide pin 235, from the elastic member 243a. For example, the elastic member 243a may be a torsion coil spring. As the hook 245a presses the guide pin 235, the guide pin 235 may be forced to stop at a position in which the guide pin 235 is mounted in a second locking recess 245b within the guide hole 231b or at a position in which the guide pin 235 is removed from the hook 2345a. While an end portion of the hook 245a is shaped so that it may be caught in the middle of the guide hole 231b by way of example in the embodiment, the present disclosure is not limited thereto. For example, the hook 245a may be shaped to have a size enough to be caught across the whole guide hole 231b. When the hook 245a is large enough to be caught across the whole guide hole 231b, a plurality of second locking recesses 245b may be formed, in which guide pins 235 are mounted.

Referring to FIG. 26, the locking device structure may include an elastic member, for example, a clip spring 243b for pressing the outer surface of a guide pin 235 from both directions. The clip spring 243b may include a second guide hole 245c having a trajectory in which the guide pin 235 may move, and the second guide hole 245c may include a plurality of second locking recesses 245d and 245e in which the guide pin 235 may be mounted. According to various embodiments, the second guide hole 245c may be formed in correspondence with a guide hole 231b of a first link member 231 described above.

Referring to FIG. 27, the locking device structure may include a plate spring 243c. According to an embodiment, the plate spring 243c is shaped into alphabet letter 'M' or 'W' on the whole, and may press guide pins 235 engaged in the guide holes 231b of a first link member 231, while being supported by a guide pin 235 engaged with the fixing hole of the first link member 231. For example, each of different parts of the plate spring 243c may interfere or overlap with one of the guide holes 231b, thereby pressing the outer surface of the guide pin 235 engaged with the guide hole 231b. According to various embodiments, the plate spring 243c may include a second locking recess(s) 245f in a part in which the plate spring 243c overlaps with the guide hole 231b. When the guide pin 235 is mounted in the second locking recess 245f, a relative movement between two adjacent hinge members may be restricted.

According to an embodiment, the guide hole (for example, the guide hole 231b in FIG. 12) may be formed along a trajectory in which the guide pin 235 moves when the hinge member(s) 221 makes a relative movement. Each of the hinge members 221 may move or rotate relatively upon a different pivot axis H1 or H2. The pivot axes H1 and H2 may be positioned apart from the hinge members 221, for example, under the hinge members 221 in FIG. 27. As the pivot axes H1 and H2 are apart from the corresponding hinge members 221, the hinge members 221 may make a relative movement with respect to their adjacent hinge members, apart by a predetermined spacing.

Figure 28:
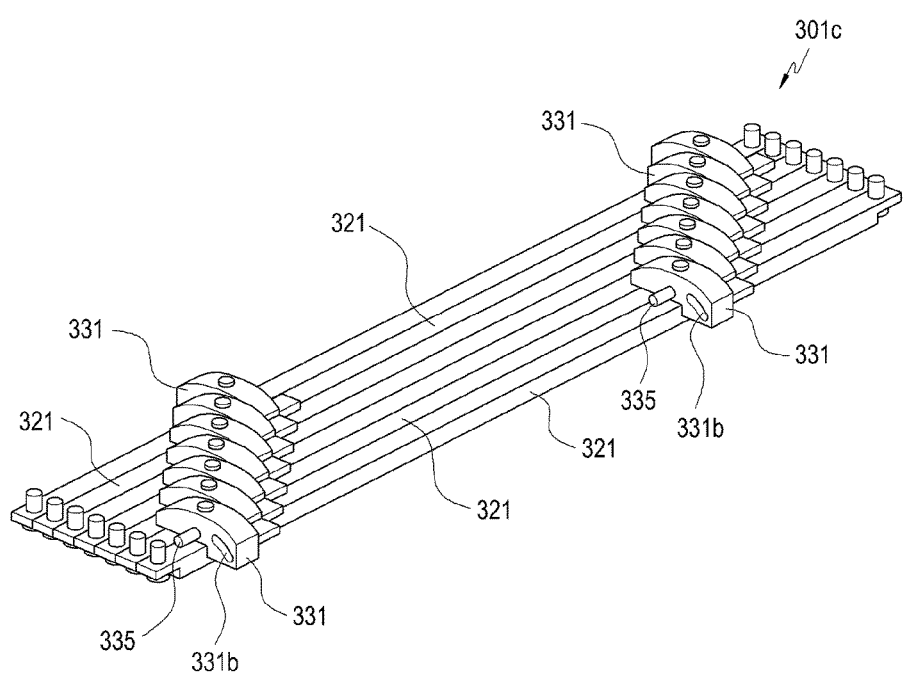
FIG. 28 is a perspective view illustrating a modification example of the connection unit in the electronic device according to various embodiments of the present disclosure.
Figure 29:
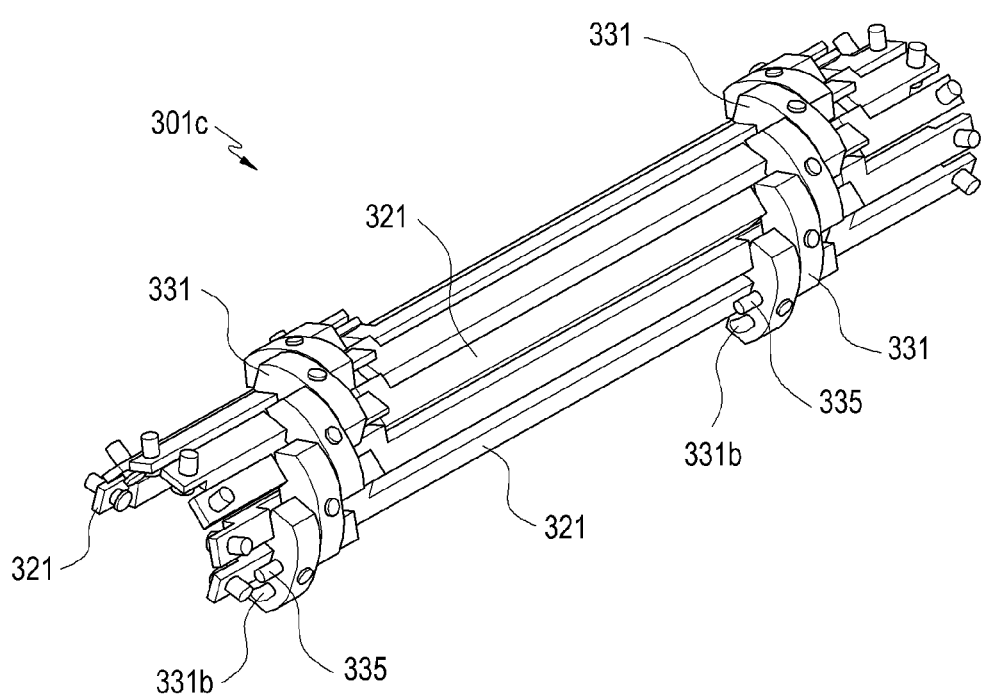
FIG. 29 is a perspective view illustrating the folded state of a modification example of the connection unit in the electronic device according to various embodiments of the present disclosure.

FIG. 28 is a perspective view illustrating a modified connection unit 301c in the electronic device according to various embodiments of the present disclosure, and FIG. 29 is a perspective view illustrating a folded state of the modified connection unit 301c in the electronic device according to various embodiments of the present disclosure.

Referring to FIGS. 28 and 29, the connection unit 301c may include a plurality of hinge members 321 and link members 331 for connecting and engaging the hinge members 321 to each other in a manner that enables a relative movement between the hinge members 321.

The hinge members 321 may be extended along one direction (for example, in the fifth direction D5 in FIG. 4), arranged along a direction perpendicular to the one direction (for example, in the sixth direction D6 in FIG. 4), thereby forming a fifth surface (for example, the fifth surface F5 in FIG. 4) of the afore-described housing. Each of the link members 331 may include a guide pin 335 and a guide hole 331b, and may be installed to a hinge member 321. In an embodiment, a guide pin 335 formed in one of the link members 331 may be accommodated in the guide hole 331b of an adjacent link member 331, thereby guiding relative movements of hinge members 321 with respect to each other. For example, as the hinge members 321 make relative movements with respect to each other, the connection unit 301c may be bent from a flat shape (for example, as illustrated in FIG. 28) to a curved shape (for example, as illustrated in FIG. 29).

While the hinge members 321 are making relative movements with respect to each other, the guide pins 335 may move along the guide holes 331b. According to an embodiment, as the foregoing locking device structure, for example, the locking member 204 of FIG. 16, the hook 245a and the torsion coil spring 243a of FIG. 25, the clip spring 243 of FIG. 26, or the plate spring 243c of FIG. 27 is provided, the relative movements of the hinge members 321 may be limited according to their angle positions.

Figure 30:
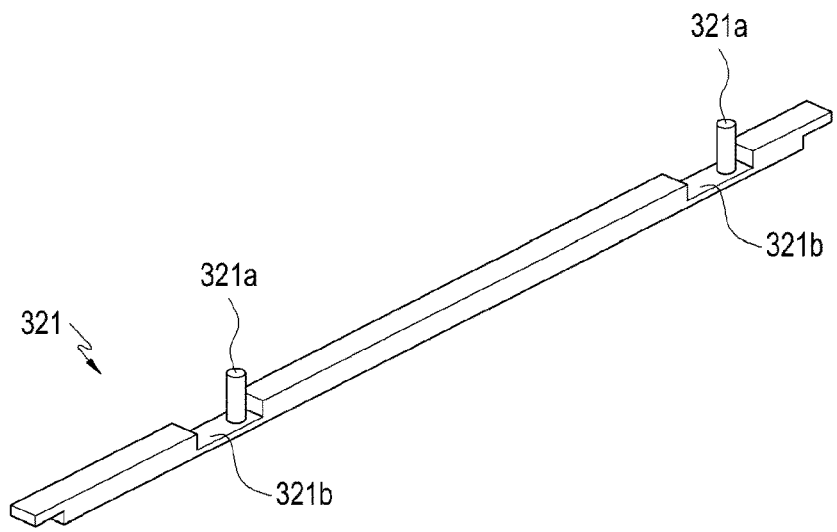
FIG. 30 is a perspective view illustrating a hinge member in the modification example of the connection unit in the electronic device according to various embodiments of the present disclosure.
Figure 31:
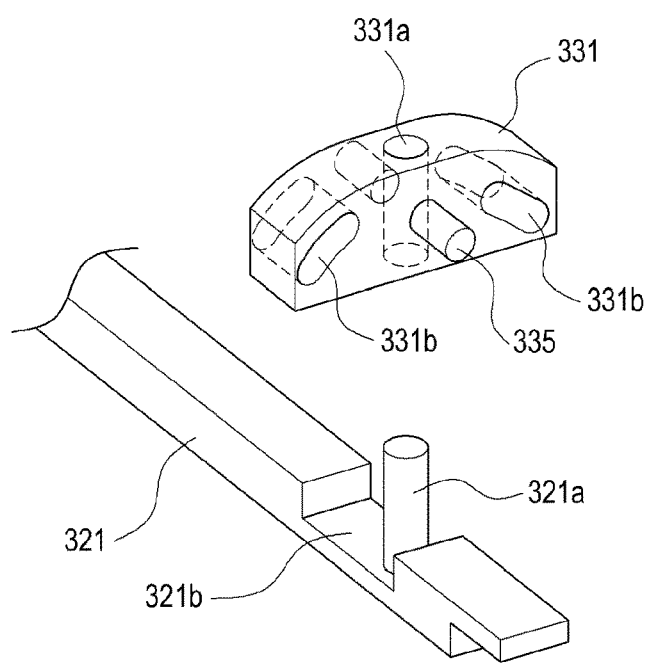
FIG. 31 is an exploded perspective view illustrating a hinge member and a link member which are engaged with each other in the modification example of the connection unit in the electronic device according to various embodiments of the present disclosure.

FIG. 30 is a perspective view illustrating a hinge member 321 in the modification example of the connection unit in the electronic device according to various embodiments of the present disclosure, and FIG. 31 is an exploded perspective view illustrating engagement between a hinge member 321 and a link member 331 in the modification example of the connection unit in the electronic device according to various embodiments of the present disclosure.

Referring to FIGS. 30 and 31, the hinge member 321 may be extended in one direction, including a fixing pin 321a and a mounting recess 321b. The mounting recess 321b may be formed, for example, on one surface of the hinge member 321, and the fixing pin 321a may protrude from the mounting recess 321b. In an embodiment, the mounting recess 321b may not be necessarily formed. However, the mounting recess 321b may enable more stable mounting of a link member 331 and facilitate alignment between the link member 331 and an adjacent link member 331.

The link member 331 may include a fixing hole 331a penetrating through the top and bottom surfaces of the link member 331, a guide hole 331b formed on at least one surface of the link member 331, and a guide pin 335 formed on one surface of the link member 331. With the fixing pin 321a inserted into the fixing hole 331a, the link member 331 may be mounted in the mounting recess 321b.

In an embodiment, an end portion of the fixing pin 321a may protrude from the top surface of the link member 331. With the end portion of the fixing pin 321a protruding from the top surface of the link member 331, the link member 331 may be fixed to the hinge member 321 by caulking. In another embodiment, the link member 331 may be fixed to the hinge member 321 by welding, adhesion, or the like. With a link member 331 with a guide pin 335 inserted into a guide hole of an adjacent link member 331, which is mounted on each hinge member 321, the hinge member 321 may be engaged with an adjacent hinge member 321. According to various embodiments, the guide hole 331b may penetrate through both surfaces of the link member 331. In an embodiment, the guide hole 331b may be open only from one surface of the link member 331. In this case, the guide hole 331b may be formed on the other surface of the link member 331 than the surface of the link member 331 on which the guide pin 335 is formed. According to various embodiments, guide holes 331b may be formed at both sides of at least one surface of the link member 331. When guide holes 331b may be formed at both sides of at least one surface of the link member 331, the guide holes 331b may be arranged so that they may be substantially symmetrical to each other.

Figure 32:
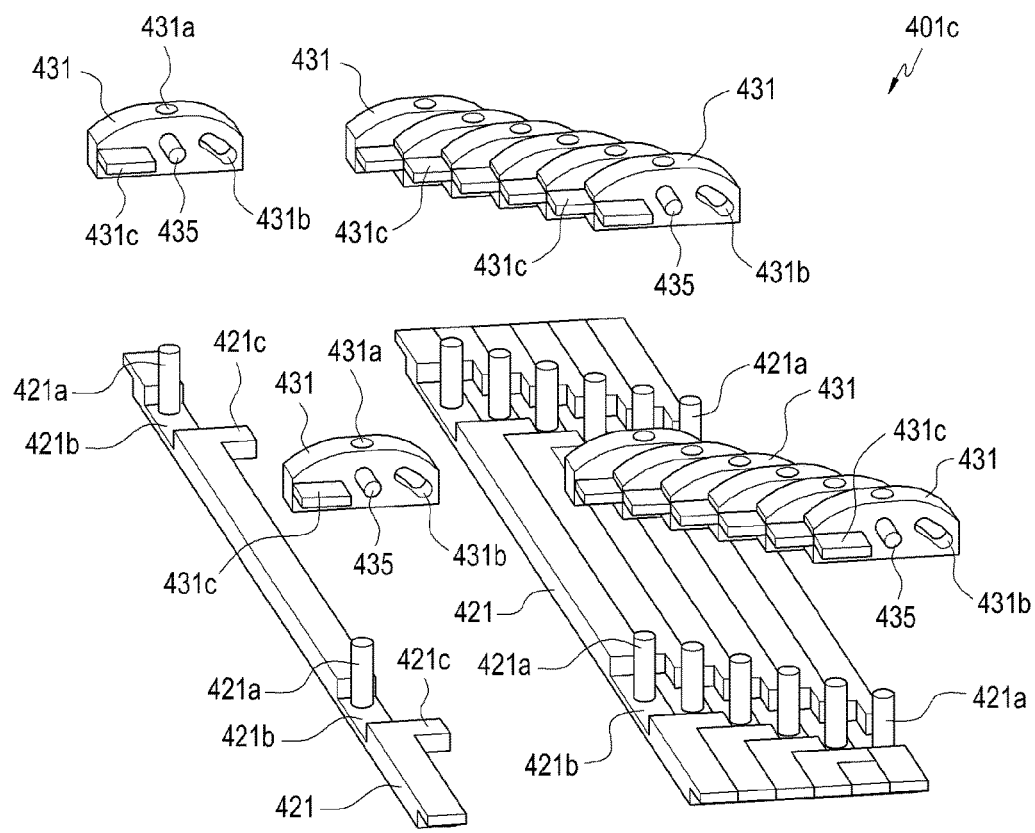
FIG. 32 is an exploded perspective view illustrating another modification example of the connection unit in the electronic device according to various embodiments of the present disclosure.
Figure 33:
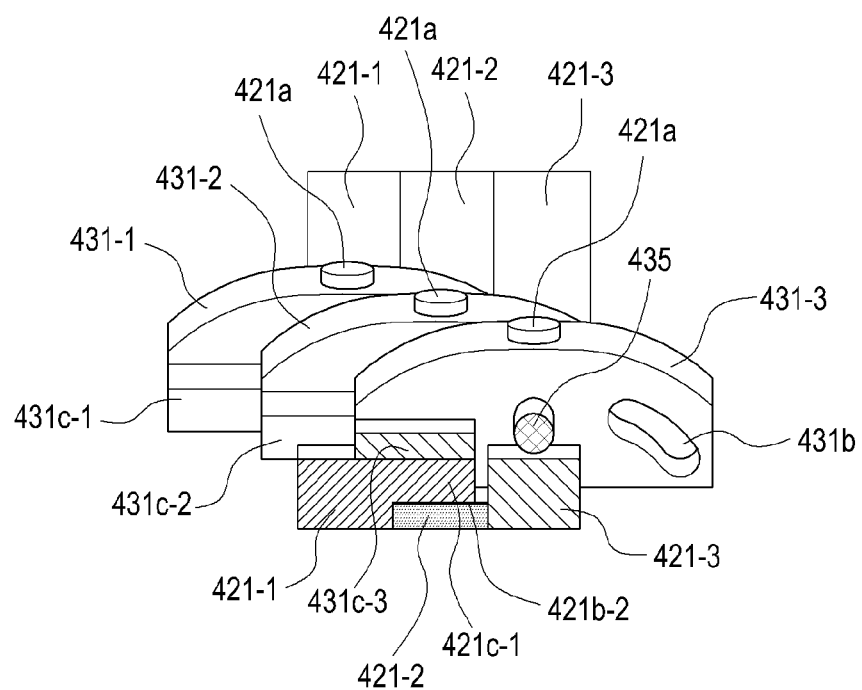
FIG. 33 is a view illustrating a rotation regulator in another modification example of the connection unit in the electronic device according to various embodiments of the present disclosure.

FIG. 32 is an exploded perspective view illustrating another modification example 401c of the connection unit in the electronic device according to various embodiments of the present disclosure, and FIG. 33 is a view illustrating a rotation regulator in the modification example 401c of the connection unit in the electronic device according to various embodiments of the present disclosure.

Referring to FIGS. 32 and 33, the connection unit 401c may include a plurality of hinge members 421 and link members 431 installed to the respective hinge members 421. Each of the link members 431 may connect and engage at least two adjacent hinge members 421 with each other in a manner that enables relative movements of the hinge members 421 with respect to each other.

Each of the hinge members 421 may be extended along one direction, and include a mounting recess 421b formed on one surface of the hinge member 421 and a fixing pin 421a protruding from the mounting recess 421b. Each of the link members 431 may include a guide pin 435 formed on one surface thereof, a fixing hole 431a penetrating through the top and bottom surfaces thereof, and a guide hole 431b formed on at least one surface thereof. With the fixing pin 421a inserted into the fixing hole 431a, the link member 431 may be mounted and fixed to the mounting recess 421b. In the state where a link member 431 is installed to each hinge member 421, the hinge member 421 may be engaged with an adjacent hinge member, with the guide pin 435 of the link member 431 inserted into the guide hole of an adjacent link member 431.

According to various embodiments, the guide hole 431b may penetrate through both surfaces of the link member 431. In an embodiment, the guide hole 431b may be open only from one surface of the link member 431. In this case, the guide hole 431b may be formed on the other surface of the link member 431 than the surface of the link member 431 on which the guide pin 435 is formed. According to various embodiments, guide holes 431b may be formed at both sides of at least one surface of the link member 431. When guide holes 431b may be formed at both sides of at least one surface of the link member 431, the guide holes 431b may be arranged to be substantially symmetrical to each other.

Additionally, while hinge members or link members are denoted by reference numerals in the form of 'XXX' in a detailed description of the embodiment, reference numerals in the form of 'XXX-1', 'XXX-2', or the like may be used to further differentiate the hinge members or the link members.

According to various embodiments, the connection unit 401c may include at least one rotation regulator provided for three sequential hinge members randomly selected from among the hinge members 431. As mentioned before, a first hinge member out of three hinge members randomly selected at a first position may be a second or third hinge member out of three hinge members selected at a different position. Likewise, a second hinge member out of the three hinge members randomly selected at the first position may be a first or third hinge member out of the three hinge members selected at the different position. For example, the rotation regulator as described below is provided on three sequentially arranged hinge members. When the connection unit 401c includes four or more hinge members, the rotation regulator may be provided repeatedly on the connection unit 401c.

According to various embodiments, the rotation regulator may include an interference member 421c and 421c-1, an avoidance recess 421b-2, and/or a restraining member 431c and 431c-1. For example, the interference member 421c and 421c-1 may protrude in a side direction (for example, the sixth direction D6 in FIG. 4) from a first hinge member 421-1 out of three selected (and/or sequentially arranged) hinge members 421. The avoidance recess 421b-2 may be formed on a second hinge member 421-2 adjacent to the first hinge member 421-1 among the three hinge members 421. For example, as the second hinge member 421-2 moves relative to the first hinge member 421-1, the interference member 421c-1 may be accommodated in the avoidance recess 421b-2 or removed from the avoidance recess 421b-2. In an embodiment, the avoidance recess 421b-2 may be a part of a mounting recess 421b. For example, the link member 431 may be mounted in a partial area of the mounting recess 421b, and the remaining area of the mounting recess 421b may be provided as the avoidance recess 421b-2. The restraining member 431c and 431c-3 may protrude from a third hinge member 421-3 arranged in parallel with the first hinge member 421-1 with the second hinge member 421-2 in between among the three hinge members 421. The restraining member 431c-3 may protrude, for example, in a direction toward the first hinge member 421-1, for example, in the direction opposite to the direction in which an interference member 421c-1 protrudes (for example, the reverse direction of the sixth direction D6 in FIG. 4).

In an embodiment, the restraining member 431c-3 may be formed on the link member 431-3. For example, the restraining member 431c-3 is disposed fixedly with respect to the third hinge member 421-3, and the link member 431-3 is mounted and fixed to the third hinge member 421-3. Therefore, the restraining member 431c-3 may be formed on the link member 431-3 and fixed on the third hinge member 421-3. As described below, the restraining member 431c-3 may be formed on the third hinge member 421-3.

In another embodiment, at least a part of a plurality of hinge members 421 in the connection unit 421 may include all of the interference member 421c, the avoidance recess 421b-2, and the restraining member 431c. For example, when the connection unit 401c includes 7 hinge members 421, a central hinge member 421 may include the interference member 421c, the avoidance recess (for example, a part of the mounting recess 421b or the avoidance recess 421b-2), and the restraining member 431c. In another embodiment, the leftmost hinge member 421 (or link member 431) illustrated in FIG. 32 may not include the restraining member 431c. In another embodiment, the rightmost hinge member 421 illustrated in FIG. 32 may not include the interference member 421c. In the electronic device according to various embodiments of the present disclosure, the rotation regulator may be formed and disposed appropriately in consideration of the number and positions of the hinge members 421 in the above manner.

According to various embodiments, when the three hinge members 421 are positioned, forming a flat surface, for example, the housing 101 of FIG. 4 is unfolded, the interference member 421c may be accommodated in the avoidance recess (for example, a part of the mounting recess 421b or the avoidance recess 421b-2), and the restraining member 431c may restrain the interference member 421c in the avoidance recess 421b-2. For example, in the state where the housing (for example, the housing 101 of FIG. 4) is unfolded, the first and second hinge members 421-1 and 421-2 cannot make relative movements with respect to each other, and after making a relative movement earlier than the second hinge member 421-2 (for example, the restraining state made by the restraining member 431c is released), the third hinge member 421-3 may transition the first and second hinge members 421-1 and 421-2 to a state in which the first and second hinge members 421-1 and 421-2 may make a relative movement with respect to each other. With reference to FIGS. 34 to 37, an operation of this rotation regulator will be described below in greater detail.

Figure 34:
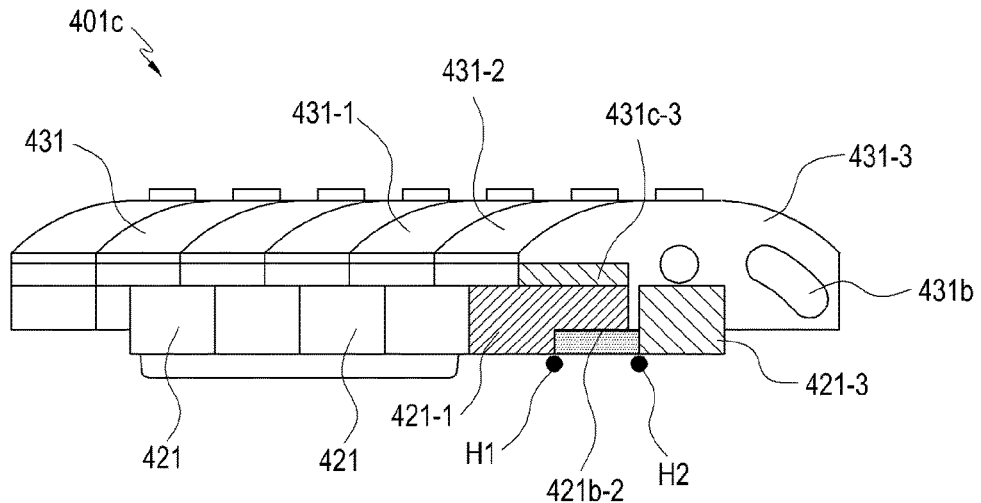
FIGS. 34 and 35 are views illustrating an operation of the rotation regulator in another modification example of the connection unit in the electronic device according to various embodiments of the present disclosure.
Figure 35:
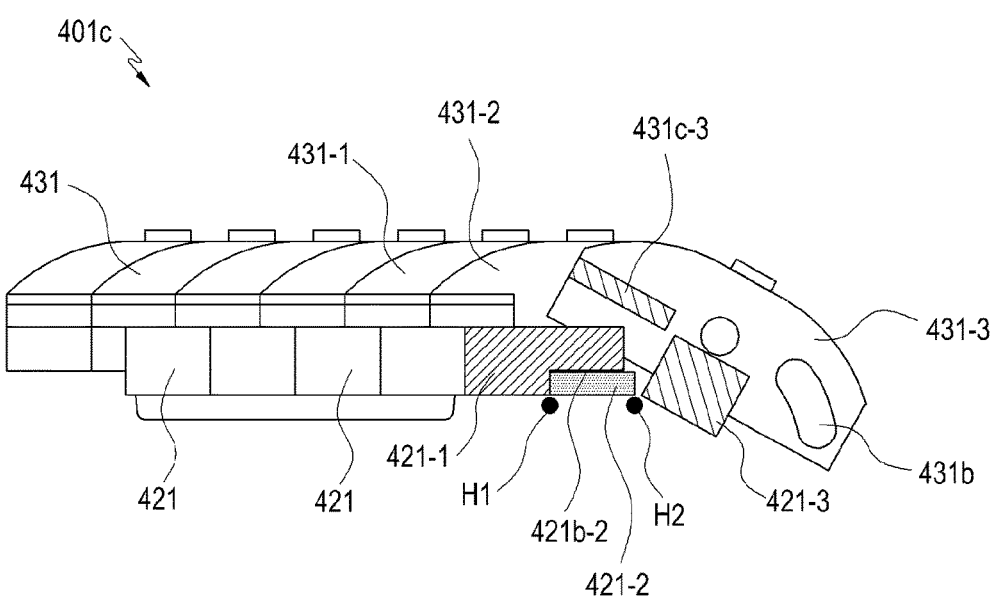

FIGS. 34 and 35 are views illustrating an operation of the rotation regulator in the modification example 401c of the connection unit in the electronic device according to various embodiments of the present disclosure.

For example, the unfolded housing (for example, the housing 101 of FIG. 4) is folded in FIGS. 34 and 35.

Referring to FIG. 34, the interference member 421c-1 of the first hinge member 421-1 may be accommodated in the avoidance recess 421b-2 of the second hinge member 421-2, and the restraining member 431c-3 of the third hinge member 421-3 may be positioned on the interference member 421c-1, thereby restraining the interference member 421c-1 in the avoidance recess 421b-2. In this state, the second hinge member 42-1 cannot make a movement relative to the first hinge member 421-1. For example, since the interference member 421c-1 cannot move out of the avoidance recess 421b-2, the movement of the second hinge member 421-2 relative to the first hinge member 421-1 may be restricted. On the other hand, the third hinge member 421-3 may move relative to the second hinge member 421-2 at any time. However, as mentioned before, the connection unit 401c may include a locking device structure using locking members (for example, the locking members 204 in FIG. 15), the third hinge member 421-3 may need a certain external force (for example, user manipulation) in moving relative to the second hinge member 421-2.

Referring to FIG. 35, when the third hinge member 421-3 makes a relative movement upon its pivot axis (for example, the pivot axis H2) or with respect to the second hinge member 421-2, the interference member 421c-1 is released from the restraining state, and the second hinge member 421-2 is transitioned to a state in which the second hinge member 421-2 is capable of moving relative to the first hinge member 421-1. For example, after the third hinge member 421-3 first moves relative to the second hinge member 421-2, the second hinge member 421-2 may move relative to the first hinge member 421-1. In this manner, the rotation regulator of the electronic device (and/or the connection unit) according to various embodiments of the present disclosure may allow sequential relative movements, for example, starting with the rightmost hinge member among the hinge members 421 illustrated in FIG. 34 or FIG. 35.

Figure 36:
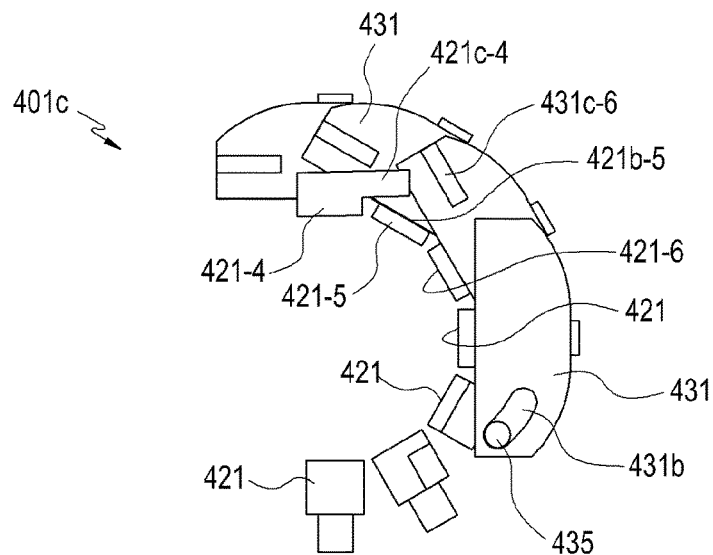
FIGS. 36 and 37 are views illustrating another operation of the rotation regulator in another modification example of the connection unit in the electronic device according to various embodiments of the present disclosure.
Figure 37:
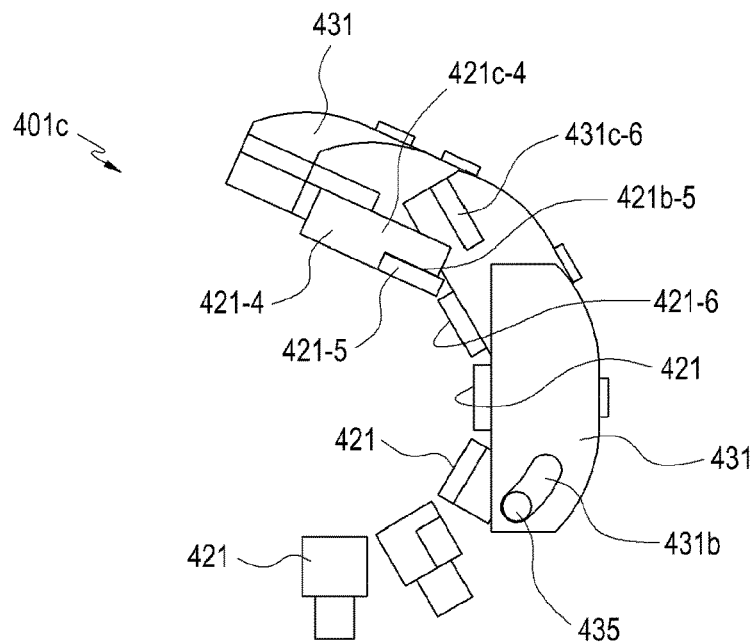

FIGS. 36 and 37 are views illustrating another operation of the rotation regulator in the modification example 401c of the connection unit in the electronic device according to various embodiments of the present disclosure.

Compared to the folding operation of the housing (for example, the housing 101 of FIG. 4) in the electronic device in the embodiment illustrated in FIGS. 34 and 35, an unfolding operation of the housing in the electronic device is illustrated in FIGS. 36 and 37.

In the state where the housing of the electronic device is folded, an interference member provided (formed) in each hinge member 421 is removed from the avoidance recess of an adjacent hinge member. For example, in the state where the housing of the electronic device is folded, each hinge member 421 has moved in a direction of inclination at a predetermined angle, relative to an adjacent hinge member. Referring to FIG. 36, when the housing (for example, the housing 101 of FIG. 4), for example, the connection unit 401c is unfolded, a relative movement of a restraining member 431c-6 of a sixth hinge member 421-6 may be limited due to an interference member 421c-4 of a fourth hinge member 421-4. For example, relative movements between the sixth hinge member 421-6 and a fifth hinge member 421-5 in a direction in which they form a flat surface may be limited. For example, when an interference member (for example, the interference member 421c in FIG. 32) formed in each hinge member 421 is interfered with by a restraining member (for example, the restraining member 431 c in FIG. 32) of another hinge member, a relative movement of the hinge member with respect to the restraining member with respect to another adjacent hinge member may be restricted. As illustrated in FIG. 36, when the connection unit 401c is folded, the fifth hinge member 421-5 is capable of making a relative movement with respect to the fourth hinge member 421-4, whereas the sixth hinge member 421-6 is not capable of making a relative movement with respect to the fifth hinge member 421-5.

Referring to FIG. 37, when the fifth hinge member 421-5 moves to a position in which the fifth hinge member 421-5 and the fourth hinge member 421-4 form a flat surface, the sixth hinge member 421-6 may transition to a state in which it can make a relative movement. For example, when the interference member 421c-4 of the fourth hinge member 421-4 is accommodated in the avoidance recess 421b-5 of the fifth hinge member 421-5, the sixth hinge member 421-6 may become relatively movable, and the restraining member 431c-6 of the sixth hinge member 421-6 may restrain the interference member 421c-4 in the avoidance recess 421b-5. For example, when the folded housing is transformed in an unfolding direction, the hinge members 421 sequentially make relative movements, starting with the uppermost hinge member 421 in the structure of the connection unit 401c of FIG. 36, thereby transforming the connection unit 401c to a flat surface.

As the electronic device (for example, the connection unit) according to various embodiments of the present disclosure includes the above rotation regulator, the display disposed on one surface of the housing may be transformed from a flat surface to a gently curved surface, gradually from a point during the folding operation of the housing (for example, the housing 101 of FIG. 4). In the unfolding operation of the housing, the display may be transformed to the flat surface, gradually from one portion to the other portion of the curved surface. According to an embodiment, the above rotation regulator enables prediction of a transformed position or degree during transformation of the display to a curved or flat surface. Thus, a local deformation degree or a structural fatigue degree of the display in repeated folding operations may be predicted, and a design may be made in a manner that ensures the durability or reliability of the display accordingly.

Figure 38:
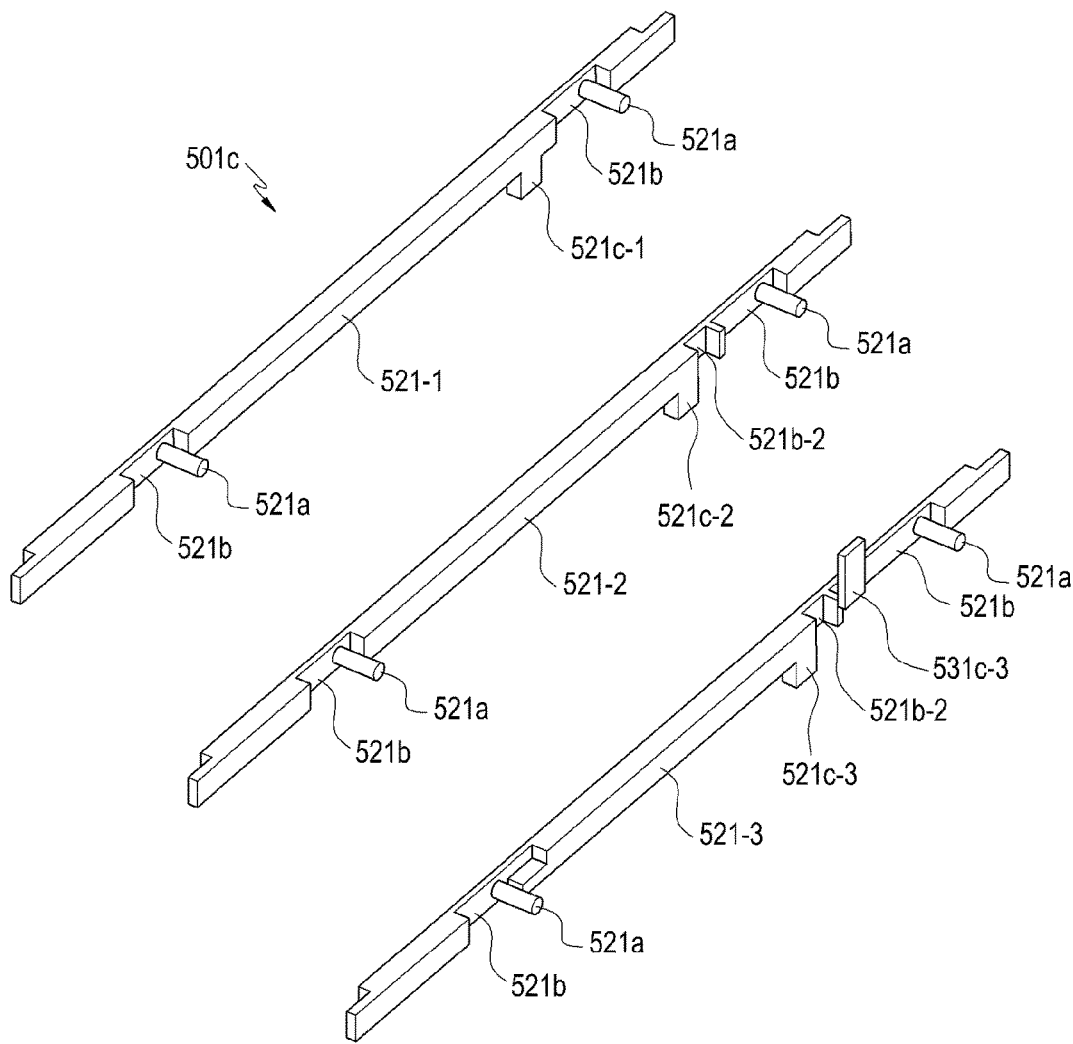
FIG. 38 is an exploded perspective view illustrating another modification example of the connection unit in the electronic device according to various embodiments of the present disclosure.
Figure 39:
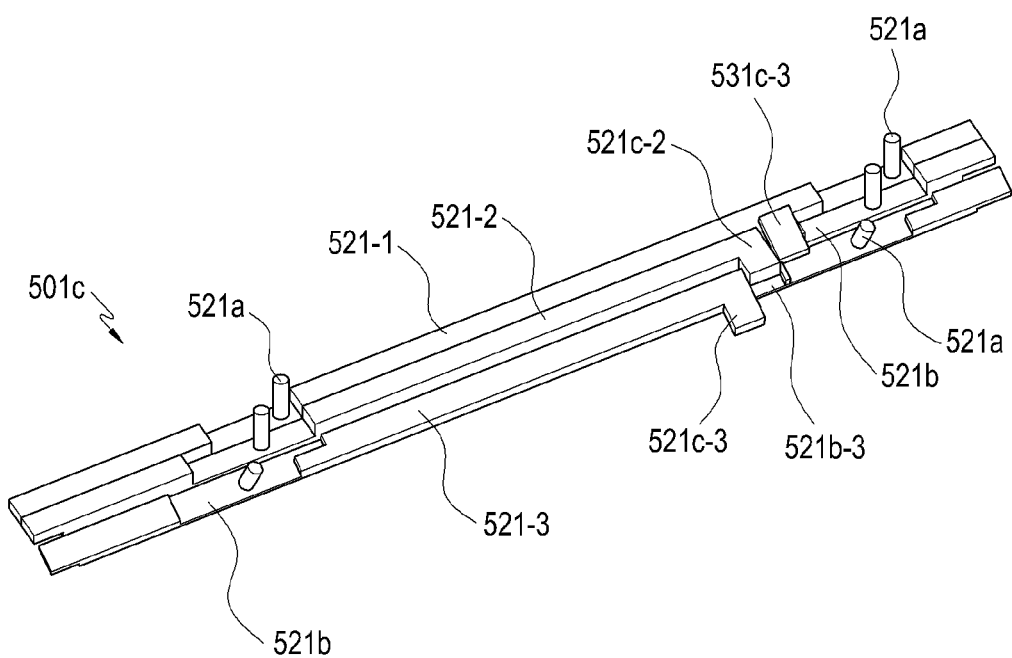
FIG. 39 is a perspective view illustrating another modification example of the connection unit in the electronic device according to various embodiments of the present disclosure.

FIG. 38 is an exploded perspective view illustrating another modification example 501c of the connection unit in the electronic device according to various embodiments of the present disclosure, and FIG. 39 is a perspective view illustrating the modification example 501c of the connection unit in the electronic device according to various embodiments of the present disclosure.

The connection unit 501c may include at least one rotation regulator provided on three sequentially arranged hinge members 521-1, 521-2, and 521-3 randomly selected from among a plurality of hinge members. According to various embodiments, the rotation regulator may include interference members 521c-1, 521c-2, and 521c-3, avoidance recesses 521b-2 and 521b-3, and/or a restraining member 531c-3. The interference members 521c-1, 521c-2, and 521c-3 may protrude in a side direction (for example, the sixth direction D6 in FIG. 4) from at least one of the three selected (and/or sequentially arranged) hinge members 521-1, 521-2, and 521-3, for example, the first hinge member 521-1. The avoidance recesses 521b-2 and 521b-3 may be formed in the second hinge member 521-2 adjacent to the first hinge member 521-1. For example, as the second hinge member 521-2 moves relative to the first hinge member 521-1, the interference member 521c-1 may be accommodated in or removed from the avoidance recess 521b-2.

In an embodiment, the avoidance recess 521b-2 may be a part of a mounting recess for mounting a link member (for example, a link member 431 in FIG. 32) therein. For example, the mounting recess may have a larger area than needed for accommodating the link member, and even though the link member is installed in the mounting recess, a part of the mounting recess may be provided as the avoidance recess 521b-2. In a specific embodiment of the present disclosure, the avoidance recess 521b-2 is formed separately from a mounting recess 521b, by way of example. In another example, fixing pins 521a may be provided on mounting recesses 521b, and serve as means for mounting and fixing link members to the hinge members 521-1, 521-2, and 521-3.

The restraining member 531c-3 may protrude from the third hinge member 521-3 disposed in parallel to the first hinge member 521-1 with the second hinge member 521-2 in between among the three hinge members 521-1, 521-2, and 521-3. The restraining member 531c-3 may protrude toward, for example, the first hinge member 521-1, for example, in a direction opposite to a direction in which the interference member 521c-1 protrudes.

According to an embodiment, the second hinge member 521-2 may include the second interference member 521c-2, and the third hinge member 521-3 may include the second interference recess 521b-3 corresponding to the second interference member 521c-2. In another embodiment, the third hinge member 521-3 may include the third interference member 521c-3, and another hinge member adjacent to the third hinge member 521-3 may have a third interference recess corresponding to the third interference member 521c-3.

Figure 40:
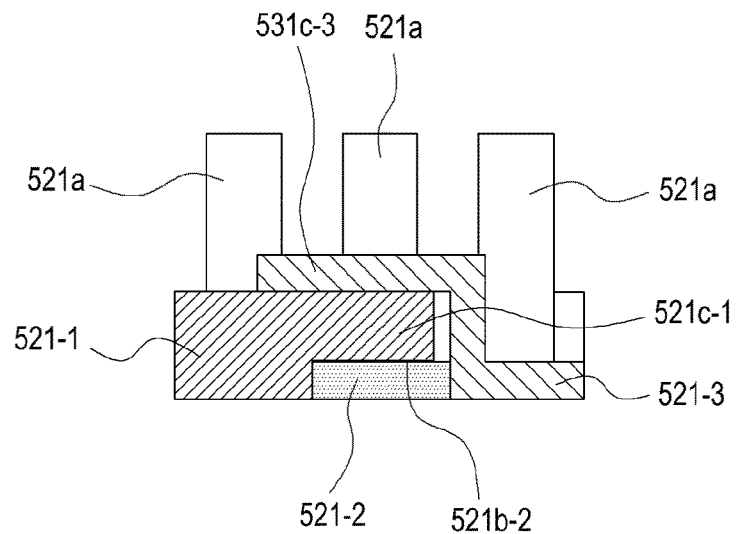
FIGS. 40 and 41 are views illustrating an operation of the rotation regulator in another modification example of the connection unit in the electronic device according to various embodiments of the present disclosure.
Figure 41:
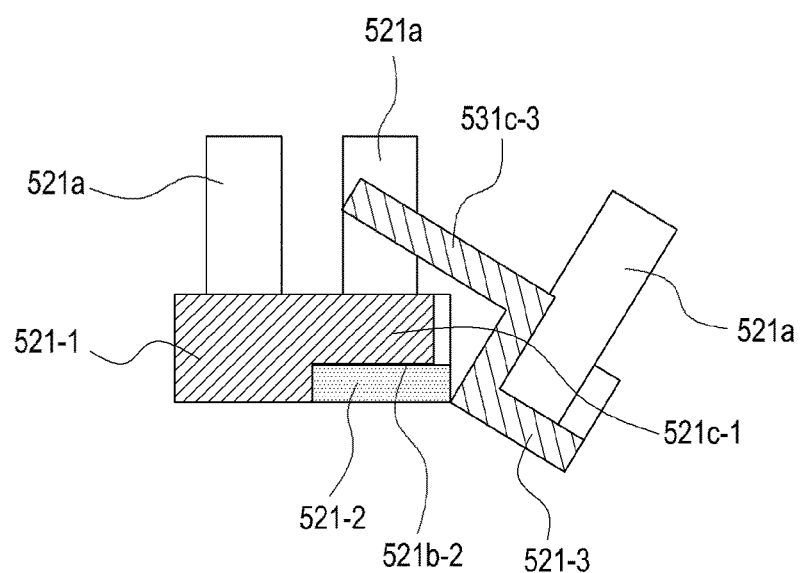

FIGS. 40 and 41 are views illustrating an operation of the rotation regulator in the modification example 501c of the connection unit in the electronic device according to various embodiments of the present disclosure.

Referring to FIG. 40, with the interference member 521c-1 accommodated in the avoidance recess 521b-2, the restraining member 531c-3 may restrain the interference member 521c-1 in the avoidance recess 521b-2. For example, in the state where the first, second, and third hinge members 521-1, 521-2, and 521-3 form a flat surface, the interference member 521c-1 may be restrained in the avoidance recess 521b-2 by means of the restraining member 531c-3, and the second hinge member 521-2 may be restricted not to make a relative movement with respect to the first hinge member 521-1. In the state where the first and second members 521-1 and 521-2 form a flat surface, when the third hinge member 521-3 moves in an inclined direction, relative to the second hinge member 521-2, the interference member 521c-1 may be released from the restrained state (for example, from the avoidance recess 521b-2), as illustrated in FIG. 41. For example, when the second and third hinge members 521-2 and 521-3 are inclined with respect to each other, the second hinge member 521-2 may move relative to the first hinge member 521-1. For example, the rotation regulator including the interference member 521c-1, the avoidance recess 521b-2, and/or the restraining member 531c-3 may restrict the hinge members of the connection unit 501c so that the hinge members may sequentially make a relative movement, starting from a portion of the connection unit 501c.

Link members for connecting hinge members to one another are not illustrated in describing the foregoing embodiment, for the simplicity of the description. For example, in order to connect at least two adjacent hinge members to be relatively movable, the connection unit 501c may include link members of another embodiment (for example, the first link members 231 of FIG. 12 or the link members 331 of FIG. 28).

Figure 42:
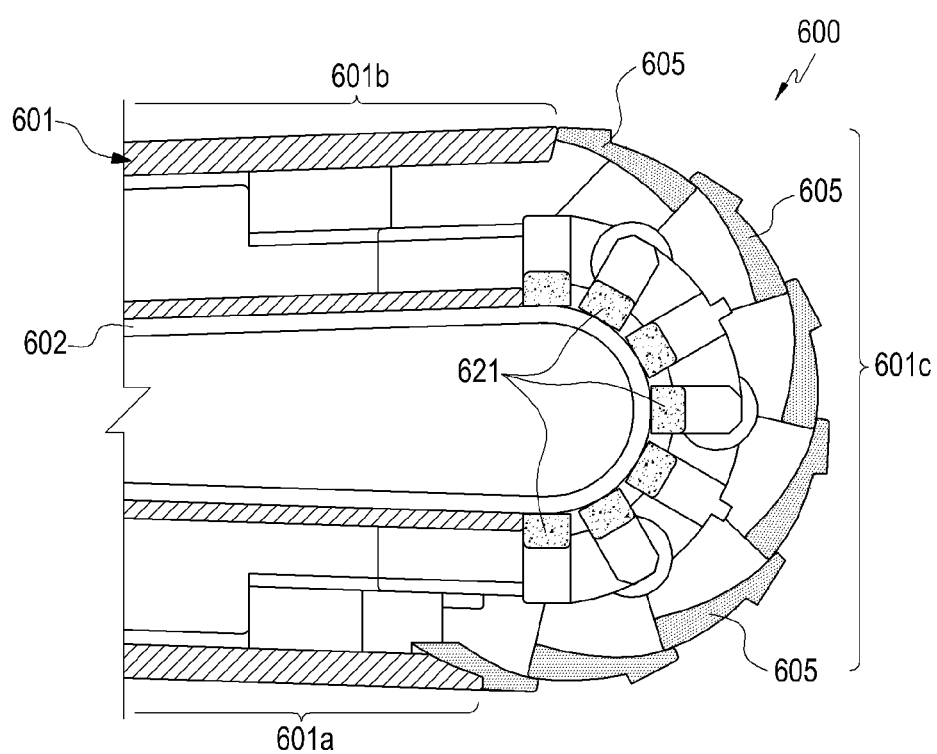
FIG. 42 is a sectional view illustrating a cover member of the connection unit in the electronic device according to various embodiments of the present disclosure.

FIG. 42 is a sectional view illustrating cover members 605 of a connection unit in an electronic device 600 according to various embodiments of the present disclosure.

Referring to FIG. 42, the electronic device 600 may include a housing 601 and a flexible display 602 mounted on one surface of the housing 601. The housing 601 may include a first part 601a, a second part 601b, and/or a connection unit 601c for connecting and engaging the first and second parts 601a and 601b with each other to be relatively movable. Since the connection unit 601c includes a plurality of hinge members 621 supporting the display 602, the hinge members 621 may prevent excessive deformation of the display 602 even in a folded state, and may relieve/prevent local deformation of the display 602 caused even by a user's touch (for example, a touch input) in an unfolded state. In an embodiment, the connection unit 601c may include a plurality of cover members 605, to thereby isolate the inner space of the connection unit 601c from the outer space of the connection unit 601c irrespective of whether the housing 601 is folded or unfolded.

In an embodiment, each of the cover members 605 may be engaged with one hinge member 621. When the housing 601 is folded, the cover member 605 may be partially hidden by an adjacent cover member 605 or exposed outward. For example, when the housing 601 is unfolded, the cover members 605 may be arranged in such a manner that parts of the outer surfaces of the cover members 605 may form a flat surface. When the housing 601 is folded, the cover members 605 may be arranged, forming a curved surface, with most of their outer surfaces being exposed. At least a part of the outer surface of the connection unit 601c is formed substantially by the outer surfaces of the cover members 605. In the unfolding or folding operation of the housing 601, the cover members 605 may be hidden or exposed gradually by their adjacent cover members 605. For example, when seen from the outside of the housing 601, the outer surface of the connection unit 601c may be seen as contracted or extended because each of the cover members 605 makes a relative movement while changing an area over which it partially overlaps with an adjacent cover member 605.

According to various embodiments, the space between the hinge members 621 and the cover members 605 may connect the inner space of the first part 601a to the inner space of the second part 601b, while being isolated from the outer space of the connection unit 601c. For example, various circuit devices may be accommodated in each of the inner spaces of the first and second parts 601a and 601b, and may be interconnected through an FPCB disposed in the inner space of the connection unit 601c.

Figure 43:
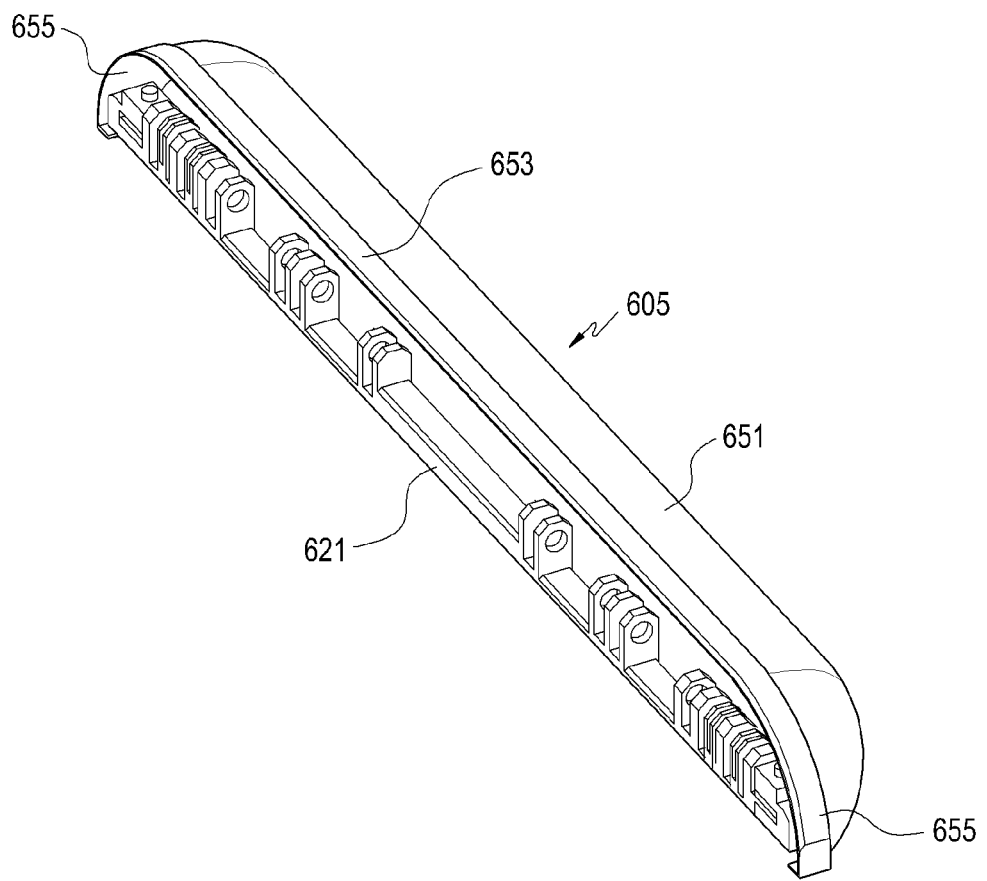
FIG. 43 is a perspective view illustrating a cover member and a hinge member which are engaged with each other in the connection unit in the electronic device according to various embodiments of the present disclosure.
Figure 44:
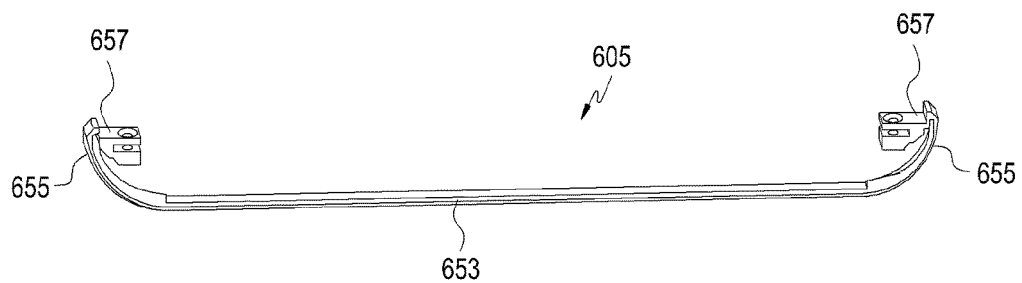
FIG. 44 is a perspective view illustrating a cover member in the electronic device according to various embodiments of the present disclosure.
Figure 45:
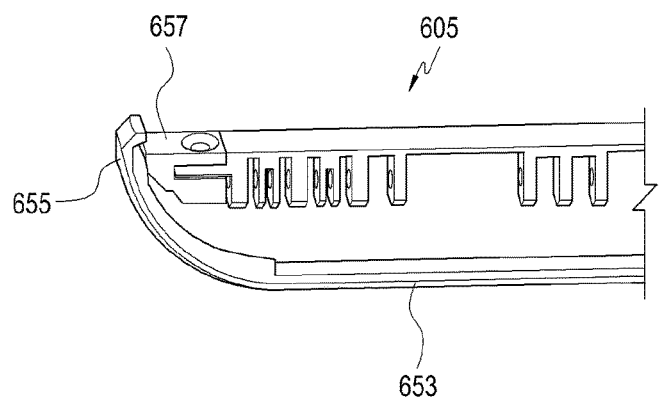
FIG. 45 is a view illustrating an engagement mechanism between a cover member and a hinge member of the connection unit in the electronic device according to various embodiments of the present disclosure.

FIG. 43 is a perspective view illustrating assembly of a cover member 605 onto a hinge member 621 in the connection unit of the electronic device according to various embodiments of the present disclosure, FIG. 44 is a perspective view illustrating the cover member 605 of the connection unit in the electronic device according to various embodiments of the present disclosure, and FIG. 45 is a view illustrating an engagement structure between the cover member 605 and the hinge member 621 in the connection unit of the electronic device according to various embodiments of the present disclosure.

Referring to FIGS. 43, 44, and 45, the cover members 605 may be extended along a direction, for example, along the fifth direction D5 of FIG. 4, and engaged with each other to form a part of one surface of the housing 601, for example, the sixth surface F6 of FIG. 5. As described before, as the housing 601 is folded, the cover members 605 may be arranged so that the outer surface (for example, the sixth surface F6) of the connection unit 601c may form a flat or curved surface, and isolate the inner space of the connection unit 601c from the outer space of the connection unit 601c.

In an embodiment, each of the cover members 605 may include a first extension portion 651, and a second extension portion 653 protruding from the first extension portion 651. In the state where the housing 601 is unfolded, the first extension portion 651 of each cover member 605 may be hidden by the second extension portion 653 of an adjacent cover member 605. For example, in the state where the housing 601 is unfolded, the sixth surface F6 may be formed substantially by the second extension portions 653 in combination. When the housing 601 is folded, the first extension portion 651 of each cover member 605 may be exposed next to the second extension portion 653 of an adjacent cover member 605. According to an embodiment, in the state where the housing 601 is folded, the cover members 605 may be arranged successively, thereby isolating the inner space of the connection unit 601c from the outer space of the connection unit 601c. For example, even in the folded state of the housing 601, a part of the first extension portion 651 of each cover member 605 may be hidden by the second extension portion 652 of an adjacent cover member 605. In the folded state of the housing 601, the first extension portions 651 may also be partially exposed, and alternate with the second extension portions 652, thus bending the outer surface of the connection unit 601c, for example, the sixth surface F6 to a curved surface.

According to various embodiments, each of the cover members 605 may include a side surface portion(s) 655. The side surface portion 655 may be extended from at least one end of the first extension portion 651 or the second extension portion 653. According to an embodiment, side surface portions 655 may be provided at both ends of the cover member 605, facing each other. In an embodiment, installation protrusions 657 may be formed on inner surfaces of the side surface portions 655, and provide means for fixing end portion of the hinge member 621. The hinge member 621 may be fixed to the installation protrusions 657 in various manners, for example, by an engagement member such as screws, or by welding or fusion.

Figure 46:
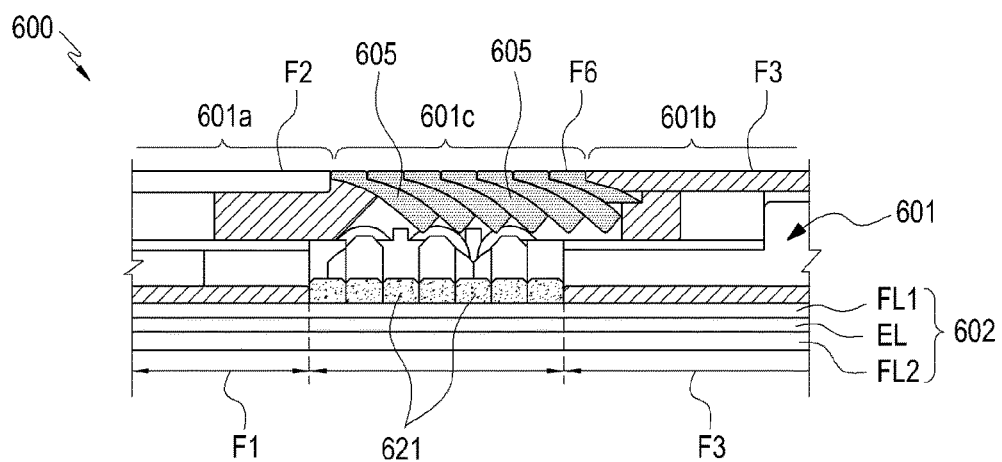
FIG. 46 is a sectional view illustrating the electronic device in an unfolded state according to various embodiments of the present disclosure.
Figure 47:
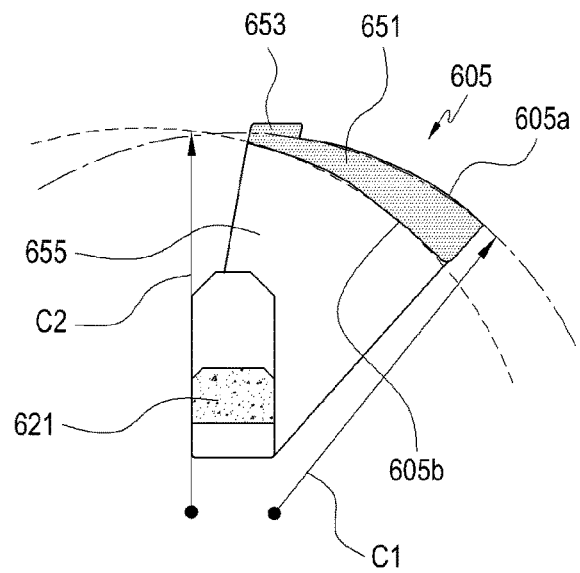
FIG. 47 is a sectional view illustrating a position structure of a cover member in the connection member in the electronic device according to various embodiments of the present disclosure.
Figure 48:
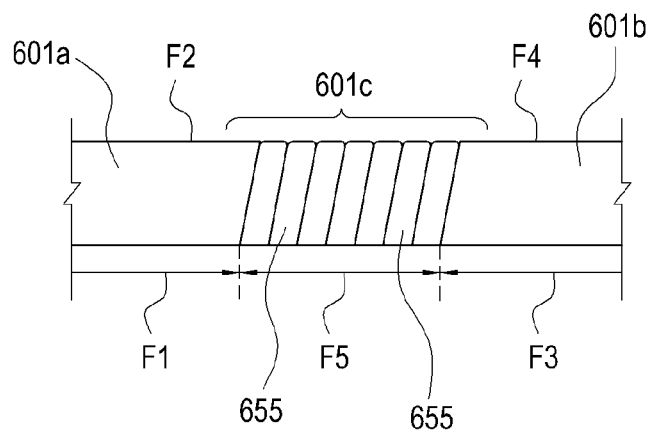
FIG. 48 is a side view illustrating the electronic device in the unfolded state according to various embodiments of the present disclosure.

FIG. 46 is a sectional view illustrating the unfolded electronic device 600 according to various embodiments of the present disclosure, FIG. 47 is a sectional view illustrating a position structure of a cover member 605 of the connection unit in the electronic device according to various embodiments of the present disclosure, and FIG. 48 is a side view illustrating the unfolded electronic device 600 according to various embodiments of the present disclosure.

Referring to FIG. 46, in the state where the electronic device 600 (for example, the housing 601) is unfolded, the display 602 may be transformed to the shape of a flat surface in order to match to one surface of the housing 601. For example, in the unfolded state of the housing 601, areas of the display 602 corresponding to the first surface F1, the third surface F3, and the fifth surface F5 may be arranged in the form of a flat surface on one surface of the electronic device 600. In an embodiment, the display 602 may be transformed to a curved surface and/or a flat surface, while being supported by the hinge members 621 of the connection unit 601c, and local deformation of the display 602 may be relieved or prevented against a user's touch such as a touch input. The display 602 may include, for example, an electroluminescent (EL) layer and film layers F1 and F2 arranged on both surfaces of the EL layer, thus sealing the EL layer.

In an embodiment, when the housing 601 is unfolded, the cover members 605 forming a part of the connection unit 601c of the housing 601 may form a partial flat area (for example, the fifth surface F5) on one surface of the housing 601 (for example, the surface opposite to the surface of the housing 601 with the display 602 on it). For example, each of the cover members 605 may be exposed only partially, overlapping with an adjacent cover member 605, and the exposed parts of the cover members 605 may form the fifth surface F5 that connects the first part 601a (for example, the second surface F2) to the second part 601b (for example, the fourth surface F4) in the housing 601.

Referring to FIG. 47, the layout of the cover members 605 and the hinge members 621 will be described in greater detail. FIG. 47 illustrates a section of a cover member 605, for example, taken along the sixth direction D6 of FIG. 4.

The cover member 605 may include a first extension portion 651, and a second extension portion 653 protruding from the first extension portion 651. For example, the second extension portion 653 may protrude from the outer surface of the first extension portion 651. In an embodiment, an arc trajectory having a curvature radius of C1 or C2 may be formed on at least part of each of an outer surface 605a and an inner surface 605b of the cover member 605. For example, each of the outer surface 605a and the inner surface 605b of the cover member 605 may include a curved surface at least partially.

According to an embodiment, the curvature radiuses C1 and C2 of the outer surface 605a and the inner surface 605b of the cover member 605 may be substantially equal, and may have different centers. When the cover member 605 is disposed in such a manner that the outer surface 605a and the inner surface 605b of the cover member 605 may have the equal curvature radiuses C1 and C2 with difference centers, the thickness of the cover member 605 (for example, the thickness in the sectional view illustrating FIG. 46 or the thickness of a section taken along the sixth direction D6 of FIG. 4) may increase or decrease from one end to the other end of the cover member 605.

According to various embodiments, one cover member 605 may partially be brought into mutual sliding contact with an adjacent cover member 605. For example, when the housing 601 is folded or unfolded, one cover member 605 may make a relative movement with respect to an adjacent cover member, and the former may closely contact the latter at least partially in order to isolate the inner space of the connection unit 601c from the outer surface of the connection unit 601c. Since the one cover member 605 is brought into sliding contact with the adjacent cover member 605, the outer surface 605a and/or the inner surface 605b of the cover member 605 may be used as guiding means for guiding movement of the adjacent cover member. For example, when the outer surface 605a of the cover member 605 is brought into sliding contact with the adjacent cover member, the outer surface 605a of the cover member 605 may guide movement of the adjacent cover member. In an embodiment, when the outer surface 605a of the cover member 605 has a curvature radius of 'C1', the inner surface of the adjacent cover member in sliding contact with the outer surface 605a of the cover member 605 may have the curvature radius of 'C1'. However, the curvature radiuses may have different centers.

According to various embodiments, in the state where the housing 601 is unfolded, the side surface portions 655 of the cover member 605 may be extended inclined to the fifth surface F5, for example, in a direction forming a non-right angle with the fifth surface F5. As the side surface portions 655 are extended inclined to the hinge member 621, an inclined line shape may be shown from the exterior of the electronic device 600, for example, on the side surfaces of the housing 601, as illustrated in FIG. 48. As described below in an embodiment of FIGS. 49, 50, and 51, the exterior of the electronic device 600 may be designed in various manners according to the extension direction of the side surface portions 655.

Figure 49:
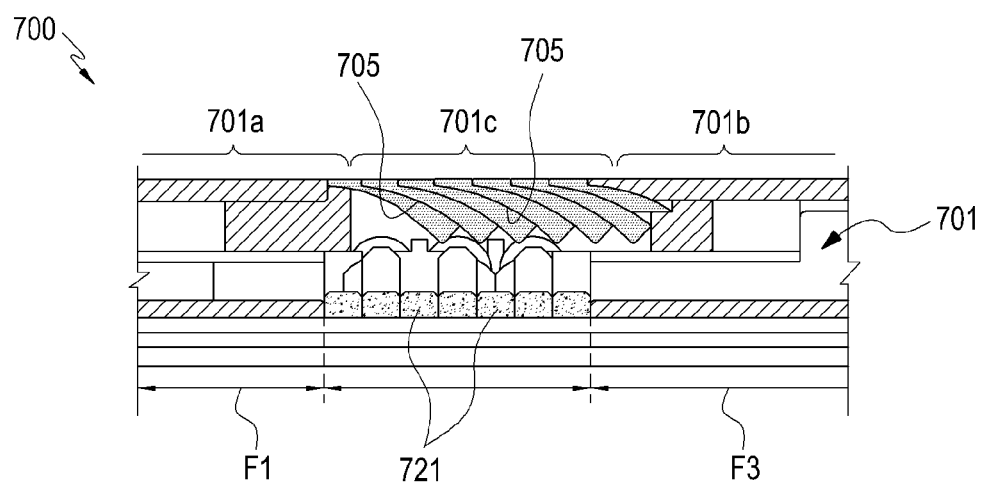
FIG. 49 is a sectional view illustrating the electronic device in the unfolded state according to various embodiments of the present disclosure, referred to for describing a modification example of the cover member.
Figure 50:
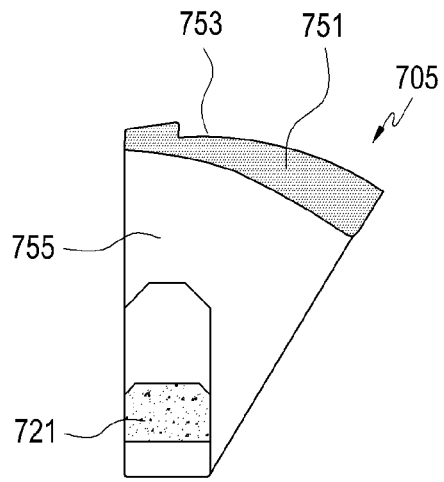
FIG. 50 is a sectional view illustrating a position structure of the modification example of the cover member in the connection member in the electronic device according to various embodiments of the present disclosure.
Figure 51:
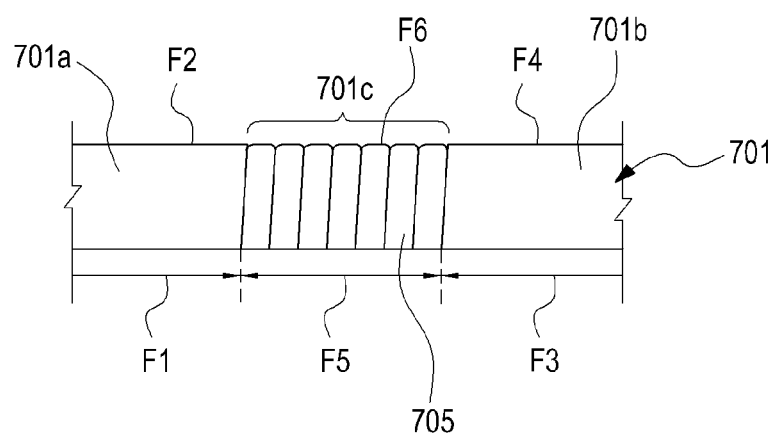
FIG. 51 is a side view illustrating the electronic device in the unfolded state according to various embodiments of the present disclosure, referred to for describing a modification example of the cover member.

FIG. 49 is a sectional view illustrating a folded electronic device 700 according to various embodiments of the present disclosure, referred for describing a modification example 705 of the cover member. FIG. 50 is a sectional view illustrating a position structure of the modified cover member 705 in the connection unit of the electronic device 700 according to various embodiments of the present disclosure. FIG. 51 is a side view illustrating the folded electronic device 700 according to various embodiments of the present disclosure, referring to for describing the modification example of the cover member.

Referring to FIG. 49, in the state where the electronic device 700 (for example, a housing 701) is unfolded, a display (for example, the display 602 in FIG. 46) may be transformed to a flat surface to match to one surface of the housing 701. In an embodiment, when the housing 701 is unfolded, cover members 705 forming a part of a connection unit 701c of the housing 701 may form a partial area being a flat surface (for example, the fifth surface F5) on one surface of the housing 701 (for example, the surface opposite to the surface on which the display is mounted). For example, each of the cover members 705 may overlap with an adjacent cover member, exposed outward only partially, and the exposed parts of the cover members 705 may form the fifth surface F5 that connects a first part 701a (for example, the second surface F2) to a second part 701b (for example, the fourth surface F4) in the housing 701.

Referring to FIG. 47, the cover member 705 may include a first extension portion 751, and a second extension portion 753 protruding from the first extension portion 751. For example, the second extension portion 753 may protrude from the outer surface of the first extension portion 751. In an embodiment, in the state where the housing 701 is unfolded, side surface portions 755 of the cover member 705 may be extended in a direction perpendicular to the fifth surface F5. As the side surface portions 755 are extended vertically from a hinge member 721, vertically extended lines may be shown on one surface of the housing 701, from the exterior of the electronic device, for example, from a side surface of the housing 701, as illustrated in FIG. 51.

According to various embodiments of the present disclosure, the cover member 705 may be designed to have various strengths according to the material of the cover member 705, or the inclination of the first extension portion 751 and/or the second extension portion 753. For example, for structures of the same material, a thicker structure may have a greater strength. In the state where the housing 701 is unfolded, as the cover member 705 has a larger inclination angle with respect to one surface of the housing 701 (for example, the first surface F1, the second surface F2, and/or the fifth surface F5), the cover member 705 may be thicker. The thickness of the cover member 705, the inclination angle of the cover member 705 with respect to the fifth surface F5, the curvature radius of the inner/outer surface of the cover member 705, and the like may be designed in various manners, in consideration of the use environment or operation structure of an electronic device to be fabricated, smooth sliding contact between adjacent cover members, inner/outer space isolation of the connection unit, space within the connection unit, and so on.

Figure 52:
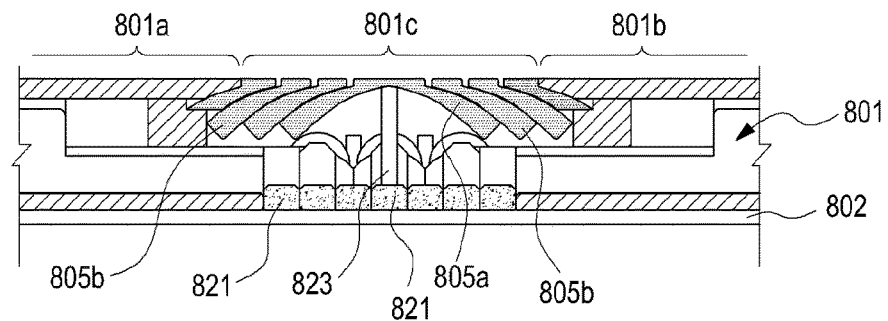
FIG. 52 is a sectional view illustrating the electronic device in the unfolded state according to various embodiments of the present disclosure, referred to for describing another modification example of the cover member.
Figure 53:
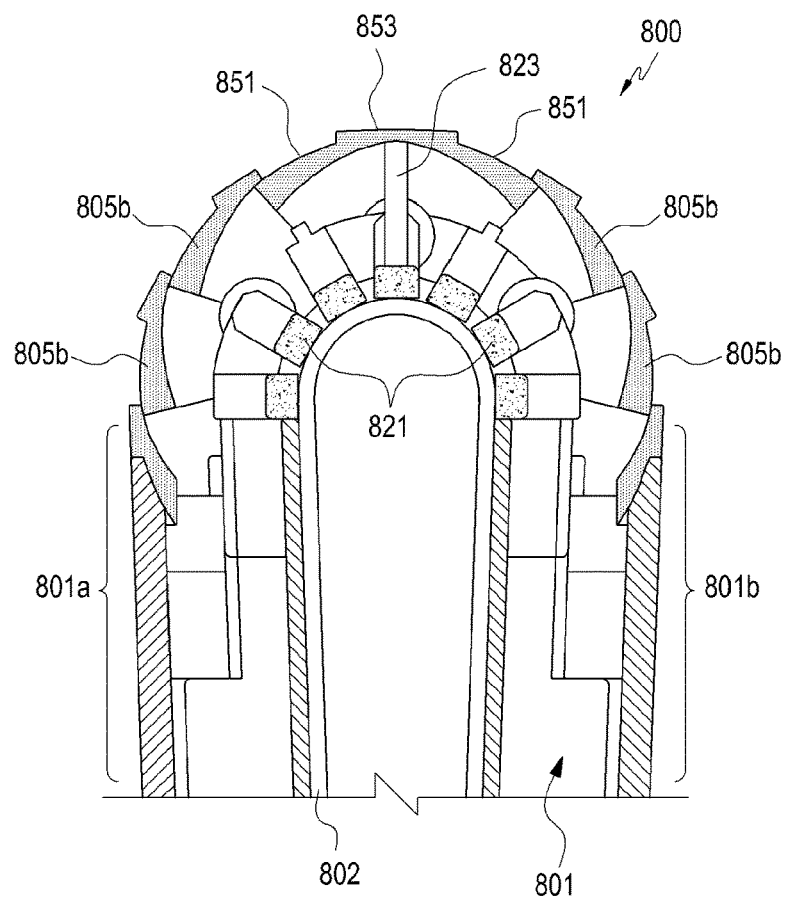
FIG. 53 is a sectional view illustrating the electronic device in the folded state according to various embodiments of the present disclosure, referred to for describing another modification example of the cover member.

FIG. 52 is a sectional view illustrating an unfolded state of an electronic device 800 according to various embodiments of the present disclosure, referred to for describing another modification example of the cover member. FIG. 53 is a sectional view illustrating a folded state of the electronic device 800 according to various embodiments of the present disclosure, referred to for describing the modification example of the cover member.

Referring to FIGS. 52 and 53, the electronic device 800 may include a housing 801 and a display 802 mounted on one surface of the housing 801. The housing 801 may include a first part 801a, a second part 801b, and a connection unit 801 that connects and engages the second part 801b with the first part 801a. The connection unit 801c may be transformed to a flat surface or a curved surface. According to a transformation of the connection unit 801c, the second part 801b may be unfolded, forming a flat surface (leveled) with the first part 801a or may be folded, facing the first part 801a. As the second part 801b is unfolded or folded, the display 802 may be unfolded to be flat or folded with its two different parts facing each other, in correspondence with the unfolding or folding of the second part 801b. For example, in the state where the electronic device 800 is folded, the display 802 may be surrounded by the housing 801.

According to various embodiments, the connection unit 801c may include a plurality of hinge members 821 and a plurality of cover members 805a and 805b. The hinge members 821 may be extended along one direction (for example, the fifth direction D5 in FIG. 4), arranged in a direction perpendicular to the direction (for example, the sixth direction D6 in FIG. 4). For example, the hinge members 821 may be combined to form an area supporting a part of the display 802. According to an embodiment, each of the cover members 805a and 805b may be engaged with one of the hinge members 821, forming a part (for example, the sixth surface F6) of the other surface of the housing 801.

According to various embodiments, each of the cover members 805a and 805b may include a first extension portion 851 and a second extension portion 853 protruding from the first extension portion 851. In the state where the housing 801 is unfolded, the second extension portions 853 may be arranged to form a flat surface, while being exposed between a fourth surface (for example, the fourth surface F4 in FIG. 5) and a sixth surface (for example, the sixth surface F6 in FIG. 5) of the housing 801. For example, in the state where the housing 801 is unfolded, each of the first extension portions 851 may be hidden at least partially by the second extension portions of other adjacent cover members. In the state where the housing 801 is folded, each of the first extension portions 851 may be exposed outward partially. For example, in the state where the housing 801 is folded, the first extension portions 851 and the second extension portions 853 are arranged alternately, forming a curved surface and connecting the fourth and sixth surfaces of the housing 801 to each other.

According to various embodiments, one of the cover members 805a and 805b (hereinafter, referred to as the 'first cover member 805a') may be shaped so that the first extension portion 851 is substantially symmetrical at both sides of the second extension portion 853, from the section taken along the sixth direction D6 of FIG. 4, for example, along a direction in which the hinge members 821 are arranged. For example, the first cover member 805a may be substantially symmetrical with respect to the second extension portion 853. In an embodiment, the other cover members (hereinafter, referred to the 'second cover members 805b') may be arranged at both sides of the first cover member 805a, when seen from the section taken along the sixth direction D6. In the state where the housing 801 is unfolded or folded, the second cover members 805b may be arranged to be substantially symmetrical with respect to the first cover member 805a.

According to an embodiment, each of the hinge members 821 may make a relative movement with respect to an adjacent hinge member, in an arbitrary order or a sequential order from one side of the hinge members 821. For example, without any additional rotation regulator, each of the hinge members 821 may move relative to an adjacent hinge member in an arbitrary order. When there is a rotation regulator as described before with reference to FIG. 32, each of the hinge members 821 may move relative to an adjacent hinge member in an order determined according to the structure of the rotation regulator. For example, when each of the hinge members 821 moves relative to an adjacent hinge member, the hinge members 821 may not be symmetrical. Therefore, since each of the cover members 805a and 805b is engaged with one of the hinge members 821, the second cover members 805b may not be symmetrical during folding or unfolding of the housing 801. For example, when the housing 801 is unfolded as illustrated in FIG. 52 or folded as illustrated in FIG. 53, the second cover members 805b may be arranged to be substantially symmetrical with respect to the first cover member 805a.

According to various embodiments, the electronic device 800 and/or the connection unit 801c may further include a support member 823. The support member 823 may be disposed between the substantially symmetrical first cover member 805a and a hinge member 821 corresponding to the first cover member 805a, thereby supporting the first cover member 805a. Like the embodiment described with reference to FIG. 43, each of the first and second cover members 805a and 805b may be engaged with a hinge member corresponding to the cover member through a side surface portion. In an embodiment, each of the cover members 805a and 805b may accommodate, inside it, a part (for example, the first extension portion 851) of an adjacent cover member. For example, as each of the cover members 805a and 805b is engaged with hinge members 821 at both end portions thereof, the cover member may allow introduction of parts of other cover members inside it.

According to an embodiment, the first cover member 805a may be formed so that the first extension portions 851 may be substantially symmetrical with respect to the second extension portion 853, and another cover member is not introduced inside the first cover member 805a. For example, it may be easy to interpose another structure, for example, the support member 823 between the first cover member 805a and the hinge member 821 corresponding to the first cover member 805a. In an embodiment, the connection unit 801c may provide a wiring area (or space) for interconnecting circuit devices arranged in the first and second parts 801a and 801b. The support member 823 may be used as a structure for spacing the first cover member 805a from the hinge member 821 corresponding to the first cover member 805a by a predetermined distance within a range that does not limit the wiring area. For example, the inclusion of the support member 823 may increase the structural strength or the like of the connection unit 801c.

Figure 54:
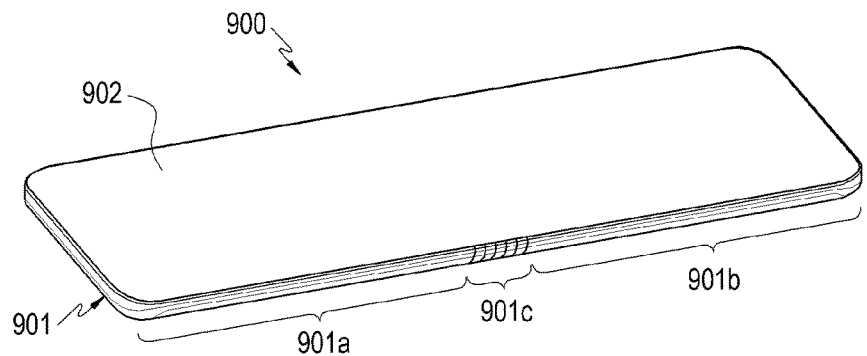
FIG. 54 is a perspective view illustrating another example of the electronic device according to various embodiments of the present disclosure.
Figure 55:
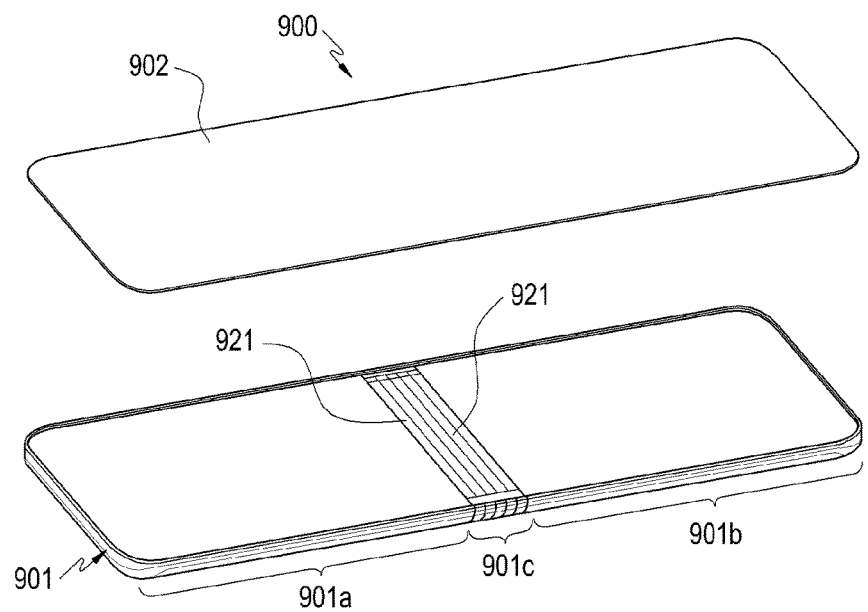
FIG. 55 is an exploded perspective view illustrating another example of the electronic device according to various embodiments of the present disclosure.
Figure 56:
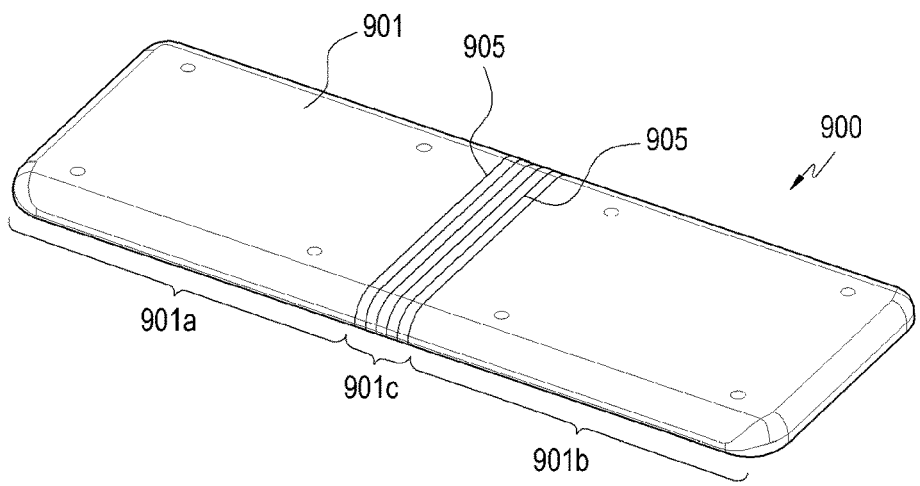
FIG. 56 is a perspective view illustrating another example of the electronic device according to various embodiments of the present disclosure, seen from a different direction.
Figure 57:
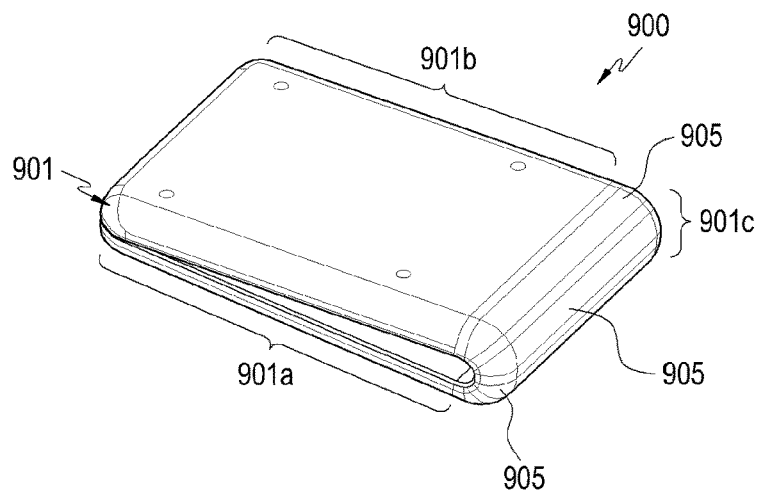
FIG. 57 is a perspective view illustrating another example of the electronic device in the folded state according to various embodiments of the present disclosure.

FIG. 54 is a perspective view illustrating another exemplary electronic device 900 according to various embodiments of the present disclosure. FIG. 55 is an exploded perspective view illustrating the electronic device 900 according to various embodiments of the present disclosure. FIG. 56 is a perspective view illustrating the electronic device 900 according to various embodiments of the present disclosure, seen from a different direction. FIG. 57 is a perspective view illustrating the electronic device 900 in a folded state according to various embodiments of the present disclosure.

Referring to FIGS. 54 to 57, the electronic device 900 (for example, the electronic device 20 in FIG. 2) may include a housing 901, and a display 902 (for example, the display 26 in FIG. 2) mounted on one surface of the housing 901. The flexible display 902 may be incorporated with a touch panel (for example, the touch panel 25a in FIG. 2) and thus may be used as an input device. Although 'display' is just mentioned in the following description, this term may cover a flexible or bendable display.

The housing 901 may include a first part 901a, a second part 901b, and a connection unit 901c for connecting the first part 901a and the second part 901b with each other so that the first part 901a and the second part 901b may move (for example, pivot) relative to each other. For example, the second part 901a may be engaged with the first part 901a through the connection unit 901c, and may make a relative movement between a position in which it faces the first part 901a and a position in which it is leveled next to the first part 901a, with the connection unit 901c in between. For example, the connection unit 901c may be bent, while connecting one edge of the first part 901a to one edge of the second part 901b. Thus, the connection unit 901c may move the first part 901a and/or the second part 901b so that the first and second parts 901a and 901b may face each other or may be leveled with each other.

As the connection unit 901c is transformed, the outer surface of the connection unit 901c, for example, at least part of a surface on which the display 902 is not mounted may be extended/contracted. For example, as the housing 901 is unfolded or folded, the surface area of the outer surface of the connection unit 901c may be increased or decreased.

This is possible since the outer surface of the connection unit 901c is comprised of a plurality of cover members 905. For example, as the housing 901 is folded or unfolded, each of the cover members 905 may make a relative movement with respect to an adjacent cover member, and thus the outer surface of the connection unit 901c may be shown as extended or contracted, from the outside.

The display 902 may be bent in correspondence with bending of the housing 901, for example, the connection unit 901c. According to various embodiments, a plurality of hinge members 921 may be arranged on a surface of the connection unit 901c, which faces the part of the display 902, and the hinge members 921 may support the display 902 and bend the display 902 to a curved surface, while moving relative to each other. Each of the cover members 905 may be connected to one of the hinge members 921.

According to various embodiments, the electronic device 900 may be configured by modifying or combining the electronic devices (for example, the electronic device 100 in FIGS. 3 to 7) or the connection units (for example, the connection units 201c, 301c, 401c, 501c, 601c, 701c, and 801c in FIG. 8) in the foregoing embodiments. For example, the connection unit 901c may include the locking members 204 of FIG. 16, the link members 331 of FIG. 28, and the rotation regulator of FIG. 32.

Figure 58:
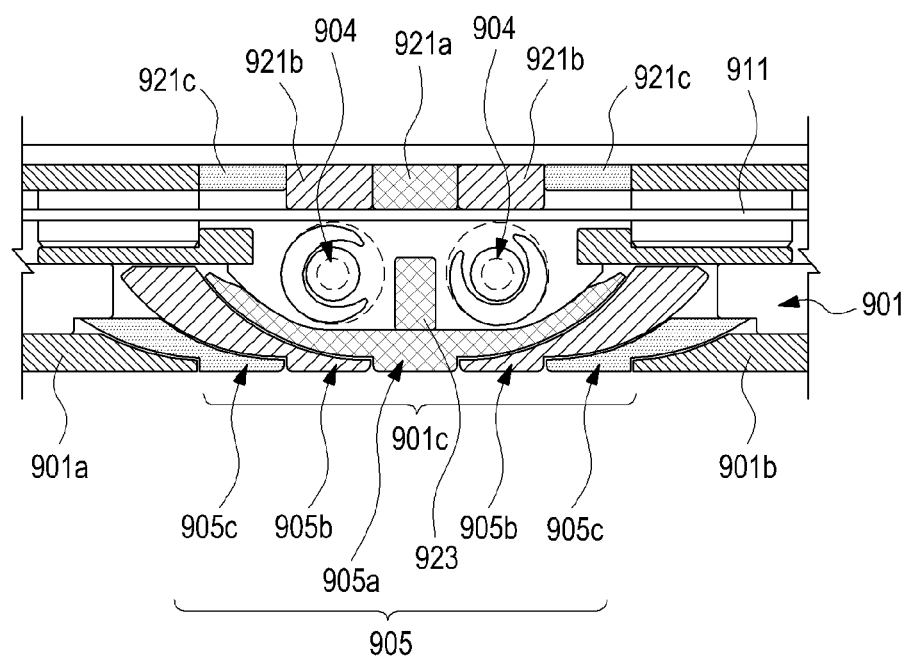
FIG. 58 is a sectional view illustrating another example of the electronic device in the unfolded state according to various embodiments of the present disclosure.
Figure 59:
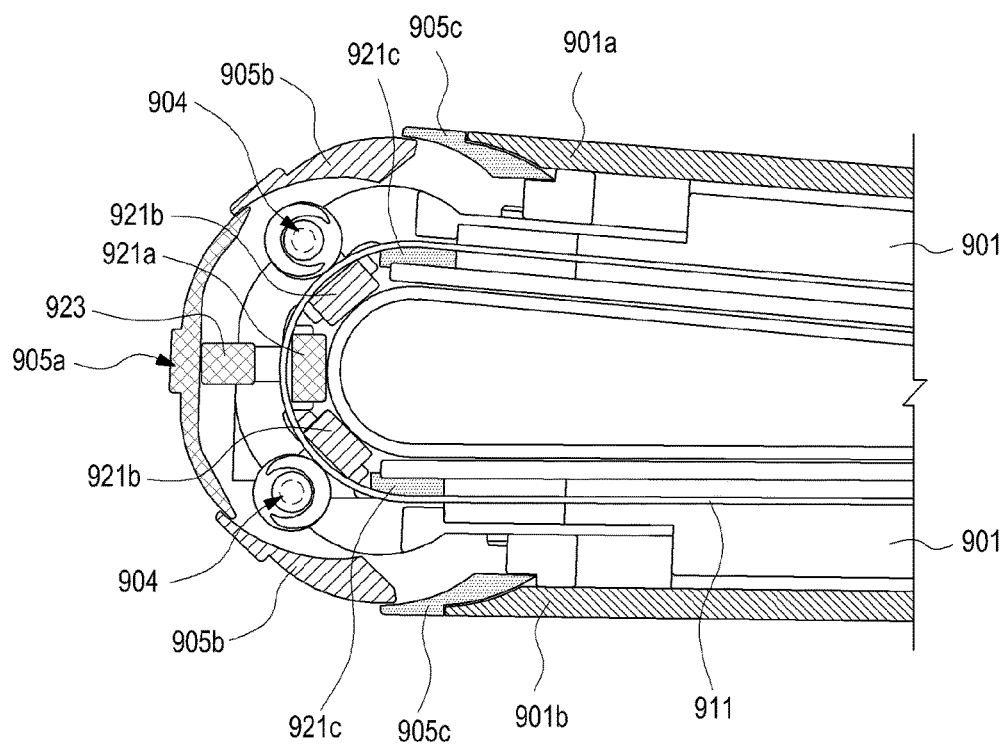
FIG. 59 is a sectional view illustrating another example of the electronic device in the folded state according to various embodiments of the present disclosure.

FIG. 58 is a sectional view illustrating the modified electronic device 900 in the unfolded state according to various embodiments of the present disclosure, and FIG. 59 is a sectional view illustrating the modified electronic device 900 in the folded state according to various embodiments of the present disclosure.

Referring to FIGS. 58 and 59, the electronic device 900 may include the housing 901, and the display 902 mounted on one surface of the housing 901. The connection unit 901c may be transformed to a flat surface or a curved surface. Along with the transformation of the connection unit 901c, the second part 901b may be unfolded to form a flat surface with the first part 901a (to be positioned next to the first part 901a, leveled with the first part 901a), or may be folded to face the first part 901a. As the second part 901b is unfolded or folded, the display 902 may be unfolded to a flat surface or folded so that two different parts may face each other, in correspondence with the unfolding or folding of the second part 901b. In the state where the housing 901 is folded, the display 902 may be transformed to a curved surface in an area corresponding to the connection unit 901c.

According to various embodiments, the connection unit 901c may include a plurality of (for example, five) hinge members 921a, 921b, and 921c, and a plurality of cover members 905. The hinge members 921a, 921b, and 921c may be extended along a direction (for example, the fifth direction D5 in FIG. 4), arranged along a direction (for example, the sixth direction D6 in FIG. 4) perpendicular to the direction, thereby forming a part (for example, the fifth surface F5 in FIG. 4) of one surface of the housing 901. For example, the hinge members 921a, 921b, and 921c may be combined to form an area supporting the part of the display 902. According to an embodiment, each of the cover members 905 may be engaged with one of the hinge members 921, and the cover members 905 may form a part (the sixth surface F6 in FIG. 5) of the other surface of the housing 901.

According to various embodiments, each of the cover members 905 may include a first extension portion (for example, the first extension portion 851 in FIG. 53), and a second extension portion (for example, the second extension portion 853 in FIG. 53) protruding from the first extension portion, similarly to in the foregoing embodiment. In the state where the housing 901 is unfolded, the second extension portions may be arranged to form a flat surface on the outer surface of the housing 901. In the state where the housing is folded, each of the first extension portions may be partially exposed outward. For example, in the state where the housing 901 is folded, the first extension portions and the second extension portions may be arranged alternately, forming a curved surface.

According to various embodiments, one of the cover members 905 (for example, a cover member denoted by reference numeral '905a') may be shaped so that the first extension portion may be substantially symmetrical at both sides of the second extension portions, in the sectional view. In an embodiment, the remaining cover members 905 (for example, cover members denoted by reference numerals '905b' and '905c') may be arranged at both sides of the cover member 905a, in the sectional view. In the state where the housing 901 is unfolded or folded, the cover members 905b and 905c may be arranged to be substantially symmetrical with respect to the cover member 905a.

According to various embodiments, the connection unit 901c may include an afore-described rotation regulator. For example, the hinge members 921a, 921b, and 921c may move relative to their adjacent hinge members in an order determined according to the structure of the rotation regulator. For example, when the housing 901 is folded or unfolded, the cover members 905 may not be arranged symmetrically. When the housing 901 is fully unfolded as illustrated in FIG. 54 or fully folded as illustrated in FIG. 57, the cover members 905 may be substantially symmetrical.

According to various embodiments, the electronic device 900 and/or the connection unit 901c may further include a support member 923. The support member 923 may be interposed between the symmetrical cover member 905a and a hinge member 921a corresponding to the cover member 905a, supporting the cover member 905a.

According to an embodiment, a circuit board for interconnecting circuit devices arranged in the first part 901a and the second part 901b, for example, an FPCB 911 may be disposed in the connection unit 901c. For example, the FPCB 911 may be disposed between the hinge members 921a, 921b, and 921c and locking members 904. In an embodiment, support ribs may be formed in at least a part of the hinge members 921a, 921b, and 921c, for mounting the locking members 904. The locking members 904 may be mounted in the support ribs, apart from the hinge members 921a, 921b, and 921c by a predetermined distance, and the FPCB 911 may be disposed in a space between the locking members 904 and the hinge members 921a, 921b, and 921c.

Figure 60:
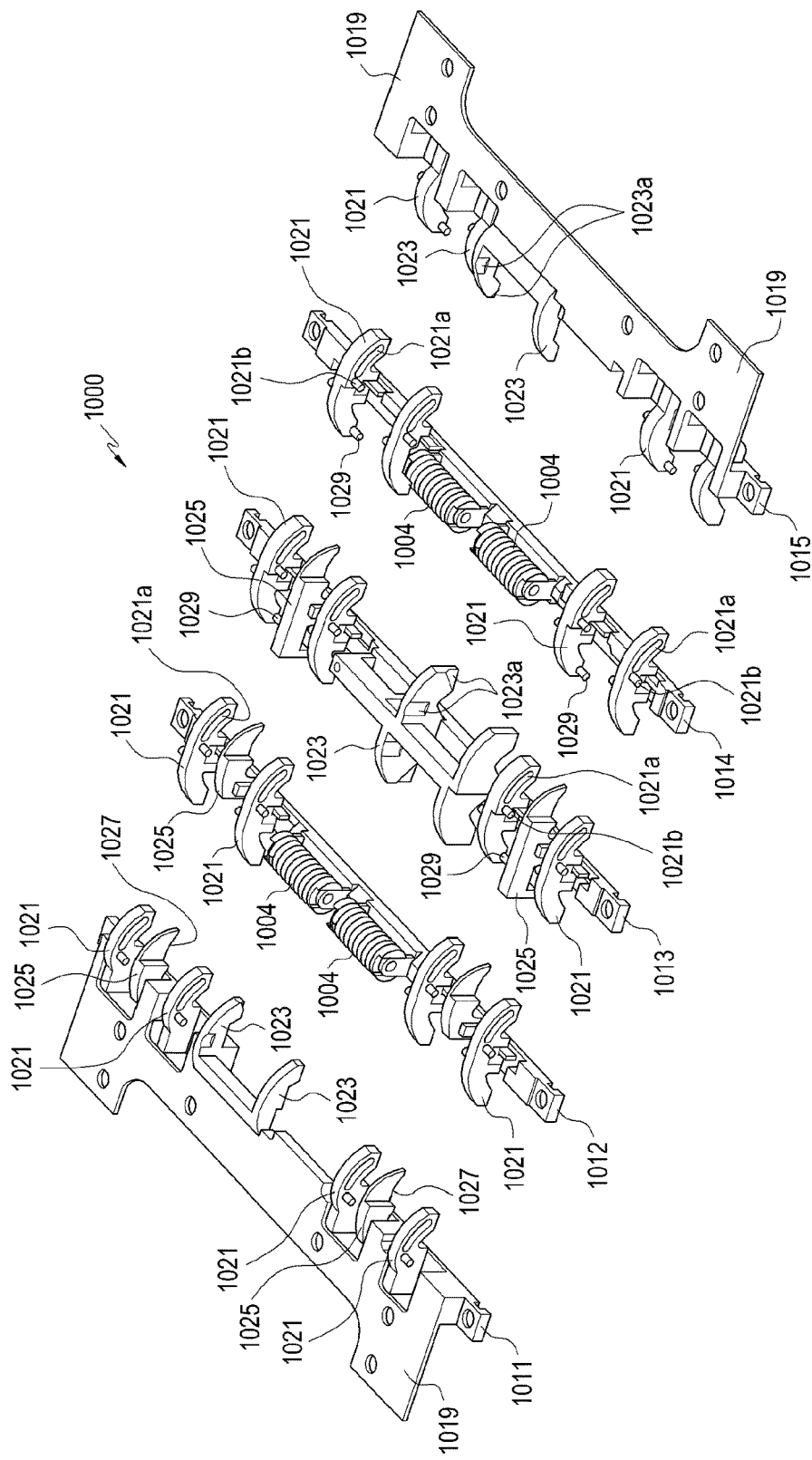
FIG. 60 is an exploded perspective view illustrating a connection unit in another example of the electronic device according to various embodiments of the present disclosure.
Figure 61:
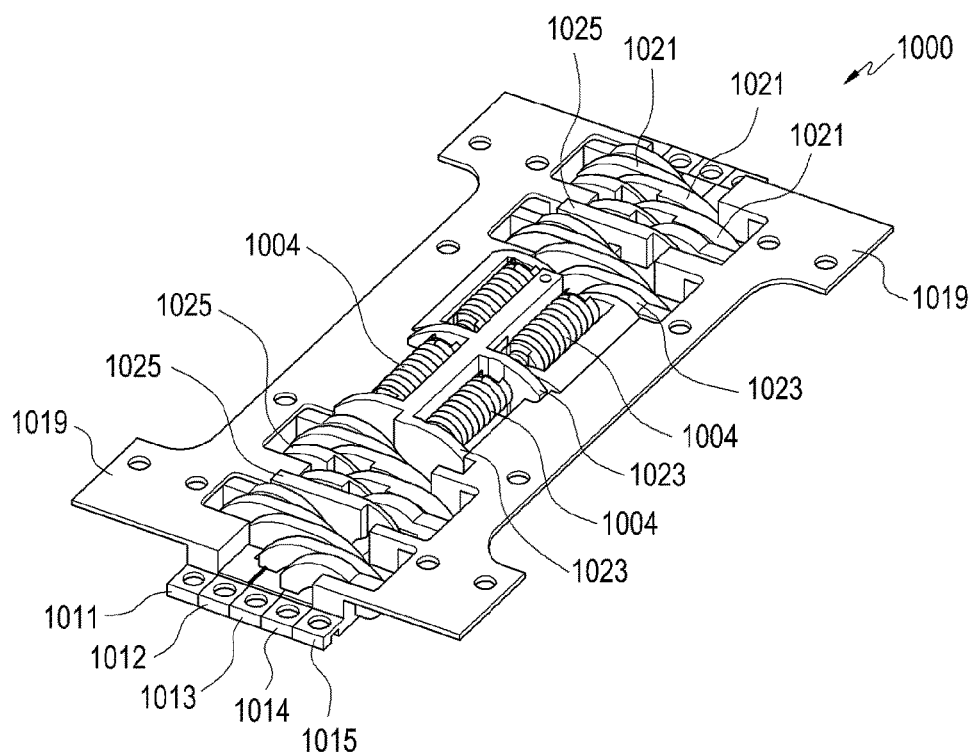
FIG. 61 is a perspective view illustrating the connection unit in another example of the electronic device according to various embodiments of the present disclosure.
Figure 62:
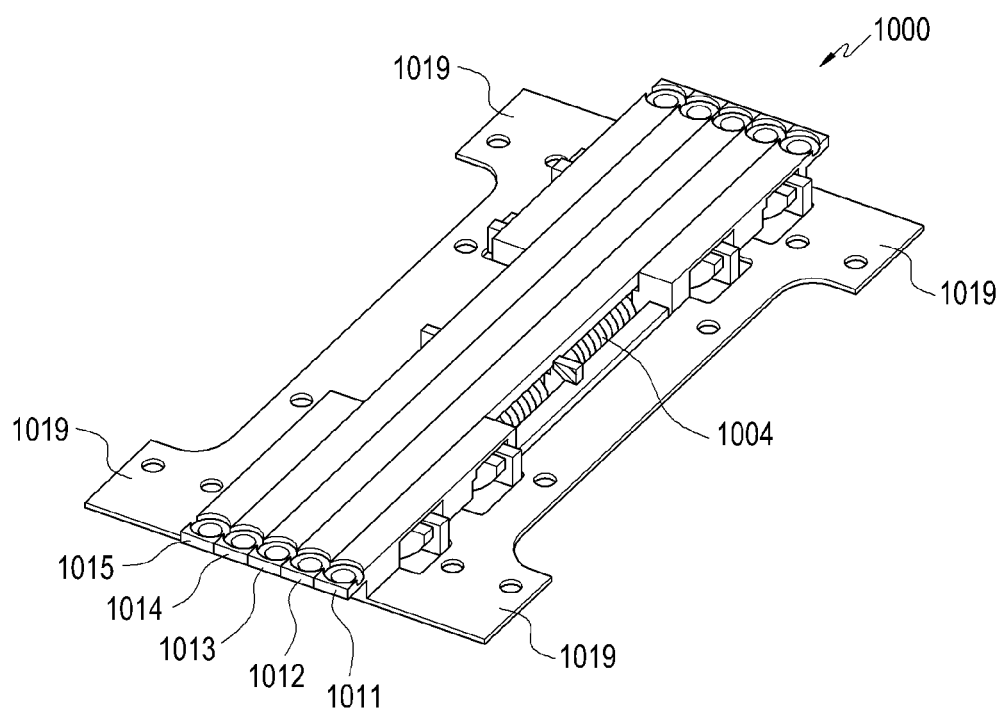
FIG. 62 is a perspective view illustrating the connection unit in another example of the electronic device according to various embodiments of the present disclosure, seen from a different direction.

FIG. 60 is an exploded perspective view illustrating another exemplary connection unit 1000 in the electronic device according to various embodiments of the present disclosure, FIG. 61 is a perspective view illustrating the connection unit 1000 in the electronic device according to various embodiments of the present disclosure, and FIG. 62 is a perspective view illustrating the connection unit 1000 in the electronic device according to various embodiments of the present disclosure, seen from a different direction.

Referring to FIGS. 60, 61, and 62, the connection unit 1000 (for example, the connection unit 901c in FIG. 55 or FIG. 58) may include a plurality of (for example, five) hinge members 1011, 1012, 1013, 1014, and 1015, a locking device structure including locking members 1014, and a rotation regulator for restricting relative movements of the hinge members 1011, 1012, 1013, 1014, and 1015.

The hinge members may include a first hinge member 1011, a second hinge member 1012, a third hinge member 1013, a fourth hinge member 1014, and a fifth hinge member 1015. The first hinge member 1011 may be mounted in a first part (for example, the first part 901a of FIG. 55) of a housing, and engaged with the second hinge member 1012 to be movable relative to the second hinge member 1012. The fifth hinge member 1015 may be mounted in a second part (for example, the second part 901b of FIG. 55) of the housing, and engaged with the fourth hinge member 1014 to be movable relative to the fourth hinge member 1014. The third hinge member 1013 may connect the second and fourth hinge members 1012 and 1014 to each other, and may be movable relative to the second and fourth hinge members 1012 and 1014. For example, the hinge members 1011, 1012, 1013, 1014, and 1015 may be sequentially arranged between the first and second parts of the housing, and engaged with their adjacent hinge members, movably relative to the adjacent hinge members. Each of the first and fifth hinge members 1011 and 1015 may include an engagement member 1019 for engaging with the first or second part of the housing.

According to an embodiment, each of the hinge members 1011, 1012, 1013, 1014, and 1015 may move relative to an adjacent hinge member in an angle range of about 45 degrees. In an embodiment, each of the hinge members 1011, 1012, 1013, 1014, and 1015 may move relative to an adjacent hinge member at up to 46 degrees. When each of the hinge members 1011, 1012, 1013, 1014, and 1015 makes a relative movement at a maximum angle from a position in which the hinge members 1011, 1012, 1013, 1014, and 1015 form a flat surface, the second part of the housing may move relative to the first part in an angle range exceeding 180 degrees (for example, 184 degrees). For example, as illustrated in FIG. 57, in the state where the housing is folded so that the first part 901a may face the second part 901b, end portions of the first and second parts 901a and 901b (for example, end portions remote from the connection unit 901c or 10000) may contact each other.

According to various embodiments, the connection unit 1000 may include first link members 1021 to engage each of the hinge members 1011, 1012, 1013, 1014, and 1015 with an adjacent hinge member to be relatively movable. The first link members 1021 may be disposed on the hinge members 1011, 1012, 1013, 1014, and 1015, and each of the first link members 1021 may include a guide hole 1021a and a guide pin 1021b. The single guide pin 1021b may be inserted into the guide hole 1021a of an adjacent hinge member and move along the guide hole 1021a. For example, a guide pin 1021b disposed in the first hinge member 1011 may be inserted into a guide hole 1021a disposed in the second hinge member 1012, and move along the guide hole 1021a when the second hinge member 1012 moves relative to the first hinge member 1011. A guide pin(s) 1021b disposed in the third hinge member 1013 may be inserted into a guide hole(s) 1021a disposed in the second hinge member 1012 or the fourth hinge member 1014. The guide hole(s) 1021a may restrict a range in which the guide pin(s) 1021b is movable. The guide holes 1021a may restrict relative movements of the hinge members 1011, 1012, 1013, 1014, and 1015 to about 45 degrees (for example, 46 degrees).

In an embodiment, the guide hole(s) 1021a and the guide pin(s) 1021b may be provided on both surfaces of the first link members 1021. For example, when a guide hole 1021a and a guide pin 1021b are formed on one surface of a first link member 1021 in the third hinge member 1013 and engaged with a guide pin 1021b and a guide hole 1021a of a first link member 1021 in the second hinge member 1012, another guide hole and another guide pin may be disposed on the other surface of the first link member in the third hinge member 1013 and thus engaged with a guide pin and a guide hole of a first link member 1021 in the fourth hinge member 1014. In another embodiment, since the first hinge member 1011 is fixed to the first part of the housing and the fifth hinge member 1015 is fixed to the second part of the housing, each of the first link members 1021 disposed in the first and fifth hinge members 1011 and 105 may have a guide hole 1021a and a guide pin 1021b only on one surface thereof. For example, the number and positions of the guide holes 1021a and the guide pins 1021b may vary according to the position of a hinge member in which the first link member 1021 is mounted.

According to various embodiments, since the connection unit 1000 includes a locking device structure, each of the hinge members 1011, 1012, 1013, 1014, and 1015 may be kept stationary at a predetermined angle position with respect to an adjacent hinge member. For example, two adjacent hinge members may kept stationary, by means of the locking device structure, in positions where the hinge members are arranged, forming the shape of a plate (for example, a flat surface) and positions where the hinge members make relative movements at about 45 degrees (for example, 46 degrees) with respect to each other. According to an embodiment, the locking device structure may include the locking member(s) 1004 and a second link member(s) 1023. The locking members 1004 and the second link members 1023 may be arranged respectively in adjacent hinge members. For example, the link members 1023 may be disposed in the first hinge member 1011, the third hinge member 1023, and/or the fifth hinge member 1015, and the locking members 1004 may be disposed in the second hinge member 1012 and/or the fourth hinge member 1014. In another embodiment, when at least one locking member 1004 is disposed in the third hinge member 1013, a second link member(s) may be disposed in each of the second and fourth hinge members 1012 and 1014.

In an embodiment, each of the second link members 1023 disposed in the first hinge member 1011 may be arranged in correspondence with one of the locking members 1004 disposed in the second hinge member 1012. Each of the second link members 1023 disposed in the third hinge member 1013 may be arranged in correspondence with one of the locking members 1004 disposed in the fourth hinge member 1014. As described before with reference to FIG. 16, one locking member may include two balls. For example, in FIG. 60, one locking member 1004 may be disposed in correspondence with two second link members 1023.

According to various embodiments, the second link member(s) 1023 may include a plurality of locking recesses 1023a. When two adjacent hinge members reach predetermined angle positions, one of the locking recesses 1023a may be engaged with the locking member 1004. For example, the locking member 1014 may include a plurality of reciprocating members and a plurality of balls supported by an elastic member, similarly to the locking member illustrated in FIG. 16. When the two adjacent hinge members reach positions where they form a plate or are at about 45 degrees with respect to each other, the ball(s) of the locking member 1004 may be engaged with one of the locking recesses 1023a. According to an embodiment, one of the locking recesses 1023 a may be engaged with the locking member 1004 in a position where the two hinge members form a flat surface and a position where the hinge members make relative movements at about 45 degrees with respect to each other, in the above locking device structure. For example, a pair of locking recesses 1023a may be formed in one second link member 1023. In another embodiment, one of the locking recesses 1023a may be engaged with the locking member 1004 in a position where the two hinge members form a flat surface, a position where the hinge members make relative movements at about 22 degrees with respect to each other, and a position where the hinge members make relative movements at about 45 degrees with respect to each other, in the above locking device structure. For example, three locking recesses 1023a may be formed in one second link member 1023. In this manner, the number of locking recesses 1023a, and an angle position in which one of the locking recesses 1023a is engaged with a locking member 1004 may vary according to the specification of an electronic device and so on.

According to various embodiments, a rotation regulator of the connection unit 1000 may include a restraining member 1025 formed in at least a part of the hinge members 1011, 1012, 1013, 1014, and 1015, and an interference member 1029 formed in at least a part of the hinge members 1011, 1012, 1013, 1014, and 1015. For example, the restraining member 1025 is formed in the first hinge member 1011, the second hinge member 1012, and/or the third hinge member, and the interference member 1029 may be formed in the third hinge member 1013, the fourth hinge member 1014, and/or the fifth hinge member 1015. In an embodiment, the interference member 1029 may be formed in the first link member 1021. According to an embodiment, the restraining member 1025 formed in the first hinge member 1011 may correspond to the interference member 1029 formed in the third hinge member 1013, the restraining member 1025 formed in the second hinge member 1012 may correspond to the interference member 1029 formed in the fourth hinge member 1013, and the restraining member 1025 formed in the third hinge member 1013 may correspond to the interference member 1029 formed in the fifth hinge member 1015. While the rotation regulator includes an avoidance recess (for example, the avoidance recess 421b-2) by way of example in the foregoing embodiment, this should not be construed as limiting the present disclosure. For example, when the restraining members 1025 and/or the interference members 1029 are formed at a predetermined height in the hinge members 1011, 1012, 1013, 1014, and 1015, there is no need for forming an avoidance recess.

In the structure of the first, second, and third hinge members 1011, 1012, and 1013, the above-described rotation regulator may restrict or allow movement (pivoting) of the first hinge member 1011 to a position inclined to the second hinge member 1012 earlier than the third hinge member 1013, from a position in which the hinge members form a flat surface. The rotation regulator may restrict or allow movement (pivoting) of the third hinge member 1013 to a position flat with the second hinge member 1012 earlier than the first hinge member 1011, from a position in which the hinge members 1011, 1012, and 1013 form a curved surface. Similarly, in the state where the second, third, and fourth hinge member 1012, 1013, and 1014 form a flat surface, the second hinge member 1012 may first move relative to the third hinge member 1013, whereas in the state where the third, fourth, and fifth hinge member 1013, 1014, and 1015 form a flat surface, the third hinge member 1013 may first move relative to the fourth hinge member 1014. For example, in the state where the connection unit 1000 is a flat surface, the hinge members may sequentially make a relative movement, starting with the first hinge member 1011, and the fourth hinge member 1014 may make a relative movement with respect to the fifth hinge member 1015 in the last place. Thus the hinge members may be arranged forming a curved surface. In the state where the connection unit 1000 is a curved surface (for example, the housing of the electronic device is folded as illustrated in FIG. 57), the hinge members may sequentially make a relative movement, starting with the fifth hinge member 1015, and the second hinge member 1012 may make a relative movement with respect to the first hinge member 1011 in the last place. Thus the hinge members may be arranged forming a flat surface.

A detailed description will be given of an operation of the connection unit 1000 by the foregoing rotation regulator.

Figure 63:
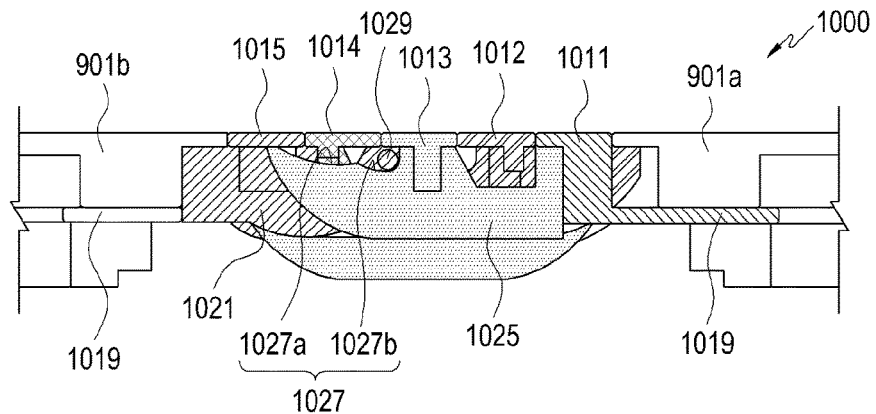
FIGS. 63, 64, and 65 are views illustrating different cut parts of the connection unit in another example of the electronic device in the unfolded state according to various embodiments of the present disclosure, seen from a different direction.
Figure 64:
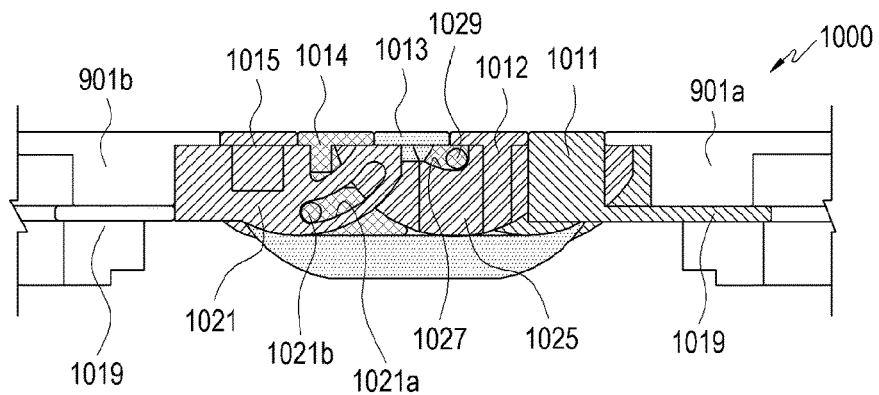
Figure 65:
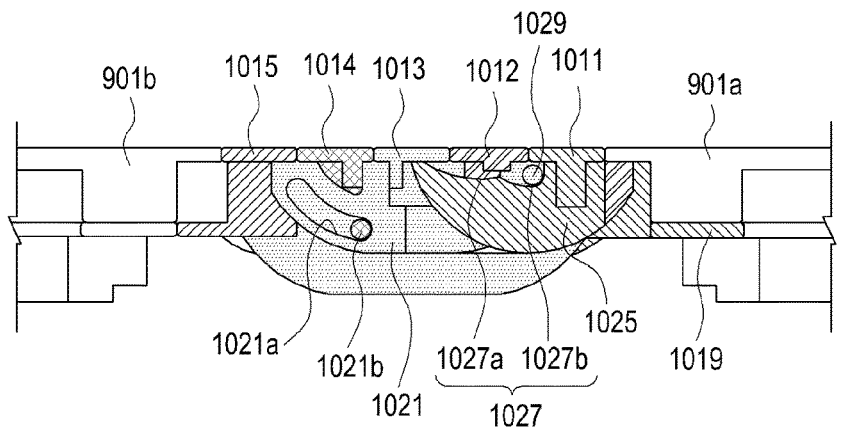

FIGS. 63, 64, and 65 are views illustrating different cut parts of the connection unit 1000 in the state where another example of the electronic device is unfolded according to various embodiments of the present disclosure.

Referring to FIGS. 63, 64, and 65, the restraining member 1025 may include a guide recess 1027 contacting the interference member 1029. The guide recess 1027 may include a first portion 1027a and a second portion 1027b. According to the angle position of each of the hinge members 1011, 1012, 1013, 1014, and 1015 with respect to an adjacent hinge member, the interference member 1029 may be positioned in one of the first and second portions 1027a and 1027b.

Referring to FIG. 63, in the state where the connection unit 1000 (for example, the connection unit 901c in FIG. 55) is flat, the interference member 1029 of the fifth hinge member 1015 is positioned in the second portion 1027b of the restraining member 1025 of the third hinge member 1013. For example, for the fifth hinge member 1015 to move relative to the fourth hinge member 1014, the interference member 1029 of the fifth hinge member 1015 can have a space in which the interference member 1029 may pivot around the fourth hinge member 1014. However, the interference member 1029 of the fifth hinge member 1015 is restrained by the restraining member 1025 of the third hinge member 1013, thereby restricting the movement of the fifth hinge member 1015 relative to the fourth hinge member 1014.

Referring to FIG. 64, in the state where the connection unit 1000 is flat, the interference member 1029 of the fourth hinge member 1014 is positioned in the second portion 1027b of the restraining member 1025 of the second hinge member 1012. For example, for the fourth hinge member 1014 to move relative to the third hinge member 1013, the interference member 1029 of the fourth hinge member 1014 can have a space in which the interference member 1029 may pivot around the third hinge member 1013. However, the interference member 1029 of the fourth hinge member 1014 is restrained by the restraining member 1025 of the second hinge member 1012, thereby restricting the movement of the fourth hinge member 1014 relative to the third hinge member 1013.

Referring to FIG. 65, in the state where the connection unit 1000 is flat, the interference member 1029 of the third hinge member 1013 is positioned in the second portion 1027b of the restraining member 1025 of the first hinge member 1011. For example, for the third hinge member 1013 to move relative to the second hinge member 1012, the interference member 1029 of the third hinge member 1013 can have a space in which the interference member 1029 may pivot around the second hinge member 1012. However, the interference member 1029 of the third hinge member 1013 is restrained by the restraining member 1025 of the first hinge member 1011, thereby restricting the movement of the third hinge member 1013 relative to the second hinge member 1012.

According to an embodiment, the first and second hinge members 1011 and 1012 may not have an interference member 1029, and may move relative to each other, relatively freely without restriction of a rotation regulator. However, as described before, the first hinge member 1011 may be kept stationary with respect to the second hinge member 1012, at a predetermined angle position (for example, in a position where the first and second link members 1011 and 1012 form a flat surface or in a position where the first and second link members 1011 and 1012 are at about 45 degrees with respect to each other) by means of a locking device structure (for example, the second link member 1023 disposed in the first hinge member 1011 and the locking member 1004 disposed in the second hinge member 1012).

Figure 66:
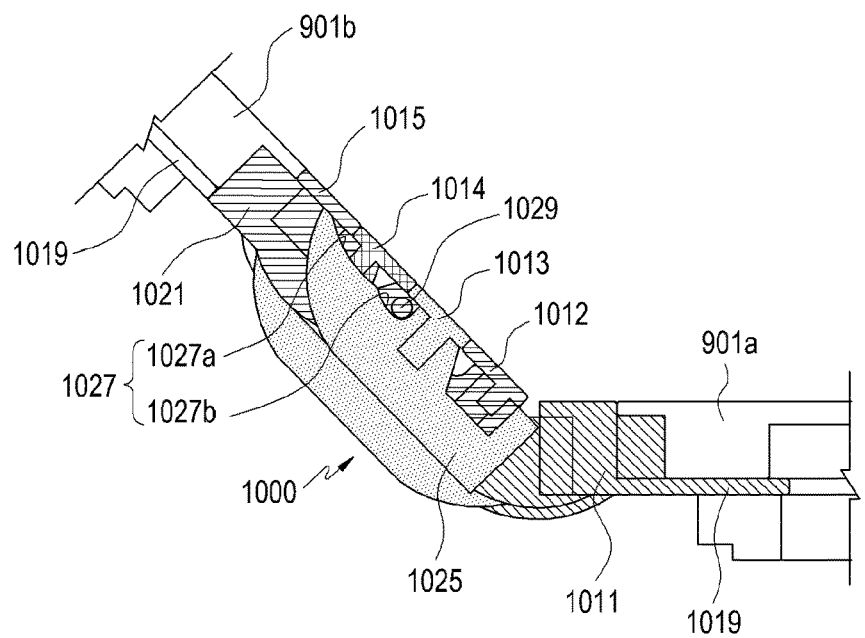
FIGS. 66, 67, and 68 are views illustrating different cut parts of the connection unit in another example of the electronic device bent at about 135 degrees according to various embodiments of the present disclosure, seen from a different direction.
Figure 67:
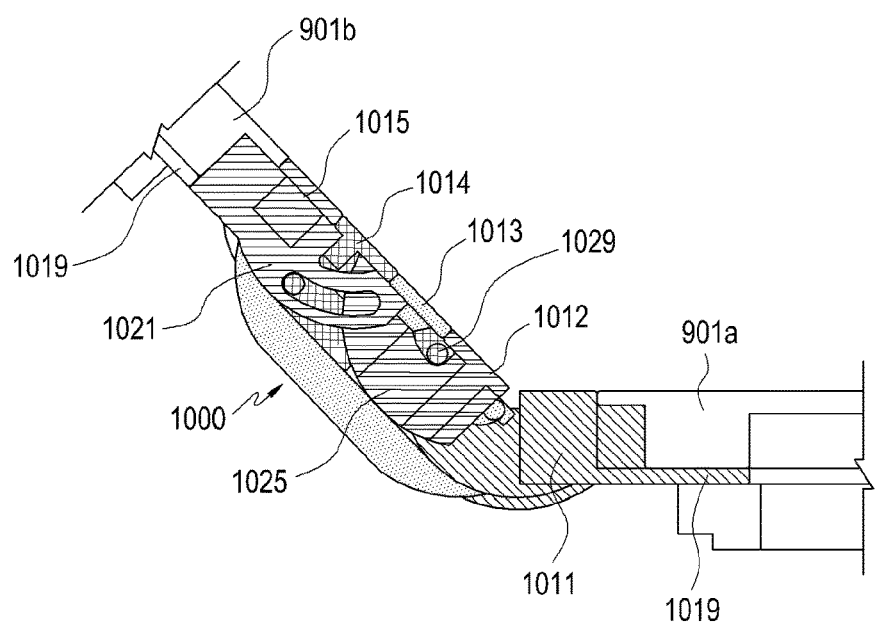
Figure 68:
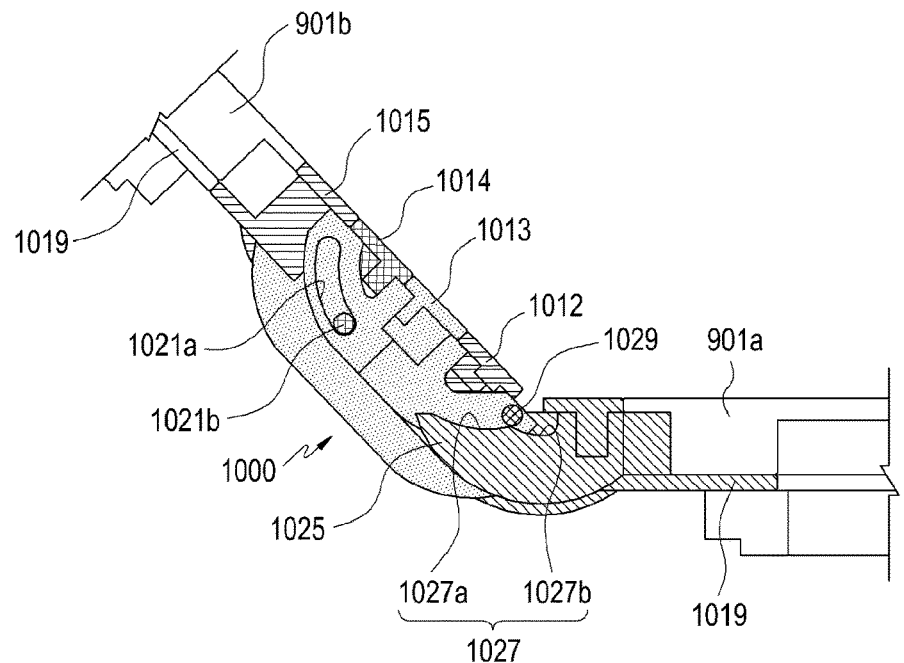

FIGS. 66, 67, and 68 are views illustrating different cut parts of the connection unit 1000 in the state where another example of the electronic device is folded at about 135 degrees according to various embodiments of the present disclosure.

In FIGS. 66, 67, and 68, the connection unit 1000, for example, the first and second parts of the electronic device are bent at about 135 degrees (for example, 138 degrees). For example, when the first and second parts of the electronic device are bent at about 135 degrees, the first hinge member 1011 has moved relative to the second hinge member 1012 at about 45 degrees (for example, 46 degrees), and the second, third, fourth, and fifth hinge members 1012, 1013, 1014, and 1015 may be arranged to form a plate. For example, when the first and second parts of the electronic device are bent at about 135 degrees, the second, third, fourth, and fifth hinge members 1012, 1013, 1014, and 1015 may be inclined to the first hinge member 1011.

As described before, in the state where the connection unit 1000 is flat, relative movements of the third, fourth, and fifth hinge members 1013, 1014, and 1015 may be restricted, and the first and second hinge members 1011 and 1012 kept stationary with respect to each other by the above-described locking device structure (for example, the locking member 1004) may make relative movements relatively freely by an external force (for example, user manipulation). For example, when an external force is applied in the state where the connection unit 1000 is flat, the first hinge member 1011 may first move relative to the second hinge member 1012 (or the second hinge member 1012 may first move relative to the first hinge member 1011) among the hinge members 1011, 1012, 1013, 1014, and 1015.

Referring to FIG. 66, in the state where the connection unit 1000 is transformed so that the first and second parts of the electronic device are at about 135 degrees, the interference member 1029 of the fifth hinge member 1015 is positioned in the second portion 1027*b* of the restraining member 1025 of the third hinge member 1013. For example, as the interference member 1029 of the fifth hinge member 1015 is restrained by the restraining member 1025 of the third hinge member 1013, movement of the fifth hinge member 1015 relative to the fourth hinge member 1014 may be restricted.

Referring to FIG. 67, in the state where the connection unit 1000 is transformed so that the first and second parts of the electronic device are at about 135 degrees (for example, 138 degrees), the interference member 1029 of the fourth hinge member 1014 is positioned in the second portion 1027*b* of the restraining member 1025 of the second hinge member 1012. For example, as the interference member 1029 of the fourth hinge member 1014 is restrained by the restraining member 1025 of the second hinge member 1013, movement of the fourth hinge member 1014 relative to the third hinge member 1013 may be restricted.

Referring to FIG. 68, in the state where the connection unit is transformed so that the first and second parts of the electronic device are at about 135 degrees (for example, 138 degrees), the interference member 1029 of the third hinge member 1013 has moved to a position in which it can enter the first portion 1027*a* on the restraining member 1025 of the first hinge member 1011. For example, while the second hinge member 1012 is moving relative to the first hinge member 1011, the interference member 1029 of the third hinge member 1013 may move along the second portion 1027*b* and thus may be positioned at least partially in the first portion 1027*a*. For example, the second portion 1027*b* of the first hinge member 1011 may be formed along a trajectory in which while the second hinge member 1012 is moving relative to the first hinge member 1011, the interference member 1029 of the third hinge member 1013 moves.

According to various embodiments, the first portion 1027*a* of the restraining member 1025 disposed in the first hinge member 1011 may be formed along a trajectory in which the interference member 1029 of the third hinge member 1013 moves while the third hinge member 1013 makes a relative movement with respect to the second hinge member 1012. For example, in the state where the first and second hinge members 1011 and 1012 move relative to each other at about 45 degrees, the third hinge member 1013 may transition to a state in which the third hinge member 1013 can move relative to the second hinge member 1012 (for example, a state in which the interference member 1029 of the third hinge member 1013 can enter the first portion 1027*a*).

According to an embodiment, when the first hinge member 1011 and the second hinge member 1012 move relative to each other at about 45 degrees, the third hinge member 1013 may be movable relative to the second hinge member 1012, and the first and second hinge members 1011 and 1012 may be movable relative to each other in a direction in which they form a plate.

Figure 69:
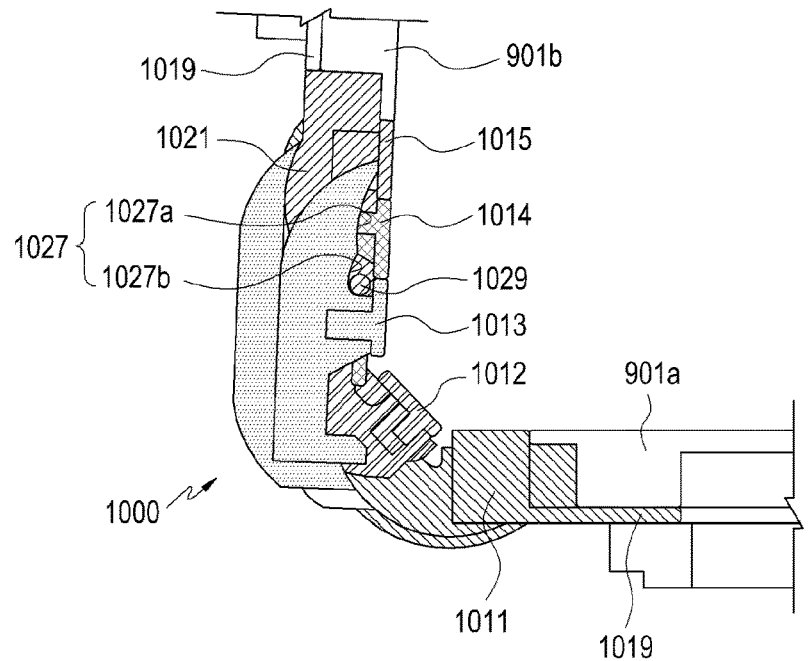
FIGS. 69, 70, and 71 are views illustrating different cut parts of the connection unit in another example of the electronic device bent at about 90 degrees according to various embodiments of the present disclosure, seen from a different direction.
Figure 70:
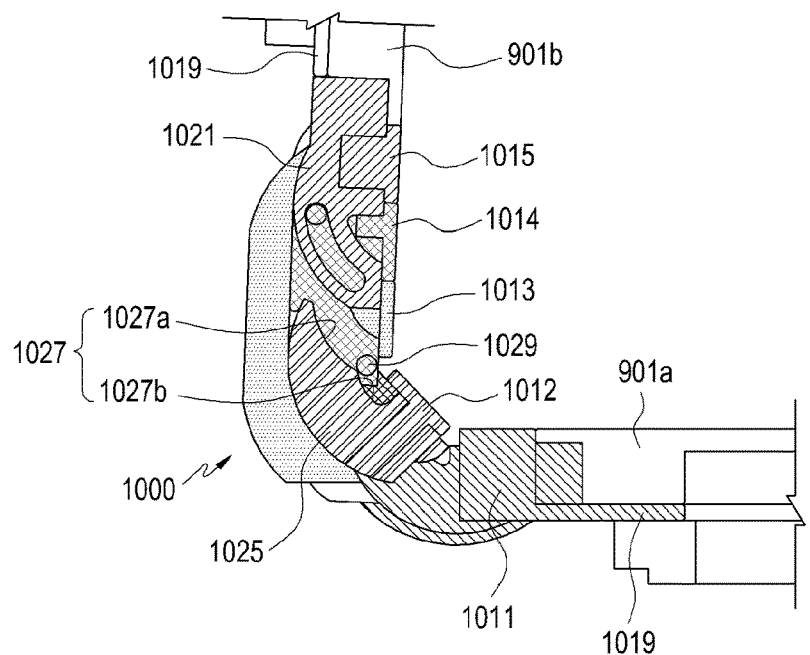
Figure 71:
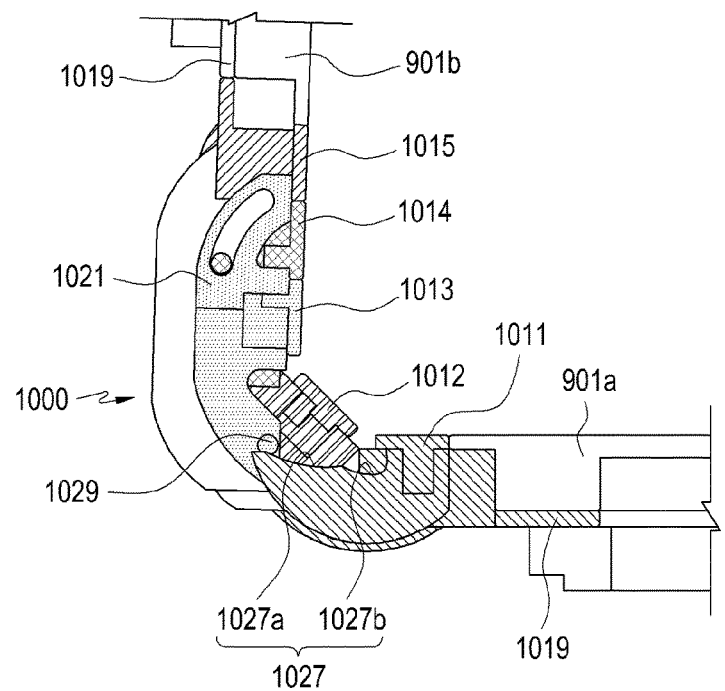

FIGS. 69, 70, and 71 are views illustrating different cut parts of the connection unit 1000 in the state where another example of the electronic device is bent at about 90 degrees according to various embodiments of the present disclosure.

In FIGS. 69, 70, and 71, the connection unit 1000, for example, the first and second parts of the electronic device illustrated in FIG. 54 are bent at about 90 degrees (for example, 92 degrees). For example, when the first and second parts of the electronic device are bent at about 90 degrees, the first hinge member 1011 has moved relative to the second hinge member 1012 at about 45 degrees (for example, 46 degrees), the second hinge member 1012 has moved relative to the third hinge member 1013 at about 45 degrees (for example, 46 degrees), and the third, fourth, and fifth hinge members 1013, 1014, and 1015 may be arranged to form a plate. For example, when the first and second parts of the electronic device are bent at about 90 degrees, the second hinge member 1012 may be inclined to the first hinge member 1011, and the third, fourth, and fifth hinge members 1013, 1014, and 1015 may be inclined to the second hinge member 1012.

Referring to FIG. 69, in the state where the connection unit 1000 is transformed so that the first and second parts of the electronic device are at about 90 degrees (for example, 92 degrees) with respect to each other, the interference member 1029 of the fifth hinge member 1015 is positioned in the second portion 1027b of the restraining member 1025 of the third hinge member 1013. For example, as the interference member 1029 of the fifth hinge member 1015 is restrained by the restraining member 1025 of the third hinge member 1013, movement of the fifth hinge member 1015 relative to the fourth hinge member 1014 may be restricted.

Referring to FIG. 70, in the state where the connection unit 1000 is transformed so that the first and second parts of the electronic device are at about 90 degrees (for example, 92 degrees) with respect to each other, the interference member 1029 of the fourth hinge member 1014 has moved to a position in which the interference member 1029 may enter the first portion 1027a of the restraining member 1025 of the second hinge member 1012. For example, while the third hinge member 1013 is moving relative to the second hinge member 1012, the interference member 1029 of the fourth hinge member 1014 may move along the second portion 1027b and thus may be positioned at least partially in the first portion 1027a. For example, the second portion 1027b may be formed along a trajectory in which the interference member 1029 of the fourth hinge member 1014 moves while the third hinge member 1013 moves relative to the second hinge member 1012.

According to various embodiments, the first portion 1027a of the restraining member 1025 disposed in the second hinge member 1012 may be formed along a trajectory in which the interference member 1029 of the fourth hinge member 1014 moves while the fourth hinge member 1014 moves relative to the third hinge member 1013. For example, in the state where the second and third hinge members 1012 and 1012 have moved relative to each other at about 45 degrees, the fourth hinge member 1014 may be transitioned to a state where the fourth hinge member 1014 is movable relative to the third hinge member 1013 (for example, the interference member 1029 of the fourth hinge member 1014 can enter the first portion 1027a). According to an embodiment, in the state where the second and third hinge members 1012 and 1012 have moved relative to each other at about 45 degrees, the fourth hinge member 1014 may be transitioned to a state where the fourth hinge member 1014 is movable relative to the third hinge member 1013, and the second and third hinge members 1012 and 1013 may be movable relative to each other in a direction that arranges the second and third hinge members 1012 and 1013 in the form of a flat plate.

Referring to FIG. 71, in the state where the connection unit 1000 is transformed so that the first and second parts of the electronic device are at about 90 degrees (for example, 92 degrees) with respect to each other, the interference member 1029 of the third hinge member 1013 may be positioned at one end portion of the first portion 1027a of the restraining member 1025 of the first hinge member 1011. In this state, the interference member 1029 of the third hinge member 1013 may move along the first portion 1027a until reaching a position in which the interference member 1029 can enter the second portion 1027b. For example, in the state illustrated in FIG. 71, the third hinge member 1013 may move relative to the second hinge member 1012 to a position in which the second and third hinge members 1012 and 1013 may form a plate. On the other hand, until before the interference member 1029 of the third hinge member 1013 reaches a position in which the interference member 1029 can enter the second portion 1027b, for example, in the state where the interference member 1029 of the third hinge member 1013 is positioned in the first portion 1027a, the first hinge member 1011 cannot move relative to the second hinge member 1012.

As described above, in the state where the connection unit 1000 is transformed so that the first and second parts of the electronic device are at about 90 degrees (for example, 92 degrees) with respect to each other, the fourth hinge member 1014 may make a relative movement in a direction that inclines the fourth hinge member 1014 to the third hinge member 1013, and the third hinge member 1013 may make a relative movement in a direction that arranges the second and third hinge members 1012 and 1013 in the form of a plate. According to an embodiment, in the state where the connection unit 1000 is transformed so that the first and second parts of the electronic device are at about 90 degrees (for example, 92 degrees) with respect to each other, the second, third, and fourth hinge members 1012, 1013, and 1014 may make relative movements, whereas movement of the first hinge member 1011 relative to the second hinge member 1012 or movement of the fifth hinge member 1015 relative to the fourth hinge member 1014 may be restricted.

Figure 72:
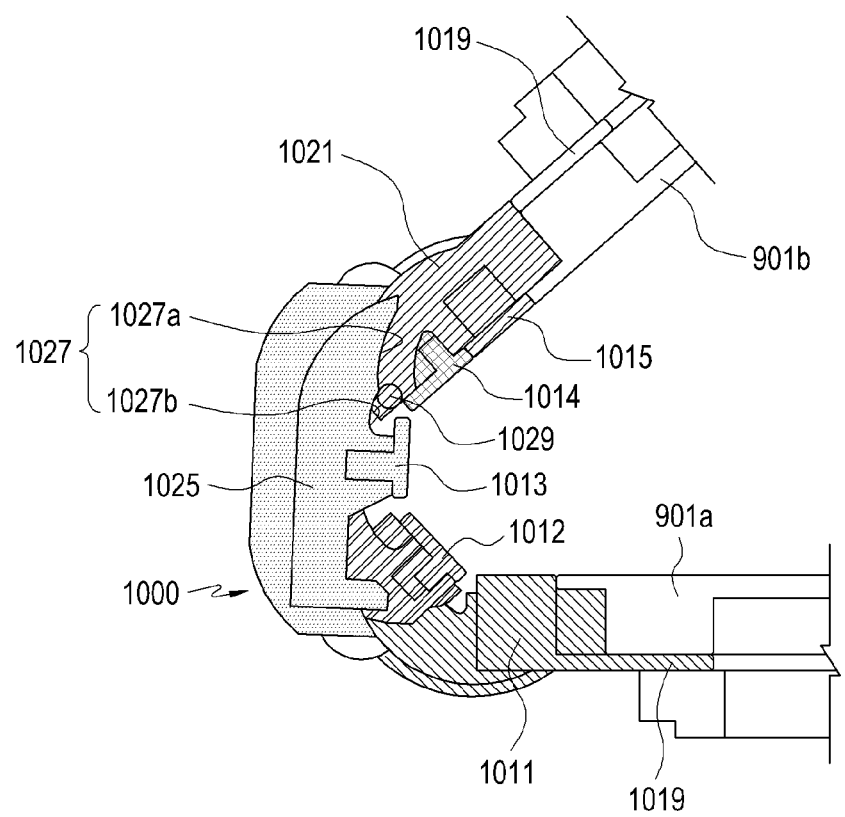
FIGS. 72, 73, and 74 are views illustrating different cut parts of the connection unit in another example of the electronic device bent at about 45° according to various embodiments of the present disclosure, seen from a different direction.
Figure 73:
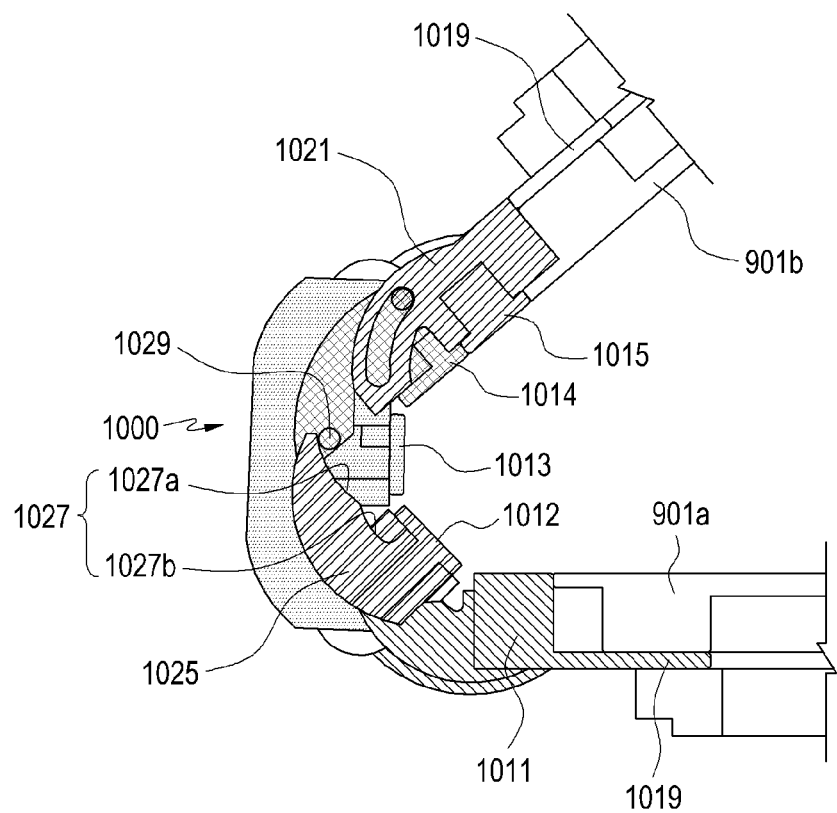
Figure 74:
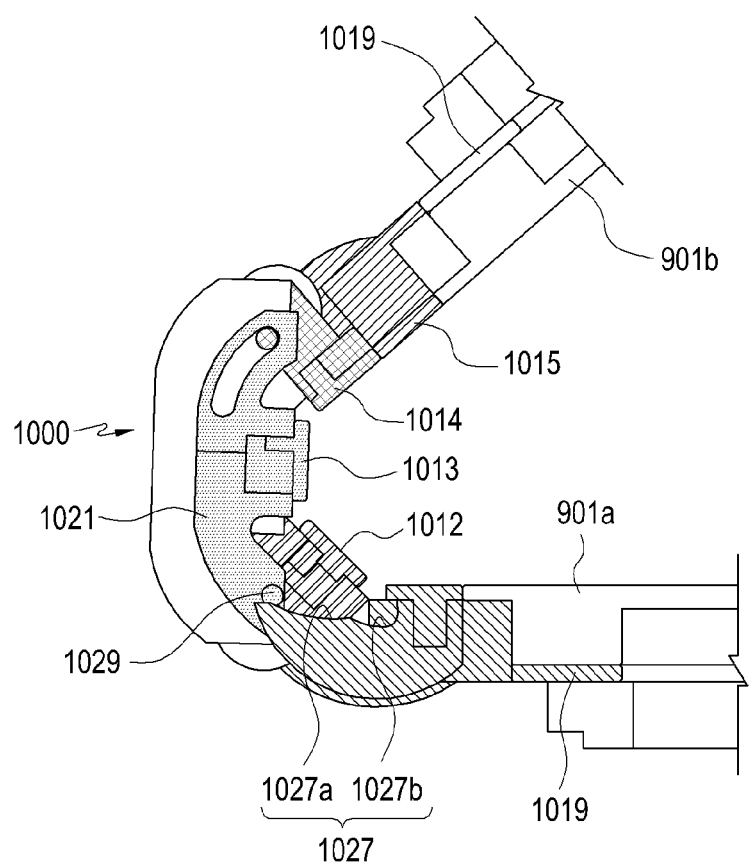

FIGS. 72, 73, and 74 are views illustrating different cut parts of the connection unit 1000 in the state where another example of the electronic device is bent at about 45 degrees according to various embodiments of the present disclosure.

Referring to FIGS. 72, 73, and 74, in the state where the connection unit 1000 is transformed so that the first and second parts of the electronic device are at about 45 degrees (for example, 46 degrees), the fifth hinge member 1015 may be transitioned to a state where it is movable relative to the fourth hinge member 1014 in a position in which the fifth hinge member 1015 and the fourth hinge member 1014 form a plate. In the state where the connection unit 1000 (for example, the connection unit 901c of FIG. 55) is transformed so that the first and second parts of the electronic device are at about 45 degrees (for example, 46 degrees), the fourth hinge member 1014 may move relative to the third hinge member 1013 (in a direction that arranges the third and fourth hinge members 1013 and 1014 in the form of a plate), whereas the interference member 1029 of the fourth hinge member 1014 may be interfered with by the restraining member 1025 of the second hinge member 1012. For example, in the state where the connection unit 1000 is transformed so that the first and second parts of the electronic device are at about 45 degrees (for example, 46 degrees), movement of the second hinge member 1012 relative to the third hinge member 1013 in a direction that arranges the second and third hinge members 1012 and 1013 in the form of a plate may be restricted. According to an embodiment, in the state where the connection unit 1000 is transformed so that the first and second parts of the electronic device are at about 45 degrees (for example, 46 degrees), like the second hinge member 1012, movement of the first hinge member 1011 relative to the second hinge member 1012 in a direction that arranges the first and second hinge members 1011 and 1012 in the form of a flat plate may be restricted.

Figure 75:
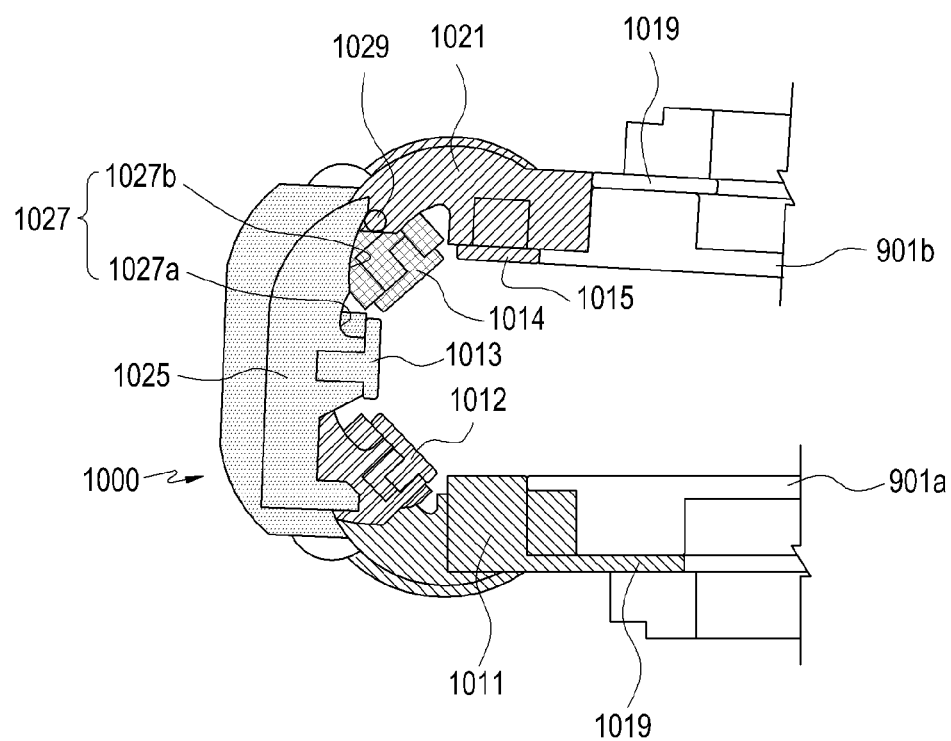
FIGS. 75, 76, and 77 are views illustrating different cut parts of the connection unit in another example of the electronic device in the folded state according to various embodiments of the present disclosure, seen from a different direction.
Figure 76:
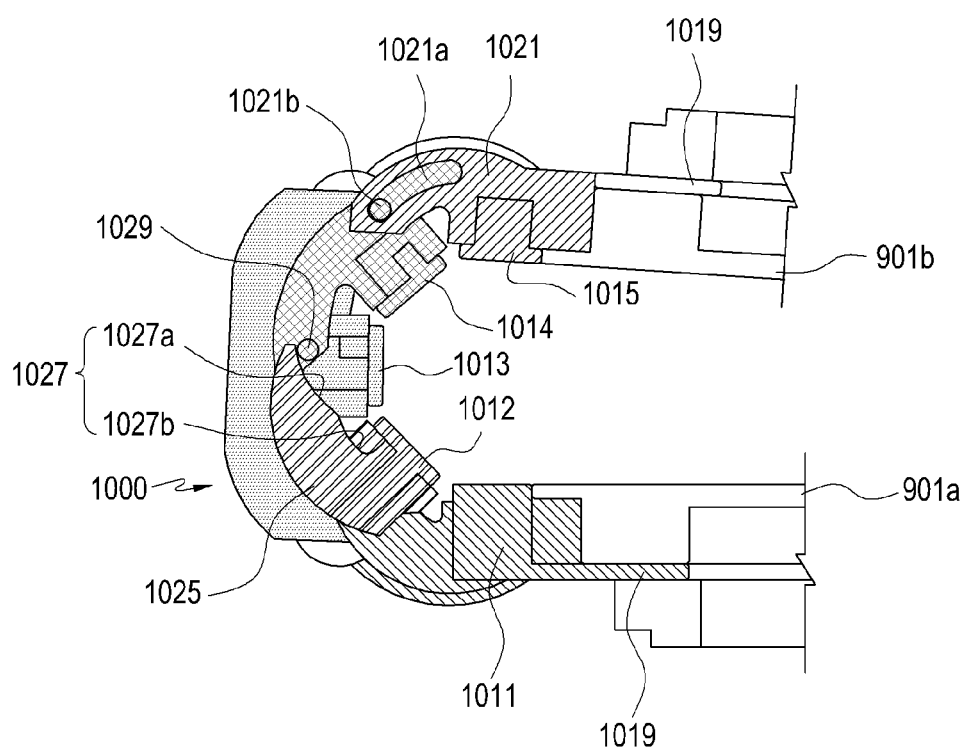

FIGS. 75, 76, and 77 are views illustrating different cut parts of the connection unit 1000 in the state where another example of the electronic device is folded according to various embodiments of the present disclosure.

Referring to FIGS. 75, 76, and 77, in the state where the connection unit 1000 is transformed so that the first and second parts of the electronic device are at about 0 degrees (for example, −4 degrees), the fifth hinge member 105 may be inclined to the fourth hinge member 1014. In this state, the fifth hinge member 1015 may move relative to the fourth hinge member 1014 in a direction that arranges the fourth and fifth hinge members 1014 and 1015 in the form of a plate. For example, the fifth hinge member 1015 may be kept stationary at a predetermined angle position with respect to the fourth hinge member 1014 by the second link member 1023 and the locking member 1004, and may move relative to the fourth hinge member 1014 (in a direction that arranges the fourth and fifth hinge members 1014 and 1015 in the form of a plate) by an external force (for example, user manipulation).

According to an embodiment, in the state where the connection unit 1000 is transformed so that the first and second parts of the electronic device are at about 0 degrees (for example, −4 degrees), the interference member 1029 of the fifth hinge member 1015 is interfered with by the restraining member 1025 of the third hinge member 1013, thus restricting movement of the third hinge member 1013 relative to the fourth hinge member 1014. Similarly, in the state where the connection unit 1000 is transformed so that the first and second parts of the electronic device are at about 0 degrees (for example, −4 degrees), the interference member 1029 of the fourth hinge member 1014 is interfered with by the restraining member 1025 of the second hinge member 1012, thus restricting movement of the second hinge member 1012 relative to the third hinge member 1013, and the interference member 1029 of the third hinge member 1013 is interfered with by the restraining member 1025 of the first hinge member 1011, thus restricting movement of the first hinge member 1011 relative to the second hinge member 1012.

While the operation of the connection unit 1000 has been described schematically in the embodiments of FIGS. 72 to 77, the operations of the hinge members 1011, 1012, 1013, 1014, and 1015 during folding and unfolding of the connection unit 1000 may readily be understood with reference to the embodiments of FIGS. 63 to 71.

As described above, the rotation regulator of the connection unit 1000 may enable sequential relative movements of the first to fourth hinge members 1011 to 1014, when the electronic device and/or the housing is folded. In an embodiment, when the folded electronic device and/or housing is unfolded to be flat, the rotation regulator of the connection unit 1000 may enable sequential relative movements in the order of the fifth to second hinge members 1015 to 1012. For example, an arrangement area of the first hinge member 1011 to an arrangement area of the fifth hinge member 1015 may be bent gradually to a curved surface during folding, and the arrangement area of the fifth hinge member 1015 to the arrangement area of the first hinge member 1011 may be transformed gradually to a flat surface during unfolding.

As described above, an electronic device according to various embodiments of the present disclosure may include a foldable housing, and a flexible display disposed on the housing. The housing may include a first part including a first surface facing in a first direction, and a second surface facing in a second direction opposite to the first direction, a second part including a third surface facing in a third direction, and a fourth surface facing in a fourth direction opposite to the third direction, and a connection unit for connecting an edge of the first part to an edge of the second part. The connection unit may include a bendable fifth surface for connecting the first surface to the third surface, and a bendable sixth surface for connecting the second surface to the fourth surface. When the housing is in a folded state, the third surface may face the first surface, and when the housing is in an unfolded state, the third surface may be positioned leveled with the first surface, with the fifth surface in between. The display may be extended from the first surface to the third surface through the fifth surface, and bendable in correspondence with bending of the fifth surface. The connection unit may include a plurality of cover members extended along a fifth direction substantially parallel to the edge of the first or second part and structured to form the sixth surface. Each of the cover members may include a first extension portion and a second extension portion protruding from the first extension portion. When the housing is in the unfolded state, the first extension portion of one of the cover members may be hidden by the second extension portion of another cover member adjacent to the one cover member, among the cover members. When the housing is folded, the first extension portion of the one of the cover members may be exposed at least partially next to the second extension portion of the other cover member.

According to various embodiments, at least one of the cover members may include an outer surface and an inner surface. When seen from a section taken along a sixth direction perpendicular to the fifth direction, at least part of the outer surface may form an arc trajectory having a first curvature radius, and at least part of the inner surface may form an arc trajectory having a second curvature radius.

According to various embodiments, the first and second curvature radiuses may have centers at different positions.

According to various embodiments, the first curvature radius may be substantially equal to the second curvature radius.

According to various embodiments, when the housing is in the unfolded state, the second extension portions may be sequentially arranged, forming the sixth surface between the second surface and the fourth surface.

According to various embodiments, when the first part and the second part are inclined to each other or the housing is folded, the first extension portions and the second extension portions may be arranged alternately, forming the sixth surface between the second surface and the fourth surface.

According to various embodiments, each of the cover members may include a side surface portion extended from at least one end of the first or second extension portion.

According to various embodiments, when the housing is in the unfolded state, the side surface portions of the cover members may be arranged in a direction forming a non-right angle with respect to the fifth surface.

According to various embodiments, the connection unit may further include a plurality of hinge members extended along a fifth direction substantially parallel to the edge of the first or second part. The hinge members may be arranged along a sixth direction perpendicular to the fifth direction, forming the fifth surface.

According to various embodiments, the connection unit may further include first link members each for engaging at least one pair of hinge members to be movable relative to each other.

According to various embodiments, the connection unit may further include a second link member mounted to a first hinge member being one of the hinge members, and extended over a second hinge member being another hinge member adjacent to the first hinge member, and a locking member mounted to the second hinge member. During folding or unfolding of the housing, the locking member may rub against the second link member.

According to various embodiments, the connection unit may further include a plurality of first locking recesses formed on the second link member, and a ball provided in the locking member and closely contacting the second link member by receiving an elastic force. The first locking recesses may be arranged on one surface of the second link member, along a fictional trajectory of the ball.

According to various embodiments, the connection unit may further include an elastic member mounted to a first hinge member being one of the hinge members, and a guide pin mounted to a second hinge member being another hinge member adjacent to the first hinge member. The elastic member may be extended over the second hinge member, and rub against the guide pin during unfolding or folding of the housing.

According to various embodiments, the connection unit may further include a plurality of second locking recesses formed on the electric member. During folding or unfolding of the housing, the guide pin may be mounted in one of the second locking recesses and hold the second part at a predetermined angle position with respect to the first part.

According to various embodiments, the connection unit may further include at least one rotation regulator provided over three sequentially arranged hinge members among the hinge members. The rotation regulator may include an interference member protruding from a first hinge member among the three hinge members in the sixth direction, and a restraining member protruding from a third hinge member disposed in parallel to the first hinge member with a second hinge member among the three hinge members in between. The restraining member may protrude toward the first hinge member, and when the housing is unfolded, restrain the interference member on the second hinge member.

According to various embodiments, the rotation regulator may further include an avoidance recess formed in the second hinge member and corresponding to the interference member. When the housing is in the unfolded state, the restraining member may restrain the interference member in the avoidance recess.

According to various embodiments, when the housing is transformed from the unfolded state to the folded state, the third hinge member may move relative to the second hinge member and release the interference member from a restrained state, and the second hinge member may be transitioned to a state where the second hinge member is movable relative to the first hinge member.

According to various embodiments, when the housing is transformed from the folded state to the unfolded state, the interference member may interfere with the restraining member, the second hinge member may move relatively earlier than the third hinge member, and the interference member may be accommodated in the avoidance recess.

According to various embodiments, a first cover member being one of the cover members may include a first extension portion substantially symmetrical with respect to a second extension portion, when seen from a section taken along a sixth direction perpendicular to the fifth direction.

According to various embodiments, the remaining cover members may be arranged substantially symmetrical at both sides of the first cover member, when seen from the section taken along the sixth direction.

According to various embodiments, the connection unit may further include a plurality of hinge members extended along a fifth direction substantially parallel to the edge of the first or second part, and a support member formed between one of the hinge members and an inner surface of the first cover member. The hinge members may be arranged along the sixth direction perpendicular to the fifth direction, forming the fifth surface.

An electronic device according to various embodiments of the present disclosure may include a foldable housing, and a flexible display disposed on one surface of the housing. The housing may include a first part, a second part, and a connection unit for connecting the second part to the first part to be relatively movable. The connection unit may include a plurality of hinge members extended substantially in parallel to an edge of the first or second part, arranged between the first part and the second part, and forming part of the one surface of the housing. As the hinge members move relative to each other, the hinge members may connect the second part to the first part to enable relative movement of the second part with respect to the first part between a position in which the second part faces the first part and a position in which the second part is leveled next to the first part. A partial area of the display corresponding to an arrangement area of the hinge members may be transformed according to relative movements of the hinge members.

According to various embodiments, the connection unit may further include a first link member mounted to a first hinge member being one of the hinge members and extended over a second hinge member being at least one hinge member adjacent to the first hinge member among the hinge members, a guide hole extended along a predetermined trajectory and penetrating through the first link member, and a first guide pin mounted to the second hinge member, while penetrating through the guide hole. When the first hinge member and the second hinge member move relative to each other, the guide pin may move along the guide hole.

According to various embodiments, the connection unit may further include a second link member mounted to a first hinge member being one of the hinge members and extended over a second hinge member being at least one hinge member adjacent to the first hinge member among the hinge members, a plurality of first locking recesses extended along a predetermined trajectory and arranged on one surface of the second link member, and a ball disposed in the second hinge member, for advancing and receding by receiving an elastic force. When the first hinge member and the second hinge member move relative to each other, the ball may rub against one surface of the second link member, and may be engaged in one of the first locking recesses, thereby stopping a relative movement of the first or second hinge member.

According to various embodiments, the connection unit may further include at least one pair of support ribs extended from the second hinge member, facing each other, a pair of reciprocating members arranged between the support ribs to advance to and recede from each other, and an elastic member disposed between the reciprocating members. The ball may be supported by an end portion of one of the reciprocating members inside one of the support ribs, protrude outward from one of the support ribs, and rub against the second link member.

According to various embodiments, each of the reciprocating members may include an accommodation recess for accommodating part of one of the support ribs, and the ball may be supported in the accommodation recess by the reciprocating member.

According to various embodiments, the connection unit may further include an elastic member mounted to a first hinge member being one of the hinge members and extended over a second hinge member being at least one hinge member adjacent to the first hinge member among the hinge members, and a second guide pin mounted to the second hinge member. When the first hinge member and the second hinge member move relative to each other, the second guide pin may rub against the elastic member.

According to various embodiments, the connection unit may further include second locking recesses formed on the elastic member. While the first hinge member and the second hinge member move relative to each other, the second guide pin may be mounted in one of the second locking recesses and stops a relative movement between the first and second hinge members.

According to various embodiments, the connection unit may further include at least one rotation regulator provided on three sequentially arranged hinge members among the hinge members. The rotation regulator may include an interference member protruding in a sixth direction from a first hinge member among the three hinge members, and a restraining member protruding from a third hinge member disposed in parallel to the first hinge member, with a second hinge member in between, among the three hinge members. The restraining member may protrude toward the first hinge member, and when the housing is unfolded, restrain the interference member on the second hinge member.

According to various embodiments, the rotation regulator may further include an avoidance recess formed in the second hinge member and corresponding to the interference member. When the housing is in an unfolded state, the restraining member may restrain the interference member in the avoidance recess.

According to various embodiments, when the housing is transformed from an unfolded position to a folded position, the third hinge member may move relative to the second hinge member and release the interference member from a restrained state, thereby transitioning the second hinge member to a state in which the second hinge member is movable relative to the first hinge member. When the housing is transformed from the folded position to the unfolded position, the interference member may interfere with the restraining member, and the second hinge member may move relatively earlier than the third member, thereby accommodating the restraining member in the avoidance recess.

According to various embodiments, the connection unit may further include cover members forming part of the other surface of the housing opposite to the one surface of the housing, between the first part and the second part.

According to various embodiments, each of the cover members may include a first extension portion hidden from the other surface of the housing, when the first part and the second part are leveled, next to each other, and a second extension portion exposed from the other surface of the housing, when the first part and the second part are leveled, next to each other. When the first part faces the second part, part of the first extension portion may be exposed from the other surface of the housing.

According to various embodiments, when the first part faces the second part, the first extension portions and the second extension portions may be arranged alternately, forming the part of the other surface of the housing.

According to various embodiments, when the first part and the second part are leveled, next to each other, at least part of the first extension portion may be inclined to one surface or the other surface of the housing.

According to various embodiments, when seen from a section taken along a direction, at least part of an outer surface of each of the cover members may form an arc trajectory having a first curvature radius, and at least part of an inner surface of the cover member may form an arc trajectory having a second curvature radius.

According to various embodiments, the first curvature radius and the second curvature radius may have centers at different positions.

According to various embodiments, the first curvature radius and the second curvature radius may be substantially equal.

According to various embodiments, each of the cover members may include a first extension portion hidden from the other surface of the housing, when the first part and the second part are leveled, next to each other, a second extension portion exposed from the other surface of the housing, when the first part and the second part are leveled, next to each other, and side surface portions extended from both ends of the first or second extension portion, facing each other. Both ends of each of the hinge members may be fixedly mounted to the side surface portions of one of the cover members.

As is apparent from the foregoing description, an electronic device according to various embodiments of the present disclosure may suppress generation of tensile force or compressive force on one surface of a flexible display and/or a housing contacting the flexible display, while folding a first part and a second part. For example, as the surface area of the other surface of the housing (for example, a surface opposite to the one surface of the housing) is extended or contracted by means of an array of a plurality of cover members on the other surface of the housing along with folding (or unfolding) of the housing, application of an external force to the flexible display may be prevented during folding. Therefore, the electronic device according to various embodiments of the present disclosure, damage to the flexible display may be prevented, while a folding or unfolding operation is performed.

An electronic device according to various embodiments of the present disclosure may prevent deformation of a display caused by a user's touch (for example, a touch input) by supporting the flexible display using a plurality of hinge members. Further, even in the folded state, the hinge members keeps the curvature (or curvature radius) of the flexible display at a predetermined value, thereby preventing excessive deformation of the flexible display.

An electronic device according to various embodiments of the present disclosure includes a locking device structure (for example, locking members) that enables relative movement of each of a plurality of hinge members with respect to an adjacent hinge member and keeps the hinge member stationary at a predetermined angle position. Therefore, two different parts of the electronic device may be bent to various angle positions with respect to each other. For example, a user may transform the electronic device at a desired angle, for convenient use.

In an electronic device according to various embodiments of the present disclosure, a display disposed on one surface of a housing may be transformed from a flat surface to a gently curved surface, gradually from a point, during folding of the housing. During unfolding of the folded housing, the housing may be transformed from one portion of the curved surface part of the display in a direction of the other portion of the display. For example, a rotation regulator according to various embodiments of the present disclosure enables prediction of a deformed position or degree during transformation of the display to a curved surface or flat surface. Thus, a local deformation or structural fatigue degree of the display may be predicted according to repeated foldings, and a design may be made accordingly.

An electronic device according to various embodiments of the present disclosure forms a continuing flat surface or a continuing curved surface on one surface of a housing (for example, an outer surface in a folded state) by use of a plurality of cover members in combination. Therefore, the inner space of the housing or the cover members may be isolated from the outer space of the housing, or the inner space of the cover members may be hidden, when seen from the outer space.

Although the present disclosure has been described with an exemplary embodiments, various changes and modifications may be suggested to one skilled in the art. It is intended that the present disclosure encompasses such changes and modifications as fall within the scope of the appended claims.

What is claimed is:

1. An electronic device comprising:
   a foldable housing; and
   a flexible display disposed on one surface of the housing,
   wherein the housing comprises a first part, a second part, and a connection unit for connecting the second part to the first part to be relatively movable,
   wherein the connection unit comprises a plurality of hinge members extended substantially in parallel to an edge of the first or second part, arranged between the first part and the second part, and forming part of the one surface of the housing,
   wherein as the hinge members move relative to each other, the hinge members connect the second part to the first part to enable relative movement of the second part with respect to the first part between a position in which the second part faces the first part and a position in which the second part is level with the first part, and
   wherein a partial area of the display corresponding to an arrangement area of the hinge members is transformed according to relative movements of the hinge members.

2. The electronic device according to claim 1, wherein the connection unit further comprises:
   a first link member mounted to a first hinge member of the hinge members and extended over a second hinge member of the hinge members that is at least one hinge member adjacent to the first hinge member;
   a guide hole extending through the first link member; and
   a first guide pin mounted to the second hinge member and extending through the guide hole, and
   wherein when the first hinge member and the second hinge member move relative to each other.

3. The electronic device according to claim 1, wherein the connection unit further comprises:
   a second link member mounted to a first hinge member of the hinge members and extended over a second hinge member of the hinge members that is at least one hinge member adjacent to the first hinge member;
   a plurality of first locking recesses arranged on one surface of the second link member; and
   a ball disposed in the second hinge member, for advancing and receding by receiving an elastic force, and
   wherein when the first hinge member and the second hinge member move relative to each other, the ball rubs against one surface of the second link member, and is engaged in one of the first locking recesses, thereby stopping a relative movement of the first or second hinge member.

4. The electronic device according to claim 3, wherein the connection unit further comprises:
   at least one pair of support ribs extended from the second hinge member, facing each other;
   a pair of reciprocating members arranged between the support ribs to advance toward and recede from each other; and
   an elastic member disposed between the reciprocating members, and
   wherein the ball is supported by an end portion of one of the reciprocating members inside one of the support ribs, protrudes outward from one of the support ribs, and rubs against the second link member.

5. The electronic device according to claim 4, wherein each of the reciprocating members includes an accommodation recess for accommodating part of one of the support ribs, and the ball is supported in the accommodation recess by the reciprocating member.

6. The electronic device according to claim 1, wherein the connection unit further comprises:
   an elastic member mounted to a first hinge member of the hinge members and extended over a second hinge member of the hinge members that is at least one hinge member adjacent to the first hinge member; and
   a second guide pin mounted to the second hinge member,
   wherein when the first hinge member and the second hinge member move relative to each other, the second guide pin rubs against the elastic member.

7. The electronic device according to claim 6, wherein the connection unit further comprises second locking recesses in the elastic member, and
   wherein while the first hinge member and the second hinge member move relative to each other, the second guide pin is mounted in one of the second locking recesses and stops a relative movement between the first and second hinge members.

8. The electronic device according to claim 1, wherein the connection unit further comprises at least one rotation regulator provided on three hinge members of the hinge members, and the three hinge members are sequentially arranged,
   wherein the rotation regulator comprises:
     an interference member protruding in a sixth direction from a first hinge member of the three hinge members; and
     a restraining member protruding from a third hinge member of the three hinge members and disposed in parallel to the first hinge member, with a second hinge member of the three hinge members therebetween, and
     wherein the restraining member protrudes toward the first hinge member, and when the housing is unfolded, restrains the interference member on the second hinge member.

9. The electronic device according to claim 8, wherein the rotation regulator further comprises an avoidance recess in the second hinge member and corresponding to the interference member, and
   wherein when the housing is in an unfolded state, the restraining member restrains the interference member in the avoidance recess.

10. The electronic device according to claim 9, wherein when the housing is transformed from an unfolded position to a folded position, the third hinge member moves relative to the second hinge member and releases the interference member from a restrained state, thereby transitioning the second hinge member to a state in which the second hinge member is movable relative to the first hinge member, and
    wherein when the housing is transformed from the folded position to the unfolded position, the interference member interferes with the restraining member, and the second hinge member moves before the third member, thereby accommodating the restraining member in the avoidance recess.

11. The electronic device according to claim 1, wherein the connection unit further comprises cover members forming part of another surface of the housing opposite to the one surface of the housing, between the first part and the second part.

12. The electronic device according to claim 11, wherein each of the cover members comprises:
    a first extension portion hidden from the other surface of the housing, when the first part and the second part are level with each other; and
    a second extension portion exposed from the other surface of the housing, when the first part and the second part are level with each other, and
    wherein when the first part faces the second part, part of the first extension portion is exposed from the other surface of the housing.

13. The electronic device according to claim 12, wherein when the first part faces the second part, the first extension portions and the second extension portions are arranged alternately, forming part of the other surface of the housing.

14. The electronic device according to claim 12, when the first part and the second part are level with each other, at least part of the first extension portion is inclined to the one surface or to the other surface of the housing.

15. The electronic device according to claim 11, wherein when seen from a section taken along a direction, at least part of an outer surface of each of the cover members forms an arc trajectory having a first curvature radius, and at least part of an inner surface of the cover member forms an arc trajectory having a second curvature radius.

16. The electronic device according to claim 15, wherein the first curvature radius and the second curvature radius have centers at different positions.

17. The electronic device according to claim 15, wherein the first curvature radius and the second curvature radius are substantially equal.

18. The electronic device according to claim 11, wherein each of the cover members comprises:
    a first extension portion hidden from the other surface of the housing, when the first part and the second part are level with each other;
    a second extension portion exposed from the other surface of the housing, when the first part and the second part are level with each other; and
    side surface portions extended from both ends of the first or second extension portion, facing each other,
    wherein both ends of each of the hinge members are fixedly mounted to the side surface portions of one of the cover members.

* * * * *